(12) United States Patent
Shiraishi

(10) Patent No.: US 6,993,545 B2
(45) Date of Patent: Jan. 31, 2006

(54) DIGITAL FILTER WITH PROTECTION AGAINST OVERFLOW OSCILLATION

(75) Inventor: Mikio Shiraishi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 635 days.

(21) Appl. No.: 09/964,081

(22) Filed: Sep. 25, 2001

(65) Prior Publication Data

US 2002/0059351 A1 May 16, 2002

(30) Foreign Application Priority Data

Sep. 27, 2000 (JP) .................................... P2000-295206

(51) Int. Cl.
  *G06F 17/10* (2006.01)

(52) U.S. Cl. .................... 708/306; 708/498; 708/552
(58) Field of Classification Search ................ 708/306, 708/498, 552
See application file for complete search history.

(56) References Cited

U.S. PATENT DOCUMENTS

| | | | |
|---|---|---|---|
| 4,215,415 A | | 7/1980 | Kanemasa et al. |
| 4,379,338 A | * | 4/1983 | Nishitani et al. ........... 708/552 |
| 4,507,725 A | * | 3/1985 | Christopher et al. ........ 708/306 |
| 4,811,268 A | * | 3/1989 | Nishitani et al. ........... 708/552 |
| 4,817,047 A | * | 3/1989 | Nishitani et al. ........... 708/552 |
| 4,879,677 A | | 11/1989 | Shiraishi |
| 6,112,220 A | * | 8/2000 | Smith ......................... 708/552 |
| 6,535,900 B1 | * | 3/2003 | Perets et al. ................ 708/552 |

FOREIGN PATENT DOCUMENTS

| | | |
|---|---|---|
| JP | 57-020013 | 2/1982 |
| JP | 57-020014 | 2/1982 |
| JP | 62-003516 | 1/1987 |

OTHER PUBLICATIONS

IEEE Journal of Solid–State Circuits, "A Subscriber Digital Signal Processor LSI for PCM Applications", vol. 23, No. 3, p. 838, Fig. 4; K. Yamakido et al.; Jun. 1988.

Rejection Notice mailed on Jul. 5, 2005, corresponding to the related Japanese Patent Application No. 2000-295206 as received from the Japanese Patent Office.

* cited by examiner

*Primary Examiner*—D. H. Malzahn
(74) *Attorney, Agent, or Firm*—DLA Piper Rudnick Gray Cary US LLP

(57) ABSTRACT

A digital filter having the capability to completely prevent the digital filter from generating the overflow oscillation by detecting positive and negative overflow propagating one or a plurality of bits by means of an overflow detecting circuit. When overflow is detected, a clipping circuit serves to fix the output signal to a positive maximum value or a negative maximum value.

42 Claims, 35 Drawing Sheets

FIG.4

| INTERMEDIATE SUM S | | | | TRUE SUM Z=S−5 | | | | SIGN | CONDITION |
|---|---|---|---|---|---|---|---|---|---|
| S3 | S2 | S1 | S0 | Z3 | Z2 | Z1 | Z0 | | |
| 0 | 0 | 0 | 0 (0) | 1 | 0 | 1 | 1 (−5) | − | OVERFLOW |
| 0 | 0 | 0 | 1 (1) | 1 | 1 | 0 | 0 (−4) | − | OVERFLOW |
| 0 | 0 | 1 | 0 (2) | 1 | 1 | 0 | 1 (−3) | − | OVERFLOW |
| 0 | 0 | 1 | 1 (3) | 1 | 1 | 1 | 0 (−2) | − | OVERFLOW |
| 0 | 1 | 0 | 0 (4) | 1 | 1 | 1 | 1 (−1) | − | |
| 0 | 1 | 0 | 1 (5) | 0 | 0 | 0 | 0 (0) | + | |
| 0 | 1 | 1 | 0 (6) | 0 | 0 | 0 | 1 (1) | + | OVERFLOW |
| 0 | 1 | 1 | 1 (7) | 0 | 0 | 1 | 0 (2) | + | OVERFLOW |
| 1 | 0 | 0 | 0 (8) | 0 | 0 | 1 | 1 (3) | + | OVERFLOW |
| 1 | 0 | 0 | 1 (9) | 0 | 1 | 0 | 0 (4) | + | OVERFLOW |

FIG.8

| INTERMEDIATE SUM S'<br>S3' S2' S1' S0' | TRUE SUM Z=4−S'<br>Z3 Z2 Z1 Z0 | SIGN | CONDITION |
|---|---|---|---|
| 0 0 0 0 (0) | 0 1 0 0 (4) | + | OVERFLOW |
| 0 0 0 1 (1) | 0 0 1 1 (3) | + | OVERFLOW |
| 0 0 1 0 (2) | 0 0 1 0 (2) | + | OVERFLOW |
| 0 0 1 1 (3) | 0 0 0 1 (1) | + | OVERFLOW |
| 0 1 0 0 (4) | 0 0 0 0 (0) | + | |
| 0 1 0 1 (5) | 1 1 1 1 (−1) | − | |
| 0 1 1 0 (6) | 1 1 1 0 (−2) | − | OVERFLOW |
| 0 1 1 1 (7) | 1 1 0 1 (−3) | − | OVERFLOW |
| 1 0 0 0 (8) | 1 1 0 0 (−4) | − | OVERFLOW |
| 1 0 0 1 (9) | 1 0 1 1 (−5) | − | OVERFLOW |

FIG.11

| REDUNDANT BINARY P2 P1B P1A P0 | INTERMEDIATE SUM S | TRUE SUM Z=S-5 | SIGN | CONDITION |
|---|---|---|---|---|
| 0 0 0 0 | 0000 (0) | 1011 (-5) | − | OVERFLOW |
| 0 0 0 1 | 0001 (1) | 1100 (-4) | − | OVERFLOW |
| 0 0 1 0 | 0010 (2) | 1101 (-3) | − | OVERFLOW |
| 0 0 1 1 | 0011 (3) | 1110 (-2) | − | OVERFLOW |
| 0 1 0 0 | 0010 (2) | 1101 (-3) | − | OVERFLOW |
| 0 1 0 1 | 0011 (3) | 1110 (-2) | − | OVERFLOW |
| 0 1 1 0 | 0100 (4) | 1111 (-1) | − | |
| 0 1 1 1 | 0101 (5) | 0000 (0) | + | |
| 1 0 0 0 | 0100 (4) | 1111 (-1) | − | |
| 1 0 0 1 | 0101 (5) | 0000 (0) | + | |
| 1 0 1 0 | 0110 (6) | 0001 (1) | + | OVERFLOW |
| 1 0 1 1 | 0111 (7) | 0010 (2) | + | OVERFLOW |
| 1 1 0 0 | 0110 (6) | 0001 (1) | + | OVERFLOW |
| 1 1 0 1 | 0111 (7) | 0010 (2) | + | OVERFLOW |
| 1 1 1 0 | 1000 (8) | 0011 (3) | + | OVERFLOW |
| 1 1 1 1 | 1001 (9) | 0100 (4) | + | OVERFLOW |

FIG.13

| REDUNDANT BINARY P2' P1B' P1A' P0' | INTERMEDIATE SUM S' | TRUE SUM Z=4-S' | SIGN | CONDITION |
|---|---|---|---|---|
| 0 0 0 0 | 0000 (0) | 0100 (4) | + | OVERFLOW |
| 0 0 0 1 | 0001 (1) | 0011 (3) | + | OVERFLOW |
| 0 0 1 0 | 0010 (2) | 0010 (2) | + | OVERFLOW |
| 0 0 1 1 | 0011 (3) | 0001 (1) | + | OVERFLOW |
| 0 1 0 0 | 0010 (2) | 0010 (2) | + | OVERFLOW |
| 0 1 0 1 | 0011 (3) | 0001 (1) | + | OVERFLOW |
| 0 1 1 0 | 0100 (4) | 0000 (0) | + | |
| 0 1 1 1 | 0101 (5) | 1111 (-1) | − | |
| 1 0 0 0 | 0100 (4) | 0000 (0) | + | |
| 1 0 0 1 | 0101 (5) | 1111 (-1) | − | |
| 1 0 1 0 | 0110 (6) | 1110 (-2) | − | OVERFLOW |
| 1 0 1 1 | 0111 (7) | 1101 (-3) | − | OVERFLOW |
| 1 1 0 0 | 0110 (6) | 1110 (-2) | − | OVERFLOW |
| 1 1 0 1 | 0111 (7) | 1101 (-3) | − | OVERFLOW |
| 1 1 1 0 | 1000 (8) | 1100 (-4) | − | OVERFLOW |
| 1 1 1 1 | 1001 (9) | 1011 (-5) | − | OVERFLOW |

DIGITAL FILTER WITH PROTECTION AGAINST OVERFLOW OSCILLATION

CROSS REFERENCE TO RELATED APPLICATIONS

This application claims benefit of priority under 35 USC §119 to Japanese Patent Application No. 2000-295206, filed on Sep. 29, 2000, the entire contents of which are incorporated by reference herein.

BACKGROUND OF THE INVENTION

1. Field of the Invention

The present invention is related to a digital filter. Particularly, the present invention relates to a technique of preventing overflow oscillation appearing in a digital biquad filter.

2. Prior Art

In the recent years, digital filters have been broadly utilized in electronic appliances while A/D (analog to digital) converters on the basis of an oversampling scheme have become more prevalent. Particularly, biquad filters are selectively used in many cases since these filters have lower sensitivities to the coefficient variation and therefore the operation is highly stabilized.

The analog to digital converter on the basis of an oversampling scheme serves to convert analog input signals with a sampling rate which is by far higher than the highest frequency component of the analog input signals, and pass the digital output signals as converted through a digital low-pass filter which is located in a later stage in order to attenuate the noise level at high frequencies and lessen conversion noise. Particularly, in the case of the type on the basis of the ΔΣscheme, the conversion noise has a frequency characteristic so called as the noise shaping in which the power spectrum of noise is deflected to the high frequency area so that, even when converted to one-bit digital signals, it is possible to secure the accuracy of the order of 14 bits by oversampling. Accordingly, it is possible to reduce the area ratio of an LSI (large scale integrated circuit) as occupied by the constituent analog circuitry in the entirety LSI chip and also simplify the configuration of the analog circuitry itself so that this type of A/D converter for which the digital filtering is necessary has been employed in mobile phones and so forth.

The kinds of such electronic appliances tends to be designed to improve the operability and the multiple functional feature in addition to the basic functions so that it is desirable to reduce the circuit area required for implementing a digital filter in the LSI chip. With respect to the need for reducing the circuit area, the serial calculation scheme provides a particularly excellent area utilization efficiency.

However, in accordance with this scheme, it is difficult to detect overflows and also handle the overflows even detected. The overflow occurs when the magnitude of a calculation result exceeds the predetermined bit length of a digital data processing apparatus. In the case of the serial calculation scheme, the processing operation is sequentially advanced bit by bit from the LSB (least significant bit) to the MSB (most significant bit). In this case, the overflow can be detected only after the MSB is processed so that less significant bits has been already output from an arithmetic unit when detected.

FIG. 40(*a*) and FIG. 40(*b*) are graphic diagrams respectively showing an input signal waveform and an output signal waveform in the case where overflow takes place in a digital biquad filter.

Unlike the responses of analog circuits, the output signal is violently vibrated in response to the excessive input signal. This phenomenon is called an overflow oscillation.

The overflow oscillation is originating from the fact that digital signals are processed with two's complement arithmetic. For example, the numbers from −4 to +3 are represented in accordance with the two's complement system as follows.

| | |
|---|---|
| +3 | :011 |
| +2 | :010 |
| +1 | :001 |
| 0 | :000 |
| −1 | :111 |
| −2 | :110 |
| −3 | :101 |
| −4 | :100 |

Usual decimal number representations are located on the left hand side of the colon (:) while the corresponding number representations in accordance with the two's complement system are located on the right hand side. The number +3 as incremented by one is +4 to be represented by (0100) in accordance with the two's complement system. However, since there are only three bits as available, the number +3 is incremented as −4(100), −3(101) and −2(110). Also, the number −4 as decremented by one is −5 to be represented by (1011) in accordance with the two's complement system. However, since there are only three bits as available, the number −4 is decremented as +3(011), +2(010) and +1(001).

For this reason, there are output waves oscillating between values in the vicinity of the positive representation limit and values in the vicinity of the negative representation limit as illustrated in FIG. 40(*b*) when the output goes to and comes back from the overflow state.

FIG. 37 is a circuit diagram showing a prior art digital biquad filter (inside of the broken line) in accordance with the serial calculation scheme for suppressing the overflow oscillation.

In the figure, the reference numerals 1*a* and 1*d* designate 1-bit registers respectively; the reference numerals 1*b*, 1*c*, 1*e* and 1*f* designate shift registers respectively capable of latching and shifting a plurality of bits; the reference numeral 2 designates a coefficient multiplication circuit; the reference numeral 3 designates an adder circuit; the reference numeral 4 designates an exclusive NOR gate (the matching circuit); the reference numeral 5 designates a selector circuit; and the reference numeral 6 designates an AND gate. FIG. 38 is a circuit diagram showing an example of a selector circuit used in a digital filter. In FIG. 37, control signals to be given to the selector circuit is dispensed with in the illustration.

Biquad circuits are connected in series in many cases so that some elements of a previous and a subsequent biquad circuit are illustrated in FIG. 37. The shift registers 1*e* and 1*f* are inserted for the purpose of compensating the delay time of the coefficient multiplication circuit 2 and therefore can be dispensed with if the delay time of the coefficient multiplication circuit is no longer than one operation cycle.

The prior art digital biquad filter is provided with a circuit for preventing overflow oscillation which is similar as disclosed in FIG. 4 of IEEE Journal of Solid-State Circuits, vol. SC-23, no. 3, p. 838, comprises an exclusive NOR (OR) gate 4 and the AND gate 6 and serving to clamp the internal value as latched by the shift register to a value of "0" when overflow is detected.

This operation is implemented with the exclusive NOR gate 4, the selector circuit 5, the 1-bit register 1d and the AND gate 6. At a time as the exclusive NOR gate 4 detects whether or not the MSB matches the adjacent lower bit, the selector circuit 5 outputs the result of the matching to the 1-bit register 1d which latches the result in the next operation cycle. The result of detection is "1" (match) is indicative of a normal operation while the result of detection is "0" (mismatch) is indicative of an overflow. While the output signal of the shift register 1b or 1c is output from the AND gate 6 as it is in the normal operation, the output signal of the AND gate 6 becomes always "0" in the case of an overflow. FIG. 39(a) and FIG. 39(b) are graphic diagrams respectively showing an input signal waveform and an output signal waveform in the case where overflow takes place in the prior art digital biquad filter as illustrated in FIG. 37. As seen from FIG. 39(a) and FIG. 39(b), it will be understood that there takes place yet some overflow oscillation and that a number of noise spikes in response to input signals in the vicinity of the overflow limit.

Accordingly, there are following two shortcomings in the prior art digital biquad filter.

The first shortcoming is that an exclusive NOR (OR) gate can not be used to detect overflow extending beyond two or more bits (for example, large steps as illustrated in FIG. 39(b)). Four addition operations are performed by the circuit as illustrated in FIG. 37 including the biquad circuit of the previous stage during one cycle of operation. Even in the case where the multiply operation invokes no overflow, an overflow of three bits is possible.

The second shortcoming is that it is impossible to completely remove overflow oscillation (small spikes appearing in the waveform as illustrated in FIG. 39(b)). When overflow is detected, the signals including the overflow data have already been output. Also, since the internal value is clamped to "0", when the operation is switched between the normal operation and the overflow preventing operation, there are generated steps in the waveform as noise signals.

The present invention has been made in order to solve the conventional shortcomings as described above. It is an object of the present invention to provide a digital filter having the capability to prevent the digital filter from generating the overflow oscillation by detecting positive and negative overflows propagating one or a plurality of bits.

SUMMARY OF THE INVENTION

In brief, the above and other objects and advantages of the present invention are provided by a digital filter comprising:

an overflow detecting circuit which detects all the overflow bits of the true result of the addition calculation corresponding to an addition operation having been conducted by said digital filter exceeding a predetermined bit length;

a clipping circuit which serves to fix the output value of the result of the addition operation to a predetermined positive maximum value which does not exceed said predetermined bit length when said overflow detecting circuit detects a positive overflow and to fix the output value of the result of the addition operation to a predetermined negative maximum value which does not exceed said predetermined bit length when said overflow detecting circuit detects a negative overflow.

In accordance with another aspect of the present invention, a digital filter has a plurality of digital filter elements which are connected to each other in series, each digital filter element comprising:

at least one forward coefficient multiplication circuit;

at least one backward coefficient multiplication circuit;

an adder logic circuit which performs an addition operation of an input signal and the output signal of said backward coefficient multiplication circuit;

a storage circuit which serves to store the output signal of said first adder logic circuit;

an overflow detecting circuit which receives the output signal of said backward coefficient multiplication circuit, the output signal of the forward coefficient multiplication circuit in the preceding stage and all of the carry signals to MSB (most significant bit)s from the adjacent lower bits in summation of the output signals of said backward and forward coefficient multiplication circuits in the current and preceding stages respectively and which serves to detect an overflow occurring in the output signal of said adder logic circuit;

a clipping circuit connected to said storage circuit in order to clip the output signal of said storage circuit to either a positive or negative predetermined fixed value and output the clipped value in accordance with the output signal of said overflow detecting circuit.

In accordance with another aspect of the present invention, a digital filter has a plurality of digital filter elements which are connected to each other in series, each digital filter element comprising:

at least one forward coefficient multiplication circuit;

at least one backward coefficient multiplication circuit;

an adder logic circuit which performs an addition operation of an input signal and the output signal of said backward coefficient multiplication circuit;

a first storage circuit which serves to store the output signal of said adder logic circuit;

an overflow detecting circuit which receives the output signal of said backward coefficient multiplication circuit, the output signal of the forward coefficient multiplication circuit in the preceding stage, all of the carry signals to the MSB (most significant bit)s from the adjacent lower bits in summation of the output signals of said backward and forward coefficient multiplication circuits in current and preceding stages respectively and the input and output signals of said first storage circuit and which serves to detect an overflow occurring in the output signal of said first storage circuit;

a second storage circuit which stores the output signal of said first storage circuit;

a clipping circuit connected to said second storage circuit in order to clip the output signal of said second storage circuit to either a positive or negative predetermined fixed value and output the clipped value in accordance with the output signal of said overflow detecting circuit.

In accordance with another aspect of the present invention, a digital filter has a plurality of digital filter elements which are connected to each other in series, each digital filter element comprising:

a first adder logic circuit which receives a data input signal through a first input terminal;

a first shift register which is connected to said first adder logic circuit and receives the output signal of said first adder logic circuit;

a clipping circuit which is connected to said first shift register and receives the output signal of said first shift register;

a second shift register which is connected to said clipping circuit and receives the output signal of said clipping circuit;

a third shift register which is connected to said second shift register and receives the output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives the output signal of said third shift register;

a second adder logic circuit which is connected to said first coefficient multiplication circuit, said second coefficient multiplication circuit and said first adder logic circuit, and receives the output signals of said first coefficient multiplication circuit and said second coefficient multiplication circuit and outputs the sum thereof to a second input terminal of said first adder logic circuit;

a third adder logic circuit which is connected to said fourth coefficient multiplication circuit and said fifth coefficient multiplication circuit, and receives the output signals of said fourth and fifth coefficient multiplication circuits;

a fourth adder logic circuit which is connected to said third coefficient multiplication circuit and said third adder logic circuit, and receives the output signals of said third coefficient multiplication circuit and said third adder logic circuit and outputs the sum thereof as an output signal through an output terminal of said fourth adder logic circuit; and an overflow detecting circuit which is connected to said first and second coefficient multiplication circuits, said first and second adder logic circuits at the current stage and connected to said third, fourth and fifth coefficient multiplication circuits and said third and fourth adder logic circuits at the preceding stage, receives the output signals of said first and second coefficient multiplication circuits, the carry output signals of said first and second adder logic circuits at the current stage and receives the output signals of said third, fourth and fifth coefficient multiplication circuits and the carry output signals of said third and fourth adder logic circuits at the preceding stage;

wherein said clipping circuit clips the output signal of said first shift register to either a positive or negative predetermined fixed value and outputs the clipped value in accordance with the output signal of said overflow detecting circuit.

In accordance with another aspect of the present invention, a digital filter has a plurality of digital filter elements which are connected to each other in series, each digital filter element comprising:

a first adder logic circuit which receives a data input signal through a first input terminal;

a first shift register which is connected to said first adder logic circuit and receives the output signal of said first adder logic circuit;

a clipping circuit which is connected to said first shift register and receives the output signal of said first shift register;

a second shift register which is connected to said clipping circuit and receives the output signal of said clipping circuit;

a third shift register which is connected to said second shift register and receives the output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives the output signal of said third shift register;

a second adder logic circuit which is connected to said first coefficient multiplication circuit and said second coefficient multiplication circuit, and receives the output signals of said first coefficient multiplication circuit and said second coefficient multiplication circuit;

a third adder logic circuit which is connected to said fourth coefficient multiplication circuit and said fifth coefficient multiplication circuit, and receives the output signals of said fourth and fifth coefficient multiplication circuits;

a fourth adder logic circuit which is connected to said third coefficient multiplication circuit and said third adder logic circuit, and receives the output signals of said third coefficient multiplication circuit and said third adder logic circuit and outputs the sum thereof as an output signal through an output terminal of said fourth adder logic circuit;

a fifth adder logic circuit which is connected to said first and second adder logic circuits, receives the output signal of said second adder logic circuit and a control signal for rounding off and outputs the sum thereof to a second input terminal of said first adder logic circuit; and an overflow detecting circuit which is connected to said first and second coefficient multiplication circuits, said first, second and fifth adder logic circuits at the current stage and connected to said third, fourth and fifth coefficient multiplication circuits and said third and fourth adder logic circuits at the preceding stage, receives the output signals of said first and second coefficient multiplication circuits, the carry output signals of said first, second and fifth adder logic circuits at the current stage and receives the output signals of said third, fourth and fifth coefficient multiplication circuits and the carry output signals of said third and fourth adder logic circuits at the preceding stage;

wherein said clipping circuit clips the output signal of said first shift register to either a positive or negative predetermined fixed value and outputs the clipped value in accordance with the output signal of said overflow detecting circuit.

In accordance with another aspect of the present invention, a digital filter has a plurality of digital filter elements which are connected to each other in series, each digital filter element comprising:

a first adder logic circuit which receives a data input signal through a first input terminal;

a first shift register which is connected to said first adder logic circuit and receives the output signal of said first adder logic circuit;

a clipping circuit which is connected to said first shift register and receives the output signal of said first shift register;

a second shift register which is connected to said clipping circuit and receives the output signal of said clipping circuit;

a third shift register which is connected to said second shift register and receives the output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives the output signal of said third shift register;

a second adder logic circuit which is connected to said first coefficient multiplication circuit, said second coefficient multiplication circuit and said first adder logic circuit, and receives the output signals of said first coefficient multiplication circuit and said second coefficient multiplication circuit and outputs the sum thereof to a second input terminal of said first adder logic circuit;

a third adder logic circuit which is connected to said fourth coefficient multiplication circuit and said fifth coefficient multiplication circuit, and receives the output signals of said fourth and fifth coefficient multiplication circuits;

a fourth adder logic circuit which is connected to said third coefficient multiplication circuit and said third adder logic circuit, and receives the output signals of said third coefficient multiplication circuit and said third adder logic circuit and outputs the sum thereof as an output signal through an output terminal of said fourth adder logic circuit; and an overflow detecting circuit which is connected to said first and second coefficient multiplication circuits, said first and second adder logic circuits and said first shift register at the current stage and connected to said third, fourth and fifth coefficient multiplication circuits and said third and fourth adder logic circuits at the preceding stage, receives the output signals of said first and second coefficient multiplication circuits, the carry output signals of said first and second adder logic circuits and the input and intermediate tap output signals of said first shift register at the current stage and receives the output signals of said third, fourth and fifth coefficient multiplication circuits and the carry output signals of said third and fourth adder logic circuits at the preceding stage;

wherein said clipping circuit clips the output signal of said first shift register to either a positive or negative predetermined fixed value and outputs the clipped value in accordance with the output signal of said overflow detecting circuit.

In accordance with another aspect of the present invention, a digital filter has a plurality of digital filter elements which are connected to each other in series, each digital filter element comprising:

a first adder logic circuit which receives a data input signal through a first input terminal;

a first shift register which is connected to said first adder logic circuit and receives the output signal of said first adder logic circuit;

a clipping circuit which is connected to said first shift register and receives the output signal of said first shift register;

a second shift register which is connected to said clipping circuit and receives the output signal of said clipping circuit;

a third shift register which is connected to said second shift register and receives the output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives the output signal of said third shift register;

a second adder logic circuit which is connected to said first coefficient multiplication circuit and said second coefficient multiplication circuit, and receives the output signals of said first coefficient multiplication circuit and said second coefficient multiplication circuit;

a third adder logic circuit which is connected to said fourth coefficient multiplication circuit and said fifth coefficient multiplication circuit;

a fourth adder logic circuit which is connected to said third coefficient multiplication circuit and said third adder logic circuit, and receives the output signals of said third coefficient multiplication circuit and said third adder logic circuit and output the sum thereof as an output signal through an output terminal of said fourth adder logic circuit;

a fifth adder logic circuit which is connected to said first and second adder logic circuits, receives the output signal of said second adder logic circuit and a control signal for rounding off and outputs the sum thereof to a second input terminal of said first adder logic circuit; and an overflow detecting circuit which is connected to said first and second coefficient multiplication circuits, said first, second and fifth adder logic circuits and said first shift register at the current stage and connected to said third, fourth and fifth coefficient multiplication circuits and said third and fourth adder logic circuits at the preceding stage, receives the output signals of said first and second coefficient multiplication circuits, the carry output signals of said first, second and fifth adder logic circuits and the input and intermediate tap output signals of said first shift register at the current stage and receives the output signals of said third, fourth and fifth coefficient multiplication circuits and the carry output signals of said third and fourth adder logic circuits at the preceding stage;

wherein said clipping circuit clips the output signal of said first shift register to either a positive or negative predetermined fixed value and outputs the clipped value in accordance with the output signal of said overflow detecting circuit.

BRIEF DESCRIPTION OF DRAWINGS

The aforementioned and other features and objects of the present invention and the manner of attaining them will become more apparent and the invention itself will be best understood by reference to the following description of various embodiments of the present invention taken in conjunction with the accompanying drawings, wherein:

FIG. 4 is a table showing the relationship between intermediate sums S and true sums Z together with corresponding overflow conditions.

FIG. 8 is a table showing the relationship between intermediate sums S' and true sums Z together with corresponding overflow conditions.

FIG. 11 is a table showing the relationship between the redundant binary signals P2, P1B, P1A and P0 and overflow conditions.

FIG. 13 is a table showing the relationship between the redundant binary signals P2', P1B', P1A' and P0' and overflow conditions.

DETAILED DESCRIPTION OF EMBODIMENTS

Figure 1:
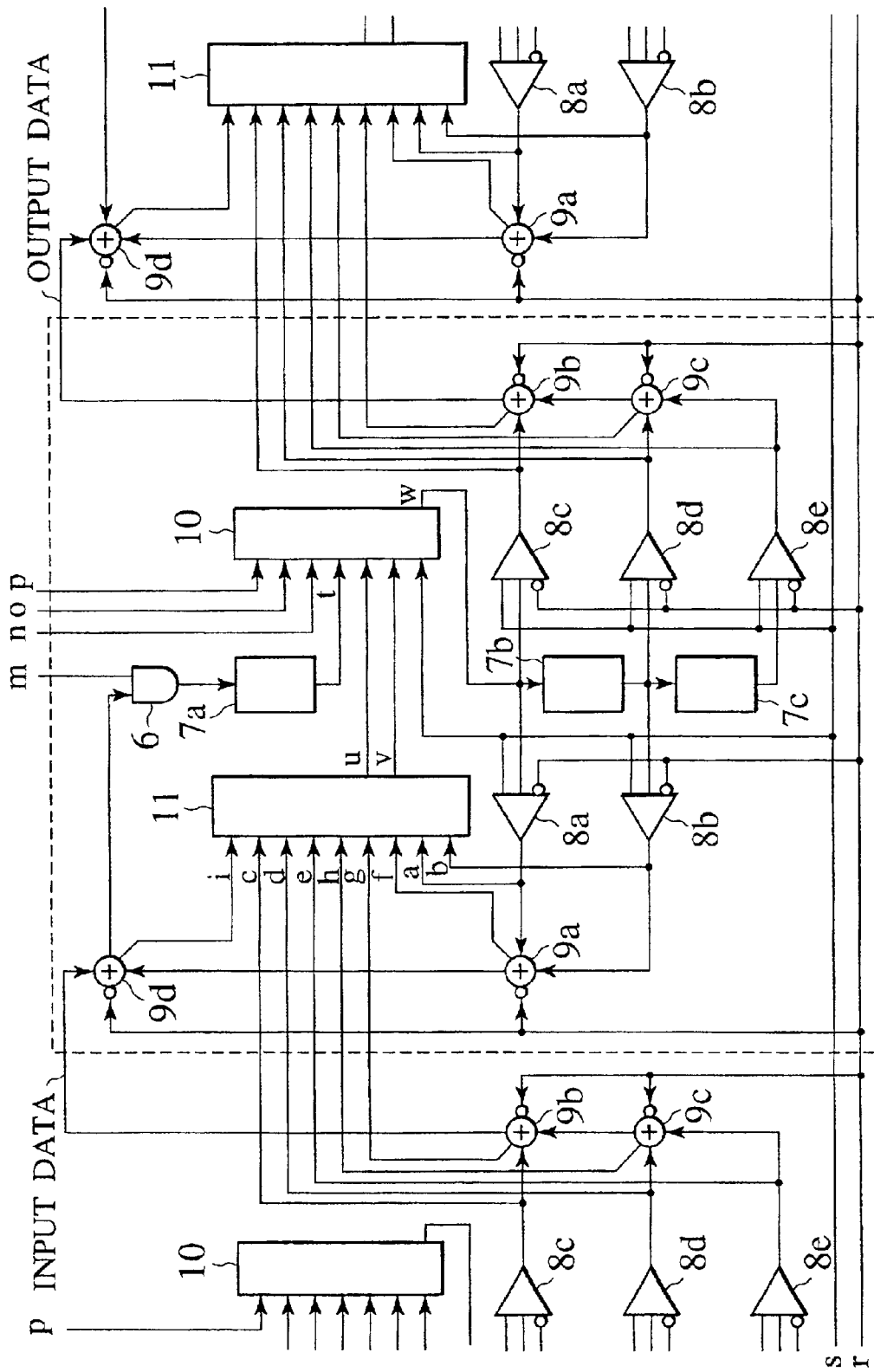
FIG. 1 is a block diagram showing the configuration of a digital filter in accordance with a first embodiment of the present invention.

An embodiments of the present invention will be described with reference to the accompanying drawings. FIG. 1 is a block diagram showing the configuration of a digital filter in accordance with a first embodiment of the present invention.

In the figure, the digital biquad filter (inside of the broken line) is composed of an AND gate 6, shift registers 7a, 7b and 7c, coefficient multiplication circuits 8a, 8b, 8c, 8d and 8e, adder circuit 9a, 9b, 9c and 9d, a clipping circuit 10 and an overflow detecting circuit 11. Similar digital biquad filters are connected to the digital biquad filter in the previous and subsequent stages of the digital filter in cascade (or in series). The output signals of the coefficient multiplication circuits 8a and 8b are fed back to the adder circuit 9d and summed up again together with the input signal to this stage and therefore the coefficient multiplication circuits 8a and 8b can be called as backward coefficient multiplication circuits. Also, the output signals of the coefficient multiplication circuits 8c, 8d and 8e are summed up together and forwarded as the input signal to the adder circuit 9d at the next stage and therefore the coefficient multiplication circuits 8c, 8d and 8e can be called as forward coefficient multiplication circuits.

In FIG. 1, the signals m, n, o, p, r and s are control signals which will be explained in the followings. Specific timing for the data input signal, the data output signal and the control signals depends upon the bit lengths of the respective data and the coefficient.

Figure 2:
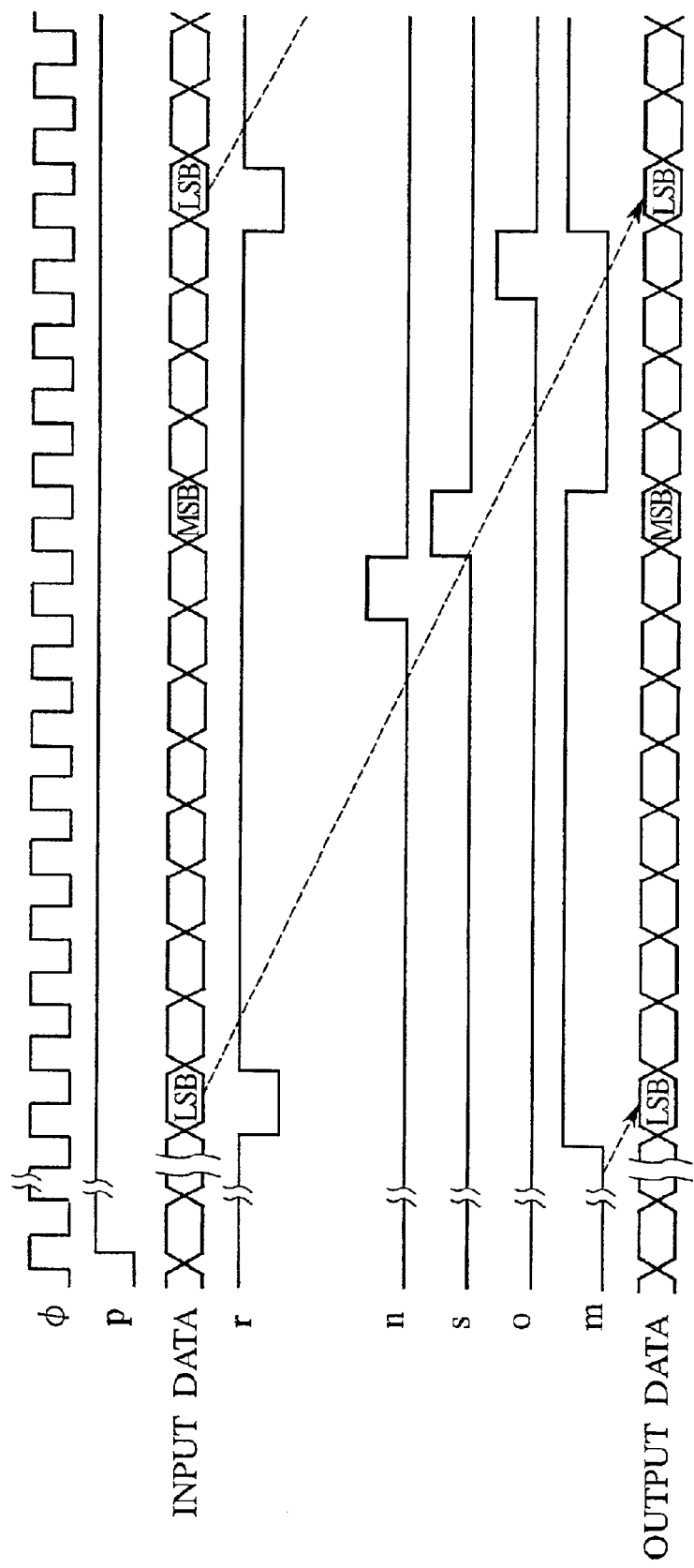
FIG. 2 is a timing chart showing the specific timing of the data input signal, the data output signal and the control signals for the first embodiment of the present invention.

FIG. 2 is a timing chart showing the specific timing of the data input signal, the data output signal and the control signals for the first embodiment of the present invention. The timing shown in FIG. 2 is in the case where the bit length of data signals is 10 bits while the bit length of the coefficients is 6 bits. Moreover, in this case, the integer portion of the respective data signal is composed of 4 bits while the integer portion of the coefficient signals is composed of 2 bits. Both the data signals and the coefficient signals are given as fixed-point data signals with two's complement format. The data output signal is delayed from the data input signal by the clock cycles corresponding to the bit length of the data plus the bit length of the fractional portion of the coefficient.

Figure 3A:
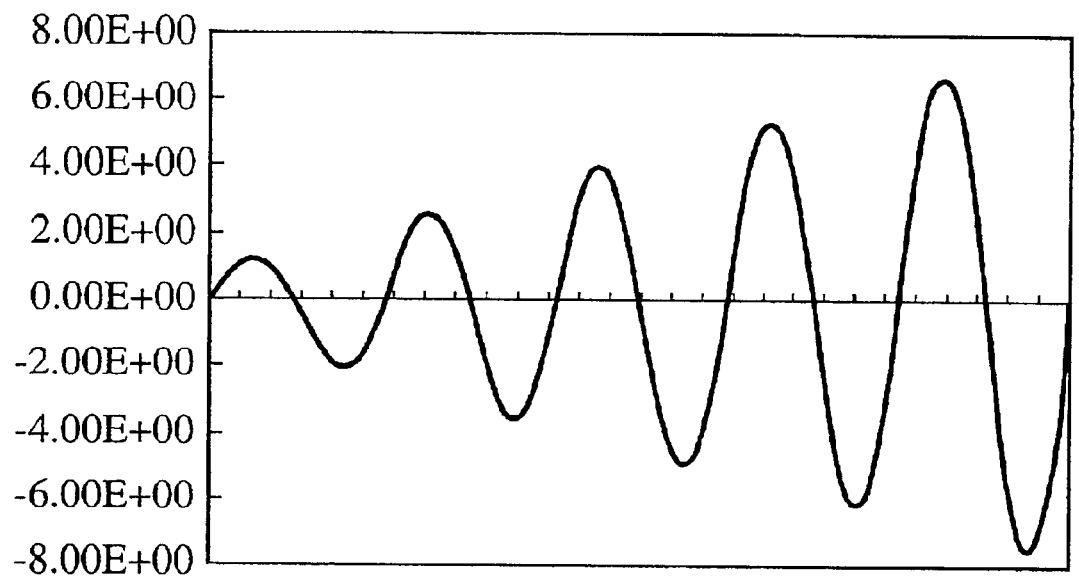
FIG. 3(a) and FIG. 3(b) are graphic diagrams respectively showing an input signal waveform and an output signal waveform in the case where overflow takes place in the biquad filter in accordance with the present invention.
Figure 3B:
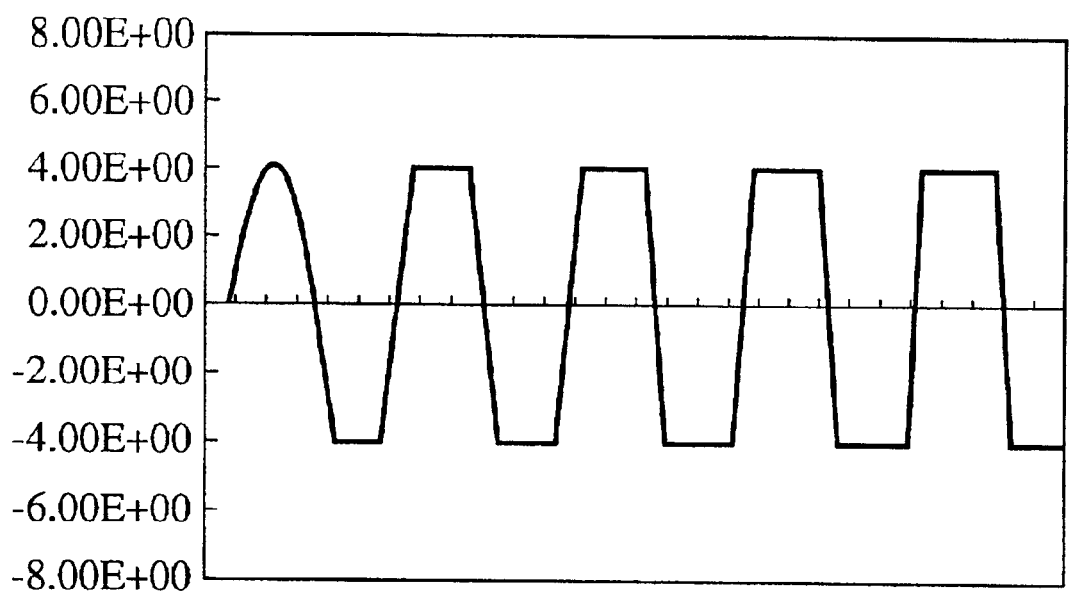

FIG. 3(a) and FIG. 3(b) are graphic diagrams respectively showing an input signal waveform and an output signal waveform in the case where overflow takes place in the biquad filter in accordance with the present invention. As illustrated in this figures, the overflow does not result in overflow oscillation.

Figure 30:
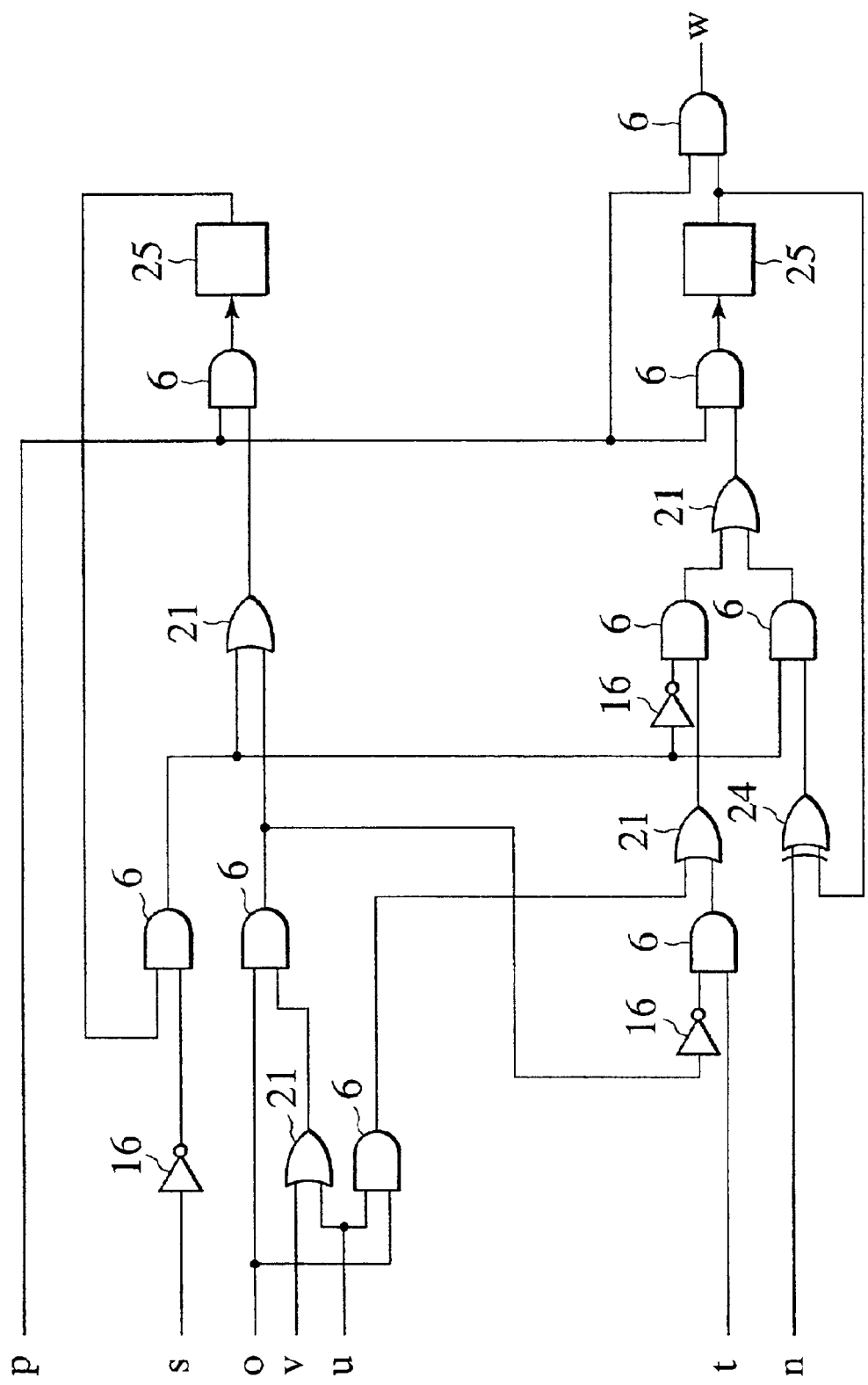
FIG. 30 is a circuit diagram showing an example of the clipping circuit for use in the first embodiment of the present invention.
Figure 31:
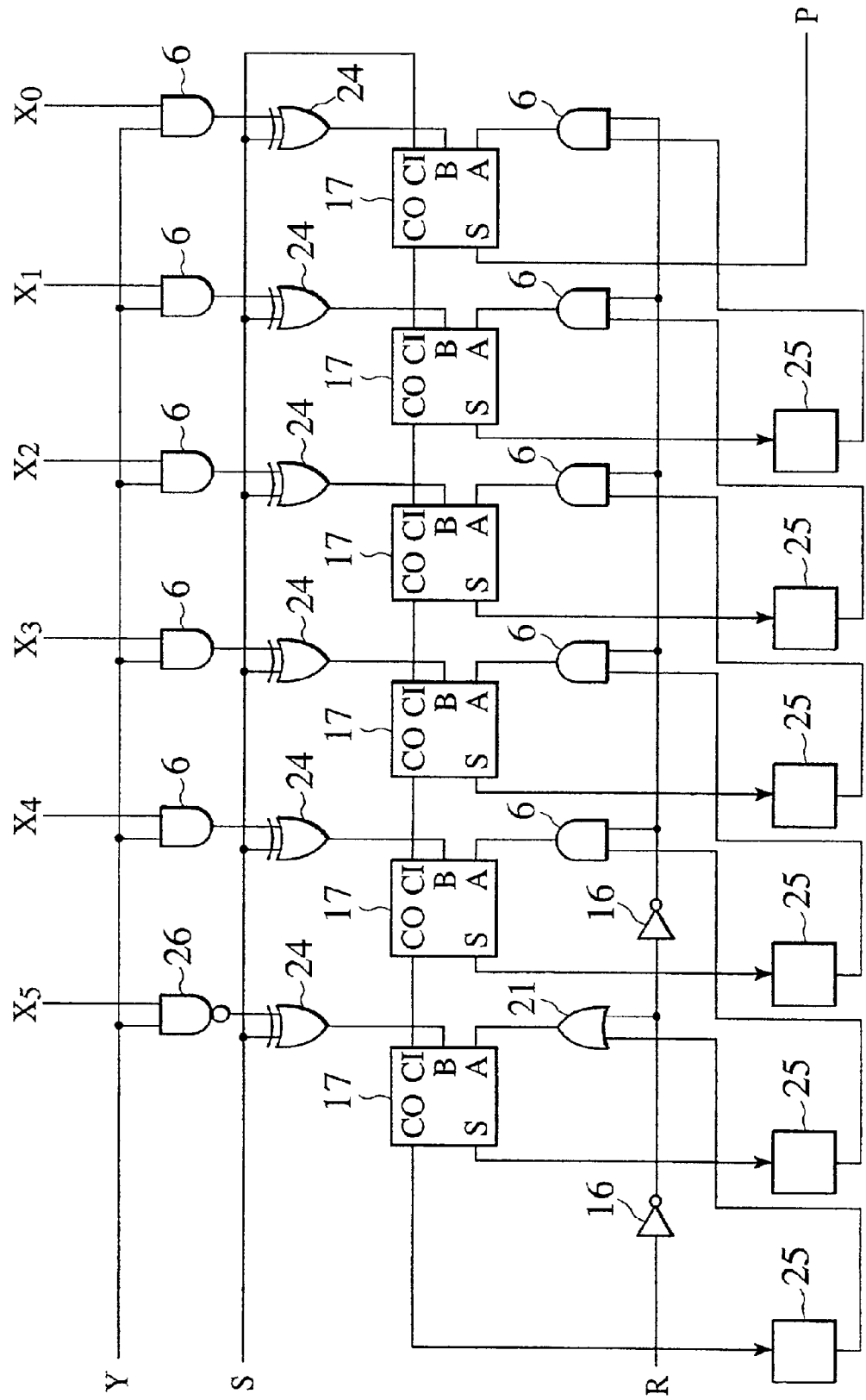
FIG. 31 is a circuit diagram showing an exemplary configuration of the coefficient multiplication circuit used in the digital filter in accordance with the first embodiment of the present invention.
Figure 32:
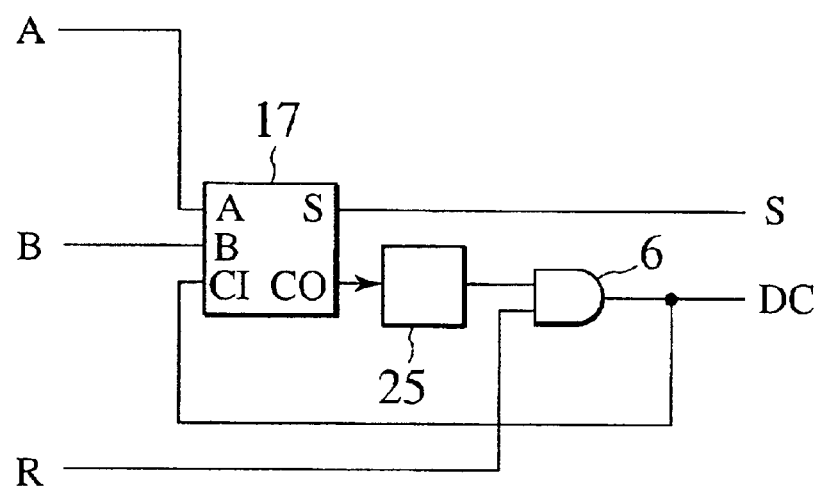
FIG. 32 is a circuit diagram showing an exemplary configuration of the adder circuit used in the digital filter in accordance with the first embodiment of the present invention.
Figure 33:
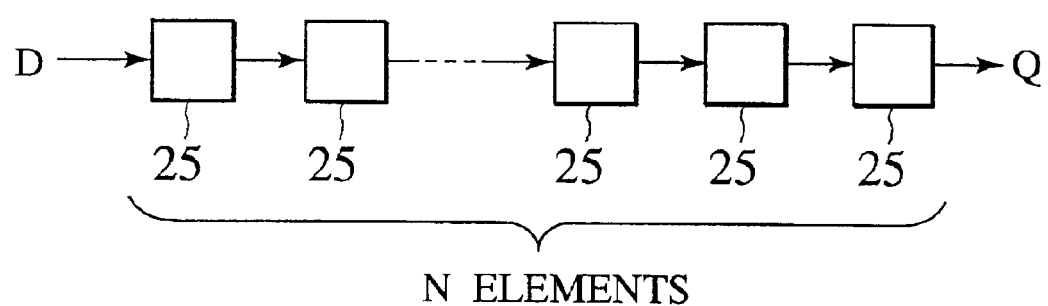
FIG. 33 is a schematic diagram showing an example of the shift register as used in the first embodiment of the present invention.

In FIG. 1, the clipping circuits 10 may be designed, for example, as illustrated in FIG. 30. The coefficient multiplication circuits 8a, 8b, 8c, 8d and 8e may be designed, for example, as illustrated in FIG. 31. The adder circuit 9a, 9b, 9c and 9d may be designed, for example, as illustrated in FIG. 32. The shift registers 7a, 7b and 7c may be designed, for example, as illustrated in FIG. 33.

FIG. 30 is a circuit diagram showing an example of the clipping circuit for use in the first embodiment of the present invention as described above. In the figure, the reference numerals 6 designate AND gates; the reference numerals 16 designate inverters; the reference numerals 21 designate OR gates; the reference numeral 24 designates an exclusive OR gate; and the reference numerals 25 designate 1-bit registers. Also, the reference symbol t designates an input signal; the reference symbol w designates an output signal; the reference symbols u and v designate positive and negative overflow detection signals respectively, the reference symbols n, o, p and s designate control signals which are changed in synchronism with the timing as illustrated in FIG. 2.

FIG. 31 is a circuit diagram showing an exemplary configuration of the coefficient multiplication circuit used in the digital filter in accordance with the first embodiment of the present invention. In the figure, the reference numerals 6 designate AND gates; the reference numerals 16 designate inverters; the reference numerals 17 designate full adder circuits; the reference numeral 21 designates an OR gate; the reference numerals 24 designate exclusive OR gates; the reference numerals 25 designate 1-bit registers; and the reference numeral 26 designates a NAND gate. The reference symbols X5 to X0 designate the respective bits of a coefficient; the reference symbol Y designates a data input terminal; the reference symbol S designates a sign adjustment control input terminal; the reference symbol R designates a reset terminal; and the reference symbol P designates a data output terminal. The sign adjustment control signal s and the reset signal r are input to every coefficient multiplication circuit through the terminals S and R respectively as illustrated in FIG. 1. In FIG. 1, coefficient input signals are not shown.

FIG. 32 is a circuit diagram showing an exemplary configuration of the adder circuit used in the digital filter in accordance with the first embodiment of the present invention. In the figure, the reference numeral 6 designates an AND gate; the reference numeral 17 designates a full adder circuit; and the reference numeral 25 designates a 1-bit register. Furthermore, the reference symbols A and B designate data input terminals; the reference symbol R designates a reset terminal; and the reference symbol S designates a sum output terminal; and the reference symbol DC designates a carry output terminal. The carry signal as output from the full adder 17 has been delayed by one clock cycle by means of the 1-bit register 25. The 1-bit register 25 holds the carry output signal of the full adder 17 in previous calculation. In the MSB calculation cycle, the carry signal to the MSB from the adjacent lower bit is held in the 1-bit register 25, and the carry signal is output through the AND gate 6 and the carry output terminal DC.

FIG. 33 is a schematic diagram showing an example of the shift register as used in the first embodiment of the present invention. In the figure, the reference numerals 25 designate one-bit registers. Also, the reference symbol D designates an input terminal while the reference symbol Q designates an output terminal of the N-bit shift register.

Figure 34:
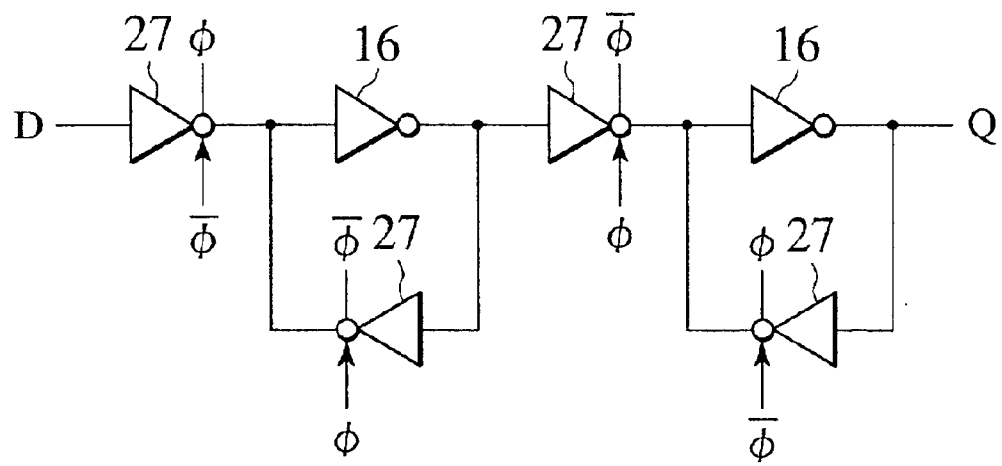
FIG. 34 is a circuit diagram showing an example of a 1-bit register which can be used in the first embodiment of the present invention.

The 1-bit register 25 used in the circuits as illustrated in FIG. 31 to FIG. 33 can be constructed as illustrated in FIG. 34.

Namely, FIG. 34 is a circuit diagram showing an example of a 1-bit register which can be used in the first embodiment of the present invention as described above. In the figure, the reference numerals 16 designates inverters while the reference numerals 27 designate clocked inverters. Also, the reference symbol D designates an data input terminal; the reference symbol Q designates an data output terminal of the 1-bit register; and the reference symbols φ and/φ designate clock signals and inverted signals thereof respectively.

Figure 35:
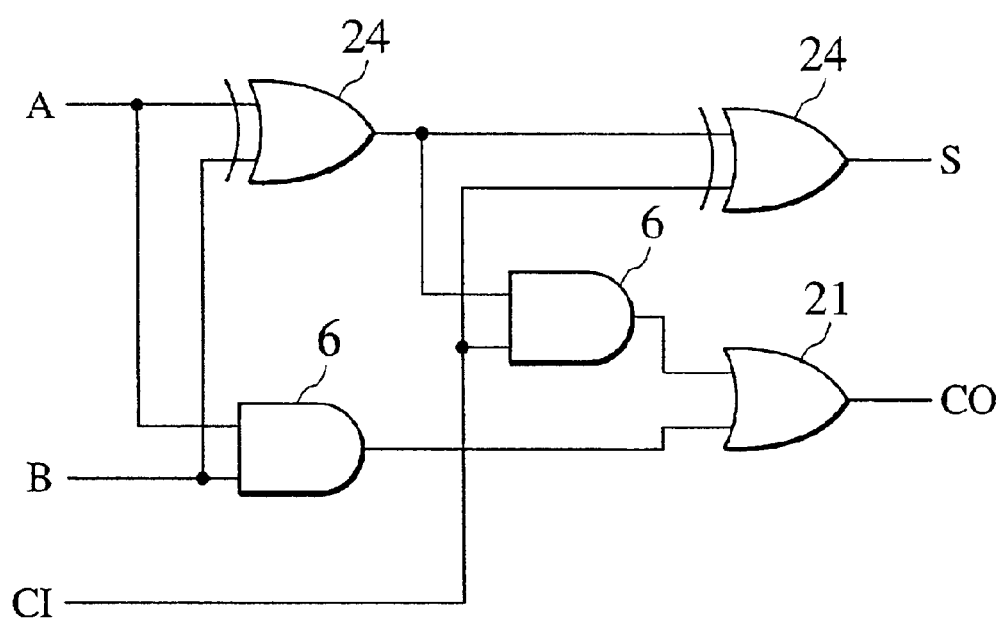
FIG. 35 is a circuit diagram showing an exemplary configuration of the full adder circuit used in the digital filter in accordance with the first embodiment of the present invention.

The full adder circuits used in the circuits as illustrated in FIG. 31 and FIG. 32 can be constructed as illustrated in FIG. 35. In the figure, the reference numerals 6 designate AND gates; the reference numeral 21 designates an OR gate; and the reference numerals 24 designate exclusive OR gates. Also, the reference symbols A and B designate data input terminals; and the reference symbol CI designates a carry input terminal; and the reference symbol S designates a sum output terminal; and the reference symbol CO designates a carry output terminal. These three input terminals A, B and CI are equivalent each other so that their signals can be exchanged by wiring at design.

Next, the operation of the present embodiment will be explained. The circuitry as illustrated within the broken line of FIG. 1 is the digital biquad filter, also called as the biquad for short. Biquad circuits are connected in series in many cases so that some elements of a previous and a subsequent biquad circuit are illustrated in the figure. In the biquad circuit, the output signal w of the clipping circuit 10 is multiplied by a predetermined coefficient by the coefficient multiplication circuit 8a while the output signal of the shift register 7b is multiplied by a predetermined coefficient by the coefficient multiplication circuit 8b. The output signals of the coefficient multiplication circuits 8a and 8b are added together by means of the adder circuit 9a. The output signal of the adder circuit 9a and the data input signal are added together by means of the adder circuit 9d.

Furthermore, the output signal of the adder circuit 9d is logically multiplied with the control signal m by means of the AND gate 6 and input to the shift register 7a. The control signal m is used to trim the output signal of the adder circuit 9d to obtain a bit sequence having the same bit length as the data. The circuit implementation serving to realize this function is depending upon the implementation of the coefficient multiplication circuit so that it may be the case that the circuit is not simply as illustrated in FIG. 1 when the coefficient multiplication circuit is not as illustrated in FIG. 31.

The output signal t of the shift register 7a is input to the clipping circuit 10. The output signal w of the clipping circuit 10, the output signal of the shift register 7b and the output signal of the shift register 7c are multiplied by predetermined coefficients respectively by means of the coefficient multiplication circuit 8c, 8d and 8e. Also, the output signals of the coefficient multiplication circuits 8d and 8e are added to each other by means of the adder circuit 9c while the output signals of the coefficient multiplication circuit 8c and the adder circuit 9c are added to each other by means of the adder circuit 9b and transferred to the next stage as the data output signal. The clipping circuit 10 may be designed, for example, as illustrated in FIG. 30.

The clipping circuit 10 is initialized by the control signal p to reset the output signal of w at "0" (low level) in advance of operation of the biquad circuit. When the biquad circuit starts operating, the output signal w is equivalent to the input signal t as delayed by one clock cycle. During the period when the control signal o has its logical level of "1" (high level), the positive and negative overflow detection signals u and v are evaluated. In this case, when u=1 and v=0, it is indicated that a positive overflow occurs while, when u=0 and v=1, it is indicated that a negative overflow occurs.

The output signal w is output in synchronism with the next clock signal as
  (a) when u=v=0, w=t;
  (b) when u=1 and v=0, w=1; and
  (c) when u=0 and v=1, w=0.

While the case of u=v=1 is not allowed, the circuit as illustrated in FIG. 30 is operated in the same manner as (b).

In the case of the above (a), the output signal w is equivalent to the input signal t as delayed by one clock cycle until the control signal o rises up again. In the case of the above (b) or (c), the output signal w is inverted in synchronism with the rising edge of the next clock cycle when the control signal n becomes "1", while the output signal w is reset as w=0 in synchronism with the rising edge of the next clock cycle after the control signal s becomes "1".

By virtue of the operation of the clipping circuit 10, the signal w as output is forcibly clipped and fixed to the positive maximum value composed of all "1" bits except for MSB when positive overflow occurs and to the negative maximum value composed of all "0" bits except for MSB when negative overflow occurs. The negative maximum value is the negative value that have the maximum absolute value in the negative direction.

The above described overflow detection signals u and v are generated by the overflow detecting circuit 11. The overflow detecting circuit 11 serves to receive, as input signals, the output signals a and b of the coefficient multiplication circuits 8a and 8b, the carry output signal f of the adder circuit 9a, the carry output signal i of the adder circuit 9d, the output signals c, d and e of the coefficient multiplication circuits 8c, 8d and 8e of the biquad circuit at the preceding stage, and the carry output signals g and h of the adder circuits 9b and 9c at the preceding stage. In the case where the coefficient multiplication circuits 8a and 8b (or 8c, 8d and 8e) are implemented with parallel logic circuits capable of handling one word together, only the MSBs are input to the overflow detecting circuit 11. All these input signals are decoded to generate the positive and negative overflow detection signals u and v.

Next, the mechanism of the overflow detection will be explained. In the two's complement format, a positive number has the MSB of "0" while a negative number has the MSB of "1". On the other hand, when two numbers are added to each other with two's complement arithmetic, a positive weight is given to the carry signal "1" as output from the bit position just subsequent to the MSB. Namely, it will be understood that the sign bit has a weight opposite to that of the carry signal as output from the bit position just subsequent to the MSB. Accordingly, the higher bits no lower than the sign bit position (equals to the MSB in two's complement format) of the result of the addition can be correctly obtained without overflow by inverting either a sign bit(s) or a carry signal(s) and summing up together followed by adding a predetermined offset value to the sum or subtracting the sum from a predetermined offset value.

At first, explanation will be given in the case where the sign bits are inverted. The overflow detecting circuit 11 as illustrated in FIG. 1 serves to invert the sign bits a, b, c, d and e of the coefficient multiplication circuit 8a, 8b, 8c, 8d and 8e and sum up them together with the carry output signals f, g, h and i of the adder circuit 9a, 9b, 9c and 9d without inversion. Since the weight to a sign bit is (−1) as explained heretofore, the predetermined offset value is (−5) in this case where five sign bits are added. This results in the following equations.

$$S=/a+/b+/c+/d+/e+f+g+h+i \qquad [1]$$

$$Z=S-5 \qquad [2]$$

where /a designates the logical inversion of a.

Here, the value S is referred to as a intermediate sum while the value Z is referred to as a true sum in the followings description. Since there are nine input signals in this case, the values S and Z are 4-bit numbers. The respective bits of the values S and Z are represented respectively by S3, S2, S1 and S0, and Z3, Z2, Z1 and Z0 from the MSBs.

FIG. 4 is a table showing the relationship between intermediate sums S and true sums Z together with corresponding overflow conditions.

From FIG. 4, the overflow detection signals u and v are generated by the following Boolean equations.

$$u=/Z3\wedge(Z2\vee Z1\vee Z0) \quad [3]$$

$$v=Z3\wedge(/Z2\vee/Z1\wedge Z0) \quad [4]$$

where the symbol $\wedge$ designates the Boolean operator AND, and the symbol $\vee$ designates the Boolean operator OR respectively.

Figure 5:
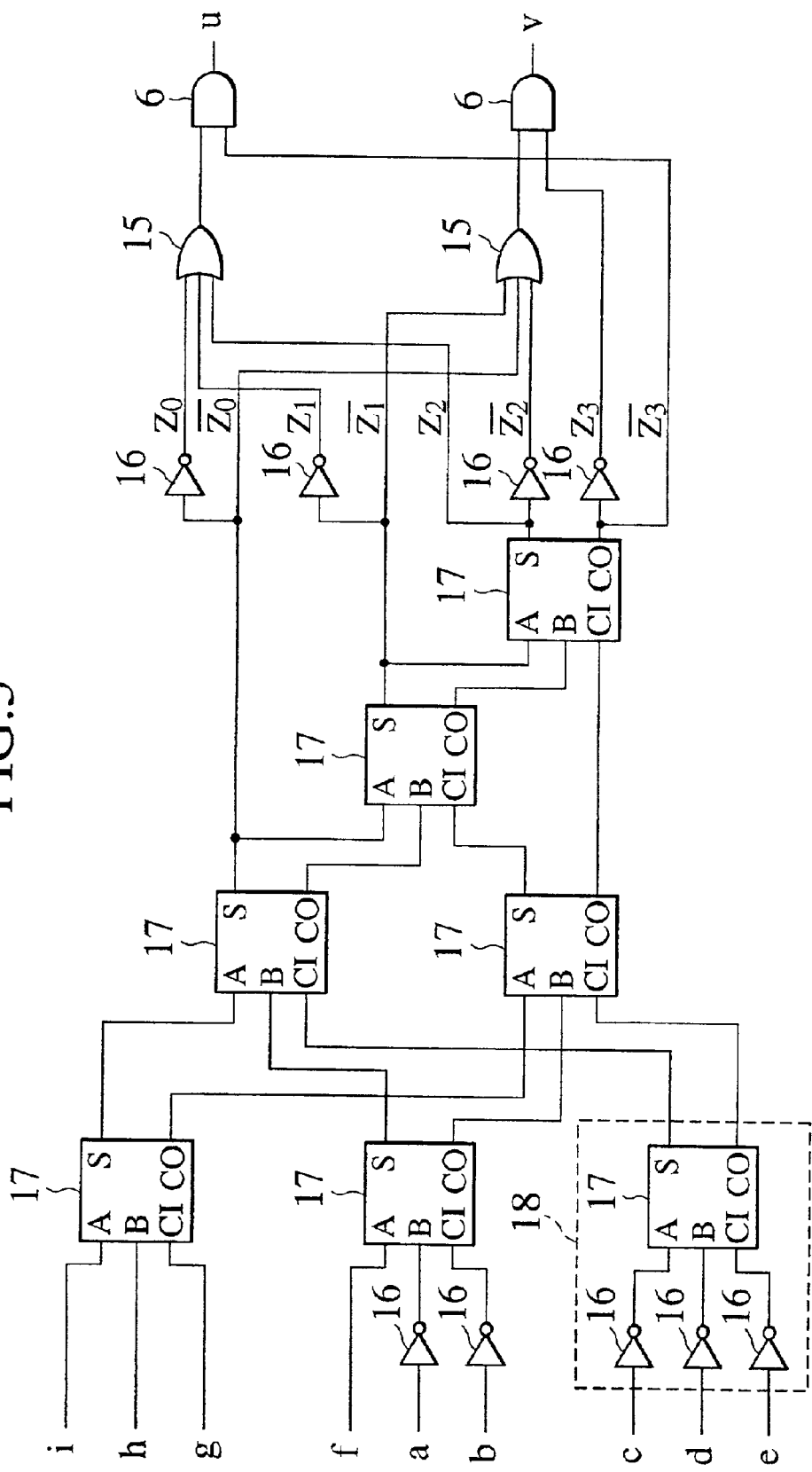
FIG. 5 is a circuit diagram showing an exemplary configuration of the overflow detecting circuit in accordance with the present invention as described above.

FIG. 5 is a circuit diagram showing an exemplary configuration of the overflow detecting circuit 11 in accordance with the first embodiment of the present invention as described above. In the figure, the reference numerals 6 designate AND gates; the reference numerals 16 designate inverters; the reference numerals 15 designate OR gates; and the reference numerals 17 designate full adder circuits. The circuit is composed of combination of an adder tree circuit, or the Wallace's Tree, and a decoder. This circuit serves to sum up the inversion signals of the input signals a, b, c, d and e, input signals f, g, h and i and the offset (−5) to generate the true sum Z by means of the Wallace's Tree circuit and decode the true sum Z in accordance with the equations [3] and [4] in order to obtain the positive and negative overflow detection signals u and v. The addition of the offset (−5) is performed by addition of 1011 in the two's complement format. However, in the circuit diagram as illustrated in FIG. 5, the (−5) addition is performed by the logical inversion and the carry cascading at the final stage of the adder tree implicitly.

Figure 6:
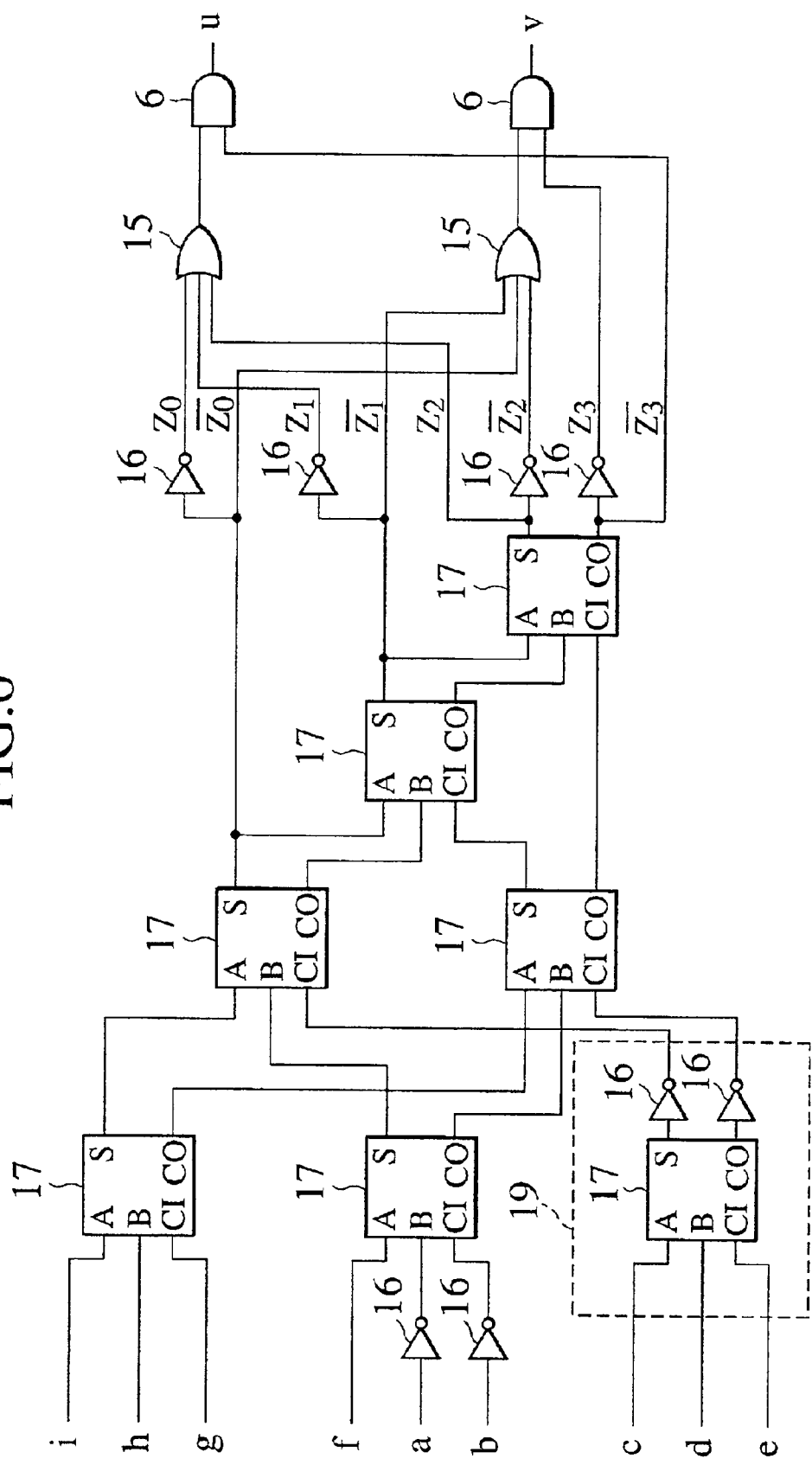
FIG. 6 is a circuit diagram showing another exemplary configuration of the overflow detecting circuit in accordance with the present invention as described above.

FIG. 6 is a circuit diagram showing another exemplary configuration of the overflow detecting circuit 11 in accordance with the first embodiment of the present invention as described above. In this case, the combination of the full adder circuit 17 and the two inverters 16 as illustrated within broken line (reference numeral 19) in FIG. 6 is used to replace the combination of the three inverters 16 and the full adder circuit 17 as illustrated within broken line (reference numeral 18) in FIG. 5. While it will be understood by writing a truth table that the combination 18 and the combination 19 are equivalent, the full adder circuit 17 serves to count the number of "1" included in the input signals of the three input terminals A, B and CI and, when the input signals are inverted, serves to count the number of "0" included in the input signals. There are three input signals so that the equivalent circuit is designed by receiving the input signals without inversion and subtracting the output signals thereof from three. The subtraction of a two-bit binary number from three is equivalent to the one's complement thereof, and therefore equivalent to the inversion of the respective bits. Accordingly, the combination 18 and the combination 19 are equivalent.

The overflow detecting circuits as explained heretofore serve to detect overflow with reference to the true sum Z. However, as seen from FIG. 4, the intermediate sums S and the true sums Z are related to each other in a one-to-one correspondence. From this fact, it will be understood that overflow can be detected also by decoding the intermediate sum S rather than the true sum Z.

From FIG. 4, the overflow detection signals u and v are generated by the following equations by the use of the intermediate sum S.

$$u=S3\wedge(S2\vee S1) \quad [5]$$

$$v=/S3\vee/S2 \quad [6].$$

Figure 7:
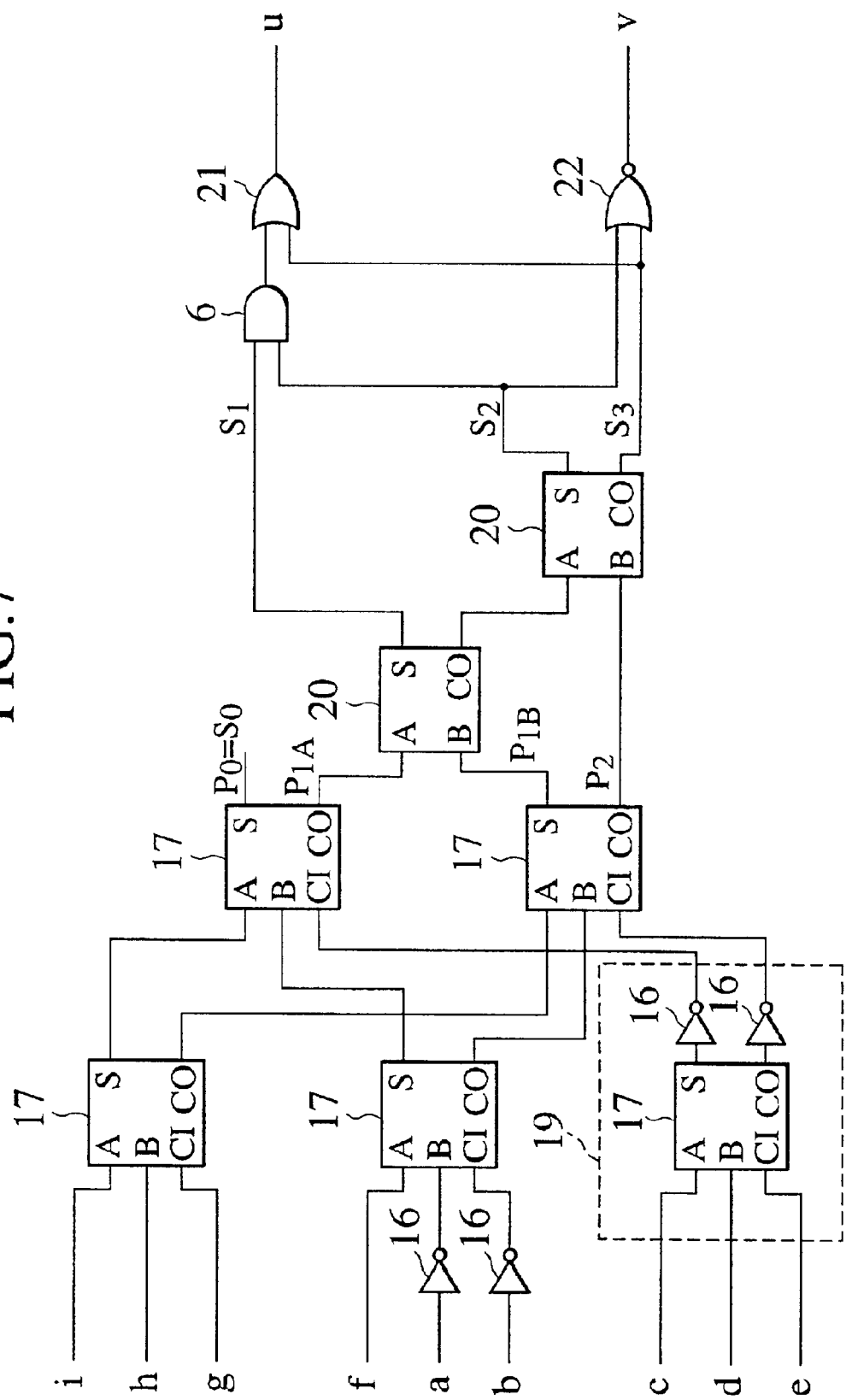
FIG. 7 is a circuit diagram showing a further exemplary configuration of the overflow detecting circuit in accordance with the present invention as described above.

FIG. 7 is a circuit diagram showing a further exemplary configuration of the overflow detecting circuit 11 in accordance with the first embodiment of the present invention as described above. In the figure, the reference numeral 6 designates an AND gate; the reference numerals 16 designate inverters; the reference numerals 17 designate full adder circuits; the reference numerals 20 designate half adder circuits; the reference numeral 21 designates an OR gate; and the reference numeral 22 designates a NOR gate. The half adder circuit 20 used in the circuits can be constructed as illustrated in FIG. 36.

Figure 36:
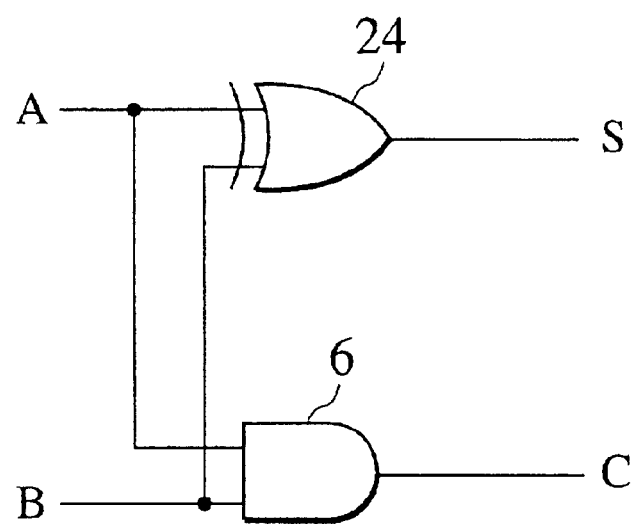
FIG. 36 is a circuit diagram showing an exemplary configuration of the half adder circuit used in the digital filter in accordance with the first embodiment of the present invention.
Figure 37:
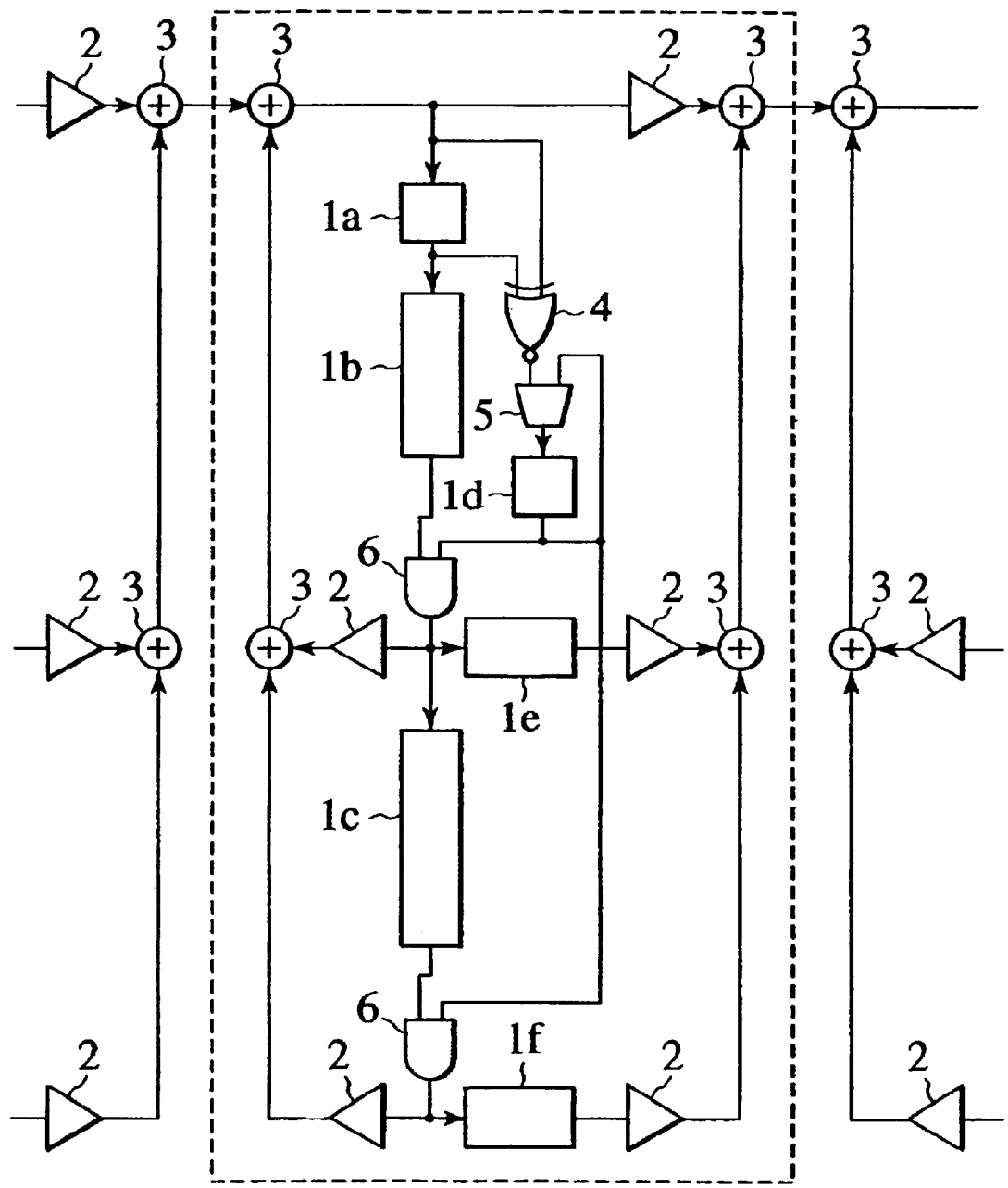
FIG. 37 is a circuit diagram showing a prior art digital biquad filter (inside of the broken line) in accordance with the serial calculation scheme for suppressing the overflow oscillation.
Figure 38:
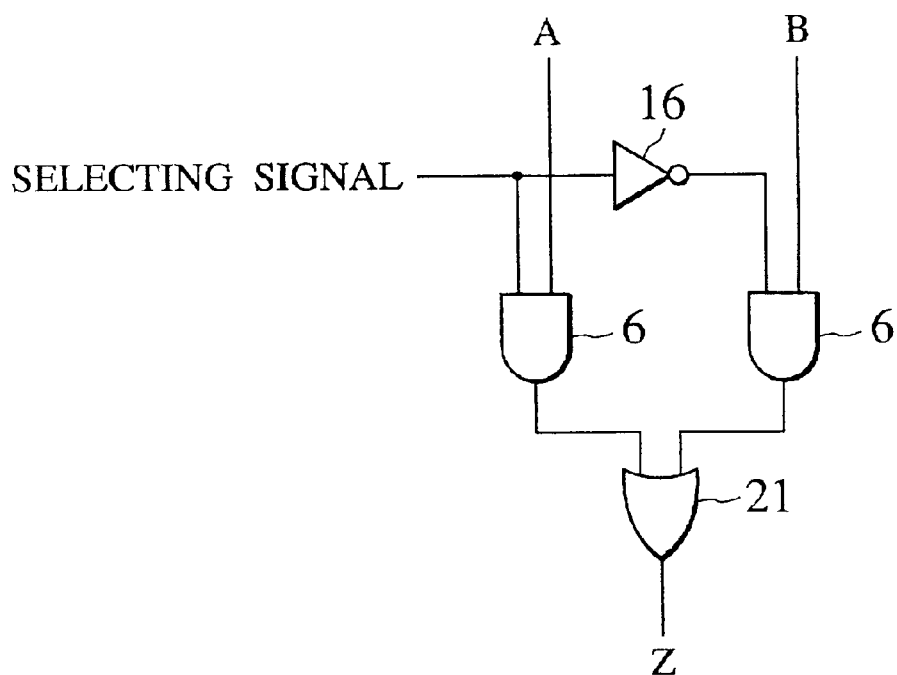
FIG. 38 is a circuit diagram showing an example of a selector circuit used in a digital filter in accordance with a prior art.
Figure 39A:
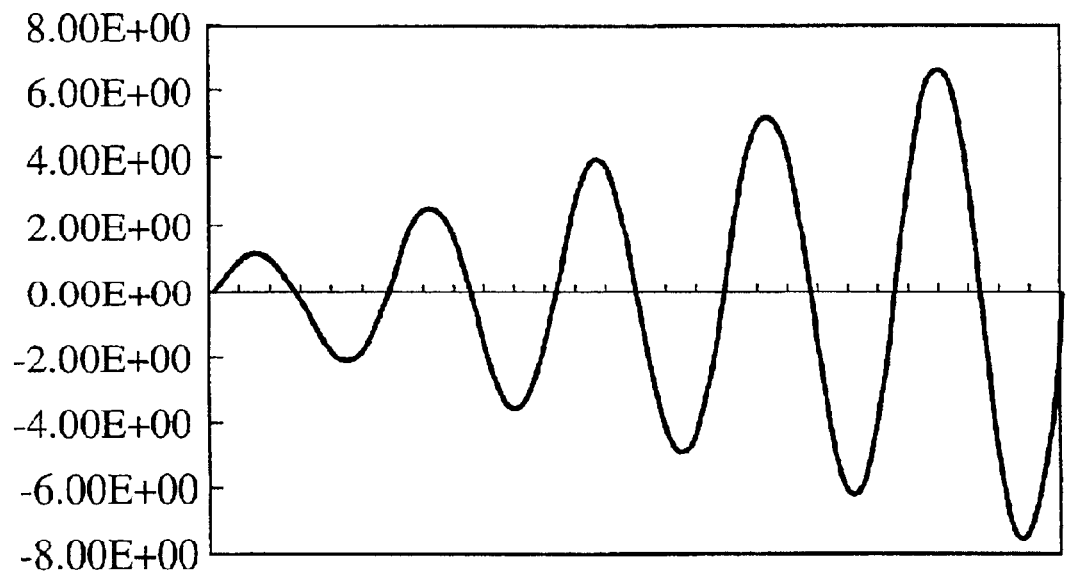
FIG. 39(a) and FIG. 39(b) are graphic diagrams respectively showing an input signal waveform and an output signal waveform in the case where overflow takes place in the prior art digital biquad filter as illustrated in FIG. 37.
Figure 39B:
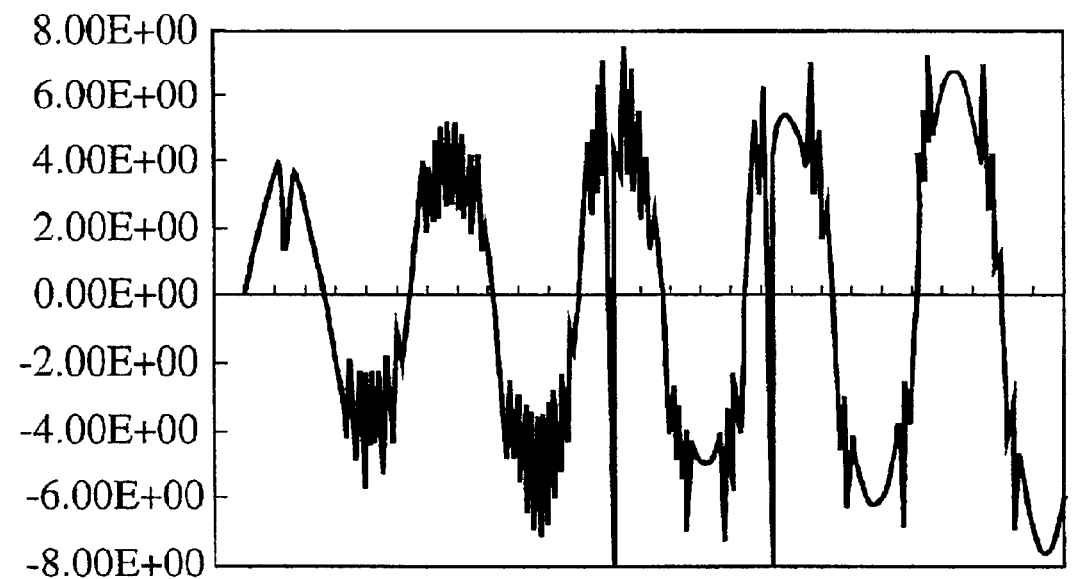
Figure 40A:
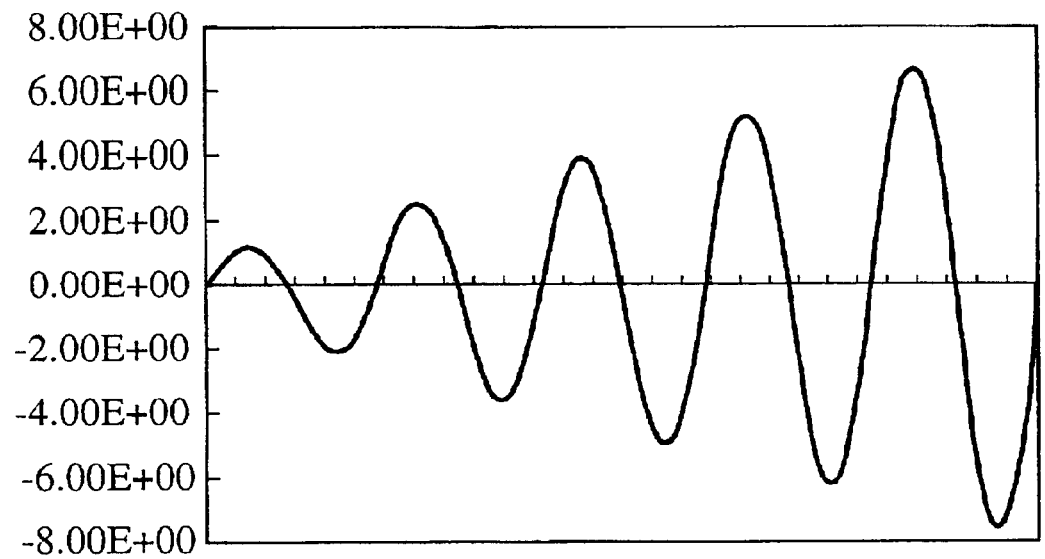
FIG. 40(a) and FIG. 40(b) are graphic diagrams respectively showing an input signal waveform and an output signal waveform in the case where overflow takes place in a digital biquad filter.
Figure 40B:
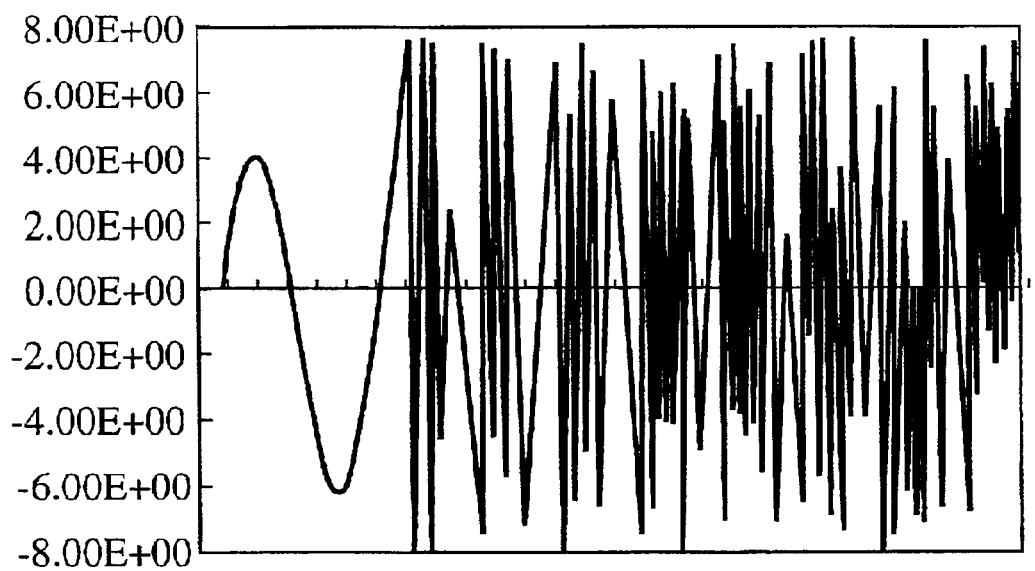

FIG. 36 is a circuit diagram showing an exemplary configuration of the half adder circuit used in the digital filter in accordance with the first embodiment of the present invention as described above. In the figure, the reference numeral 6 designates an AND gate; and the reference numeral 24 designates an exclusive OR gate.

The circuit as illustrated in FIG. 7 serves to calculate the positive and negative overflow detection signals u and v by the use of the sign bits as inverted by decoding the intermediate sum S in accordance with the equation [1] rather than decoding the true sum Z in accordance with the equation [2]. Meanwhile, the circuitry 19 as illustrated within broken line in the figure is equivalent to and can be replaced by the circuitry 18 as illustrated in FIG. 5.

Next, explanation will be given in the case where the carry bits are inverted. In this case, the overflow detecting circuit 11 as illustrated in FIG. 1 serves to receive the carry output signals f, g, h and i as inverted and sum up them together with the sign bits a, b, c, d and e without inversion. Since the weight to a carry output signal is 1 as explained heretofore, the predetermined offset value is 4 in this case where 4 inverted carry output signals are added. If the sum of the inverted carry output signals is 0, the weight of 4 has to be added. On the other hand, the weight to a sign bit is (−1) as explained heretofore. The sum of inverted carry output signals and sign bits is sign-reversed because of their minus weight. This results in the following equations.

$$S'=a+b+c+d+e+/f+/g+/h+/i \quad [7]$$

$$Z=(-S')+4=4-S' \quad [8]$$

Here, the value S' is referred to as a intermediate sum while the value Z is referred to as a true sum in the followings description in the same manner as the value S and the value Z. Since there are nine input signals also in this case, the values S' and Z are 4-bit numbers respectively. The respective bits of the values S' and Z are represented respectively by S3', S2', S1' and S0', and Z3, Z2, Z1 and Z0 from the MSBs.

FIG. 8 is a table showing the relationship between intermediate sums S' and true sums Z together with corresponding overflow conditions. From FIG. 8, it will be understood that the overflow detection signals u and v are generated also by the equations [3] and [4].

Figure 9:
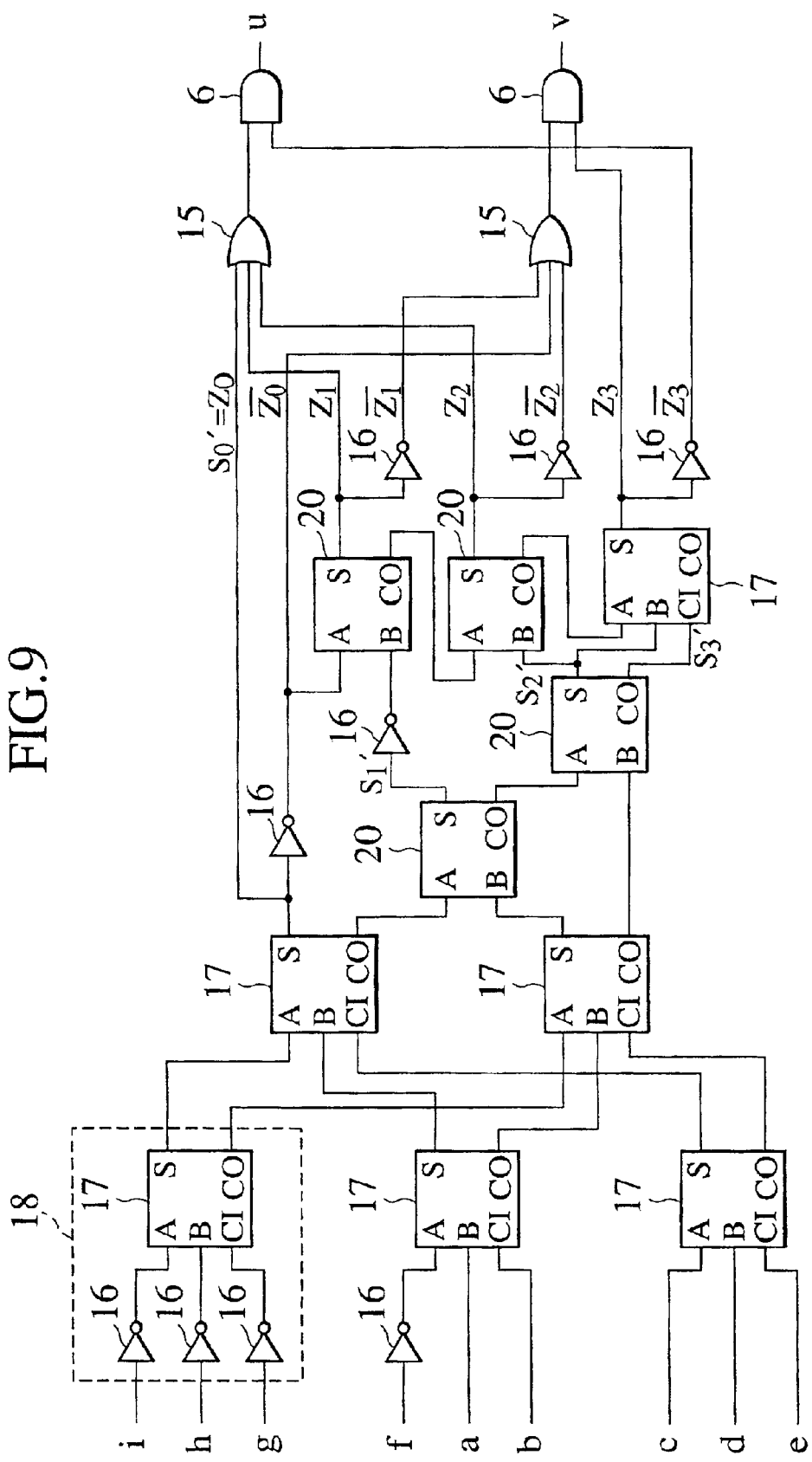
FIG. 9 is a circuit diagram showing a further exemplary configuration of the overflow detecting circuit in accordance with the present invention as described above.

FIG. 9 is a circuit diagram showing a further exemplary configuration of the overflow detecting circuit 11 in accordance with the first embodiment of the present invention as described above. In the figure, the reference numerals 6 designate AND gates; the reference numerals 15 designate OR gates; the reference numerals 16 designate inverters; the reference numerals 17 designate full adder circuits; and the reference numerals 20 designate half adder circuits.

The circuit as illustrated in FIG. 9 is composed of the combination of an adder tree circuit and a decoder. This circuit serves to sum up the input signals a, b, c, d and e and the inversion signals of the carry output signals f, g, h and i and subtract the sum from the offset 4 to generate the true sum Z and decode the true sum Z in accordance with the equations [3] and [4] in order to obtain the positive and negative overflow detection signals u and v. The subtraction of the intermediate sum S' from the offset 4 is performed by addition of 0100 to the two's complement of the intermediate sum S'. Since the two's complement is obtained by logical inversion of respective bits followed by addition of "1", the subtraction is performed by inverting the intermediate sum S' and adding 5=4+1 thereto. The addition operation of the value 5 is performed in the manner as explained heretofore in conjunction with FIG. 5 so that the numerical value 5 does not explicitly appear in FIG. 9. Meanwhile, the circuitry 18 as illustrated within broken line in the figure is equivalent to and can be replaced by the circuitry 19 as illustrated in FIG. 6.

The overflow detecting circuit as explained above serves to detect overflow with reference to the true sum Z. However, as seen from FIG. 8, the intermediate sums S' and the true sums Z are related to each other in a one-to-one correspondence. From this fact, it will be understood that overflow can be detected also by decoding the intermediate sum S' rather than the true sum Z.

From FIG. 8, the overflow detection signals u and v are generated by the following equations by the use of the intermediate sum S'.

$$u = /S3' \wedge /S2'$$ [9]

$$v = S3' \vee (S2' \wedge S1')$$ [10]

Figure 10:
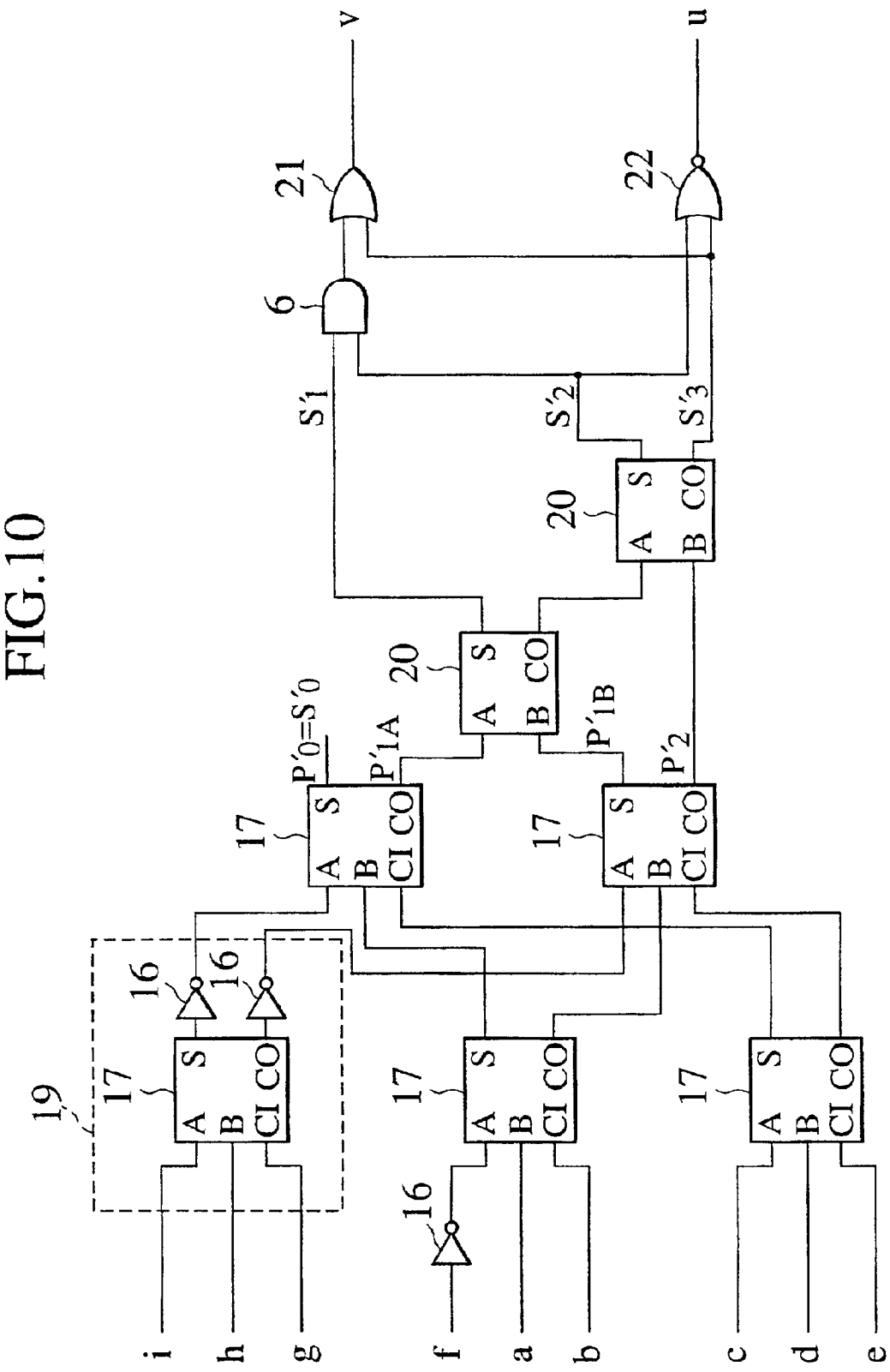
FIG. 10 is a circuit diagram showing a further exemplary configuration of the overflow detecting circuit in accordance with the present invention as described above.

FIG. 10 is a circuit diagram showing a further exemplary configuration of the overflow detecting circuit 11 in accordance with the first embodiment of the present invention as described above. In the figure, the reference numeral 6 designates an AND gate; the reference numerals 16 designate inverters; the reference numerals 17 designate full adder circuits; the reference numerals 20 designate half adder circuits; the reference numeral 21 designates an OR gate; and the reference numeral 22 designates a NOR gate.

The circuit as illustrated in FIG. 10 serves to calculate the positive and negative overflow detection signals u and v by the use of the carry bits as inverted by decoding the intermediate sum S' in accordance with the equation [7] rather than decoding the true sum Z in accordance with the equation [8]. Meanwhile, the circuitry 19 as illustrated within broken line in the figure is equivalent to and can be replaced by the circuitry 18 as illustrated in FIG. 5.

The signals designated by the references P2, P1B, P1A and P0 as illustrated in FIG. 7 are the redundant binary signals generated in advance of obtaining the intermediate sum S. The overflow can be detected by decoding these redundant binary signals.

FIG. 11 is a table showing the relationship between the redundant binary signals P2, P1B, P1A and P0 and overflow conditions.

From FIG. 11, the overflow detection signals u and v are generated by the following equations by the use of the redundant binary signals P2, P1B and P1A (P0 is "don't care").

$$u = = P2 \wedge (P1B \vee P1A)$$ [11]

$$v = /P2 \wedge (/P1B \vee /P1A)$$ [12]

Figure 12:
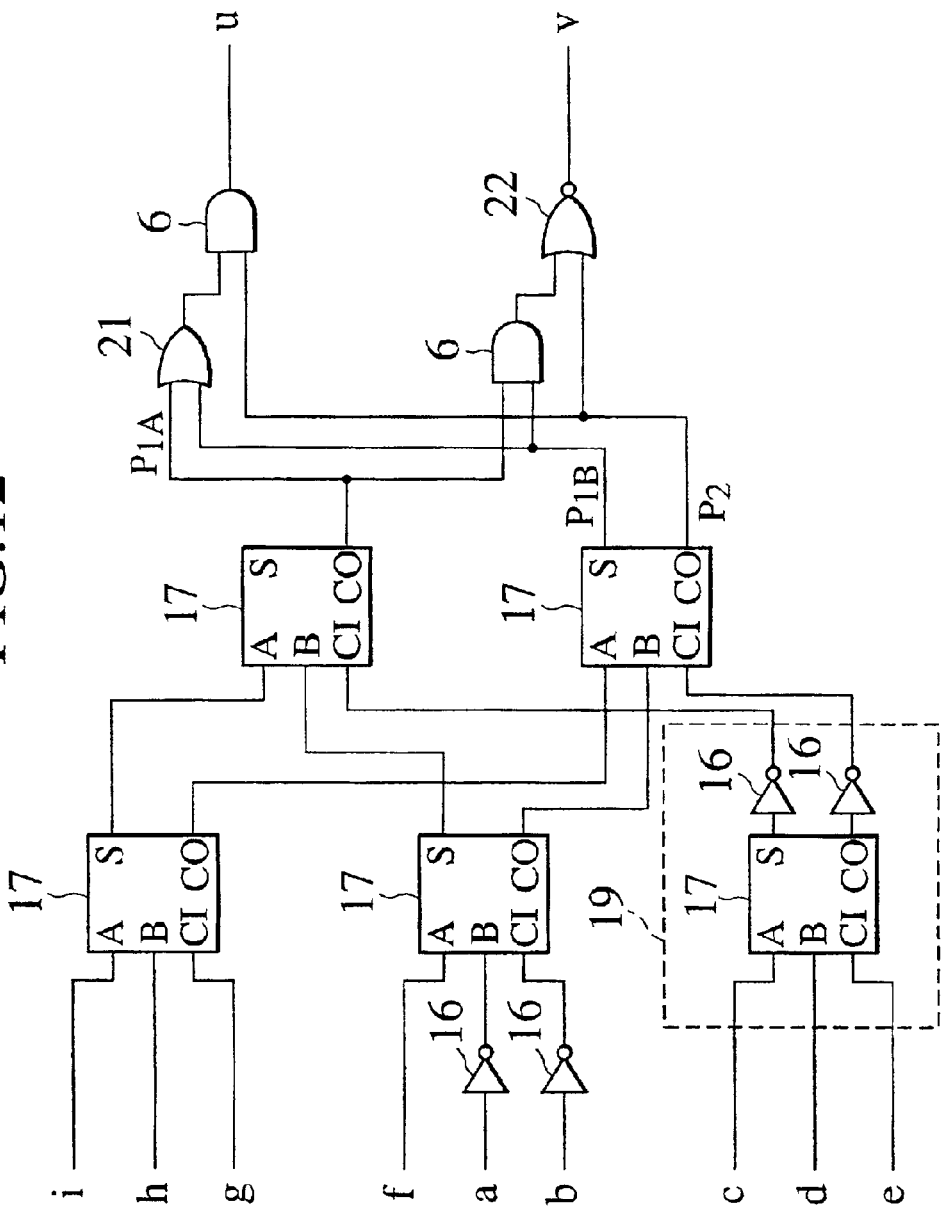
FIG. 12 is a circuit diagram showing a further exemplary configuration of the overflow detecting circuit in accordance with the present invention as described above.

FIG. 12 is a circuit diagram showing a further exemplary configuration of the overflow detecting circuit 11 in accordance with the first embodiment of the present invention as described above. In the figure, the reference numerals 6 designate AND gates; the reference numerals 16 designate inverters; the reference numerals 17 designate full adder circuits; the reference numeral 21 designates an OR gate; and the reference numeral 22 designates a NOR gate.

The circuit as illustrated in FIG. 12 serves to calculate the positive and negative overflow detection signals u and v by the use of the sign bits as inverted by decoding the redundant binary signals P2, P1B and P1A (P0 is "don't care") as illustrated in FIG. 11 rather than decoding the intermediate sum S in accordance with the equation [1]. Meanwhile, the circuitry 19 as illustrated within broken line in the figure is equivalent to and can be replaced by the circuitry 18 as illustrated in FIG. 5.

The signals designated by the references P2', P1B', P1A' and P0' as illustrated in FIG. 10 are the redundant binary signals generated in advance of obtaining the intermediate sum S'. The overflow can be detected by decoding these redundant binary signals.

FIG. 13 is a table showing the relationship between the redundant binary signals P2', P1B', P1A' and P0' and overflow conditions.

From FIG. 13, the overflow detection signals u and v are generated by the following equations by the use of the redundant binary signals P2', P1B' and P1A' (P0' is "don't care").

$$u = = P2' \wedge (P1B' \vee P1A')$$ [11]

$$v = /P2' \wedge (/P1B' \vee /P1A')$$ [12]

Figure 14:
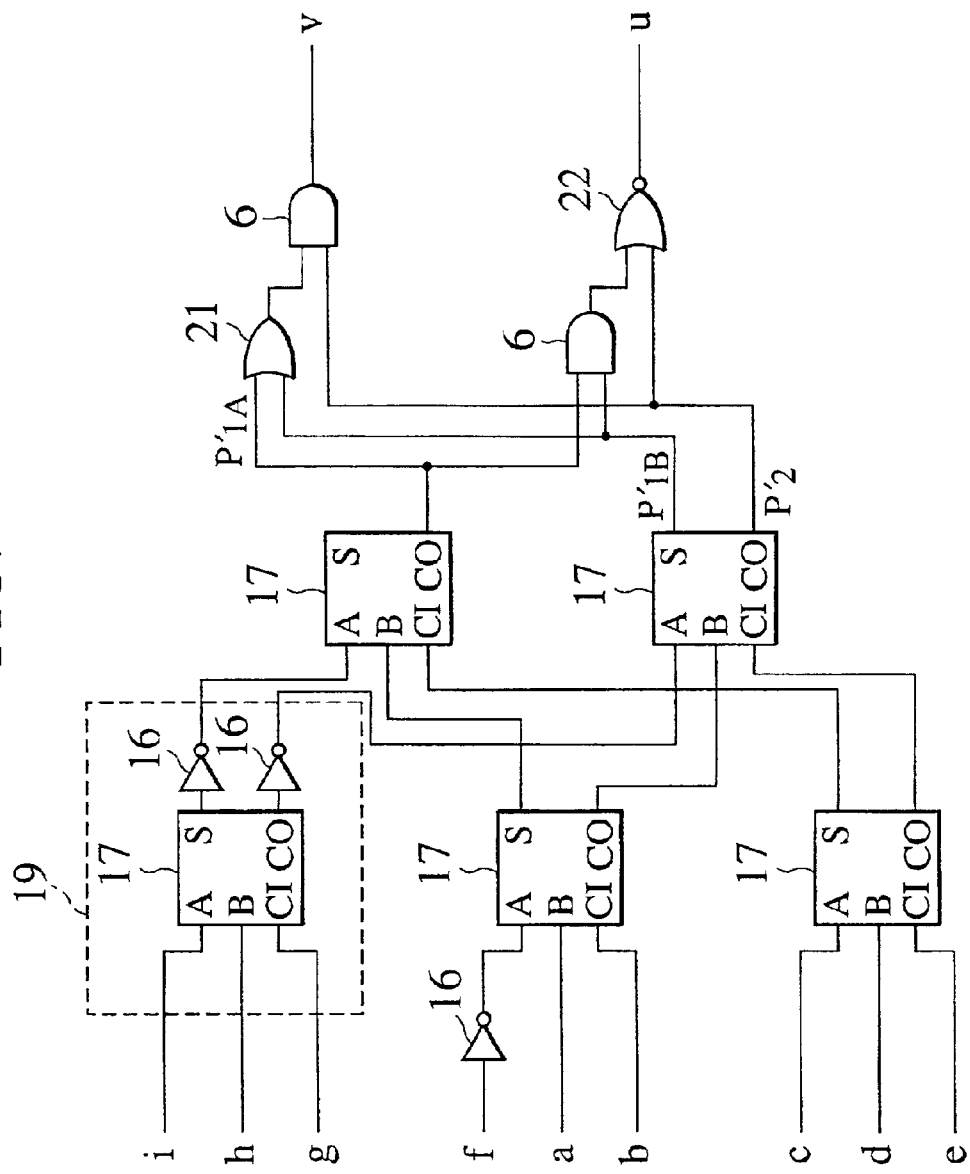
FIG. 14 is a circuit diagram showing a further exemplary configuration of the overflow detecting circuit in accordance with the present invention as described above.

FIG. 14 is a circuit diagram showing a further exemplary configuration of the overflow detecting circuit 11 in accordance with the first embodiment of the present invention as described above. In the figure, the reference numerals 6 designate AND gates; the reference numerals 16 designate inverters; the reference numerals 17 designate full adder circuits; the reference numerals 21 designates an OR gate; and the reference numeral 22 designates a NOR gate.

The circuit as illustrated in FIG. 14 serves to calculate the positive and negative overflow detection signals u and v by the use of the carry signals as inverted by decoding the redundant binary signals P2', P1B' and P1A' (P0' is "don't care") as illustrated in FIG. 13 rather than decoding the intermediate sum S' in accordance with the equation [7]. Meanwhile, the circuitry 19 as illustrated within broken line in the figure is equivalent to and can be replaced by the circuitry 18 as illustrated in FIG. 5.

On the other hand, while the biquad circuit is used in cascade in many cases as described above, there is given no signal from the previous stage to the leading biquad circuit at the head of the cascade or a lone biquad circuit (when not cascaded) for receiving as the input signals c, d, e, g and h for detecting overflow. In this case, when used for the leading biquad circuit at the head of the cascade or a lone biquad circuit (when not cascaded), the overflow detecting circuit 11 as illustrated in FIG. 1 is given "0" as the input signals d, e, g and h and the input data signal as the input signal c so that overflow can be detected as described above. In usual cases, the input signals d, e, g and h can be set to "0" by simply grounding these signal lines.

In the case of all pole filters, there is no need for the coefficient multiplication circuits 8d and 8e so that the handling of the input signals d, e, g and h for detecting overflow can be dispensed with. Also, in this case, the overflow detecting circuit 11 as illustrated in FIG. 1 is given "0" as the input signals d, e, g and h and the input data signal as the input signal c so that overflow can be detected as described above.

Alternatively, there can be designed an overflow detecting circuit for use in the leading biquad circuit at the head of the cascade or a lone biquad circuit (when not cascaded) in order to reduce the hardware for implementation.

Figure 15:
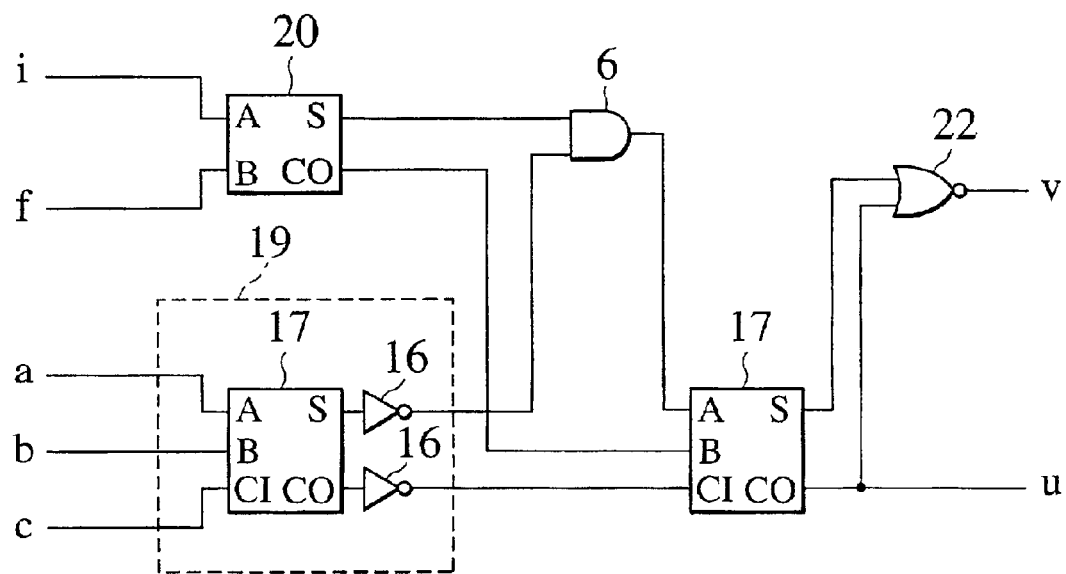
FIG. 15 is a circuit diagram showing a further exemplary configuration of the overflow detecting circuit in accordance with the present invention as described above.

FIG. 15 is a circuit diagram showing a further exemplary configuration of the overflow detecting circuit 11 in accordance with the first embodiment of the present invention as described above. In the figure, the reference numeral 6 designates an AND gate; the reference numerals 16 designate inverters; the reference numerals 17 designate full adder circuits; the reference numeral 20 designates an half adder circuit; and the reference numeral 22 designates a NOR gate.

The overflow detecting circuit as illustrated in FIG. 15 is optimized exclusively for use in the leading biquad circuit at the head of the cascade or a lone biquad circuit and applicable also for all pole filters. The overflow is detected by the use of the signal a, b, c, f and i without referring to other signals. Meanwhile, the circuitry 19 as illustrated within broken line in the figure is equivalent to and can be replaced by the circuitry 18 as illustrated in FIG. 5.

Figure 16:
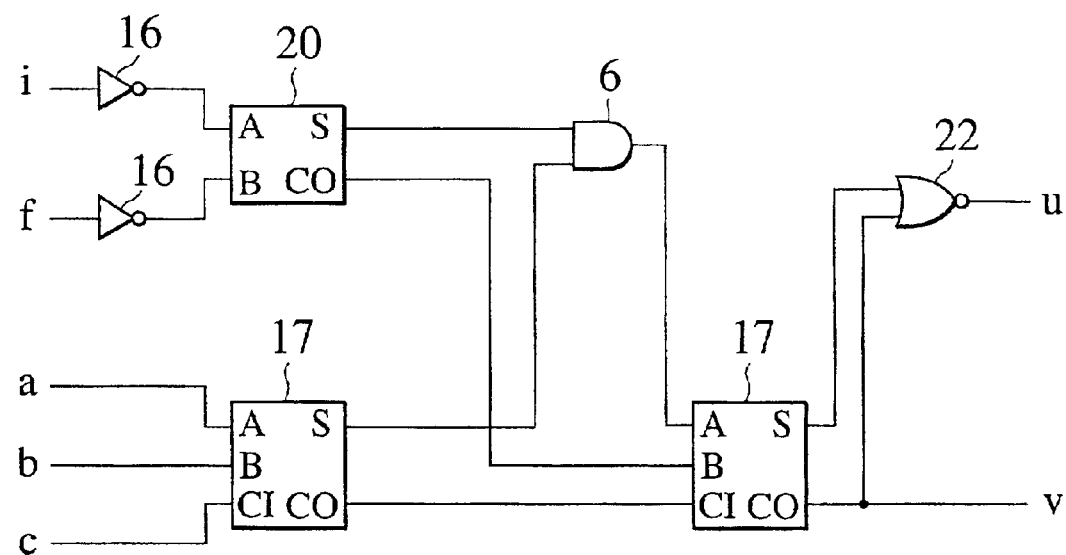
FIG. 16 is a circuit diagram showing a further exemplary configuration of the overflow detecting circuit in accordance with the present invention as described above.

FIG. 16 is a circuit diagram showing a further exemplary configuration of the overflow detecting circuit 11 in accordance with the first embodiment of the present invention as described above. In the figure, the reference numeral 6 designates an AND gate; the reference numerals 16 designate inverters; the reference numerals 17 designate full adder circuits; the reference numeral 20 designates an half adder circuit; and the reference numeral 22 designates a NOR gate.

The overflow detecting circuit as illustrated in FIG. 16 is optimized exclusively for use in the leading biquad circuit at the head of the cascade or a lone biquad circuit and applicable also for all pole filters. The overflow is detected by the use of the signal a, b, c, f and i without referring to other signals.

The order of the filter implemented with a plurality of biquad circuits connected in series may be of an even number as well as of an odd number. If the order is an odd number, the coefficient multiplication circuits 8b and 8e at the last stage are given "0" as the coefficient of the multiplication in order that the effective order of the biquad circuit becomes 1. However, the hardware amount can be reduced by dispensing with these coefficient multiplication circuits.

In this case, there is no internal input signals b and f for detecting overflow. Since there is provided a two-order biquad circuit at the preceding stage, other input signals for detecting overflow exist. In this case, when used for the following biquad circuit at the tail of the cascade having odd order number, the overflow detecting circuit 11 as illustrated in FIG. 1 is given "0" as the input signals b and f among nine input signals so that overflow can be detected as described above. In usual cases, the input signals b and f can be set to "0" by simply grounding these signal lines. Alternatively, also in this case, there can be designed an overflow detecting circuit for use in the anchor biquad circuit at the tail of the cascade having odd order number in order to reduce the hardware for implementation.

Figure 17:
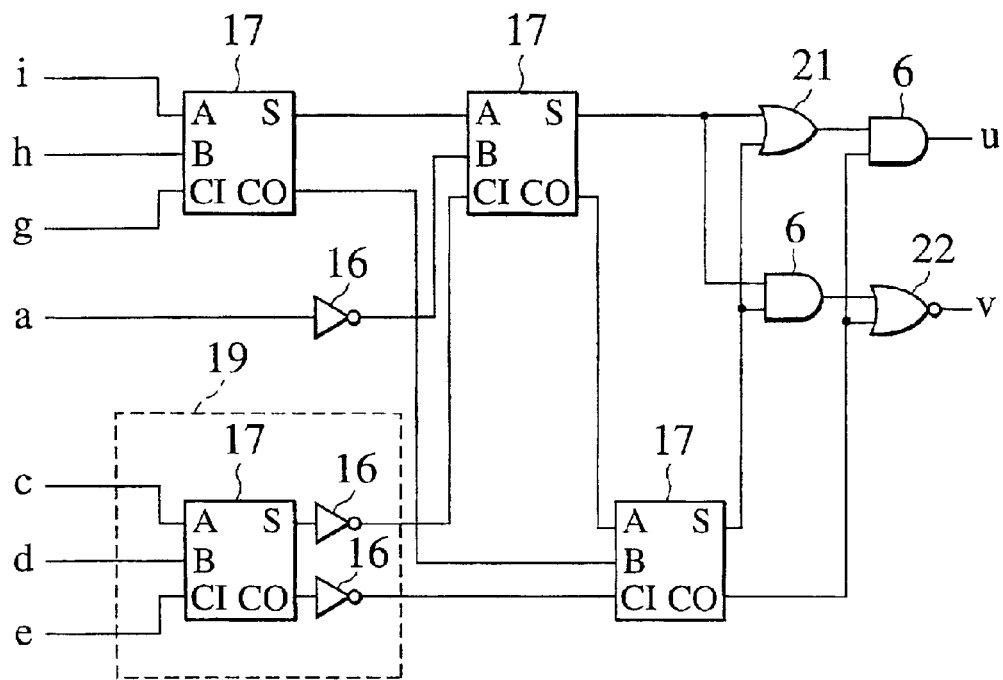
FIG. 17 is a circuit diagram showing a further exemplary configuration of the overflow detecting circuit in accordance with the present invention as described above.

FIG. 17 is a circuit diagram showing a further exemplary configuration of the overflow detecting circuit 11 in accordance with the first embodiment of the present invention as described above. In the figure, the reference numerals 6 designate AND gates; the reference numerals 16 designate inverters; the reference numerals 17 designate full adder circuits; the reference numeral 21 designates an OR gate; and the reference numeral 22 designates a NOR gate.

The overflow detecting circuit as illustrated in FIG. 17 is optimized exclusively for use in the one-order biquad circuit at the last stage. The overflow is detected by the use of the signal a, c, d, e, g, h and i without referring to other signals. Meanwhile, the circuitry 19 as illustrated within broken line in the figure is equivalent to and can be replaced by the circuitry 18 as illustrated in FIG. 5.

Figure 18:
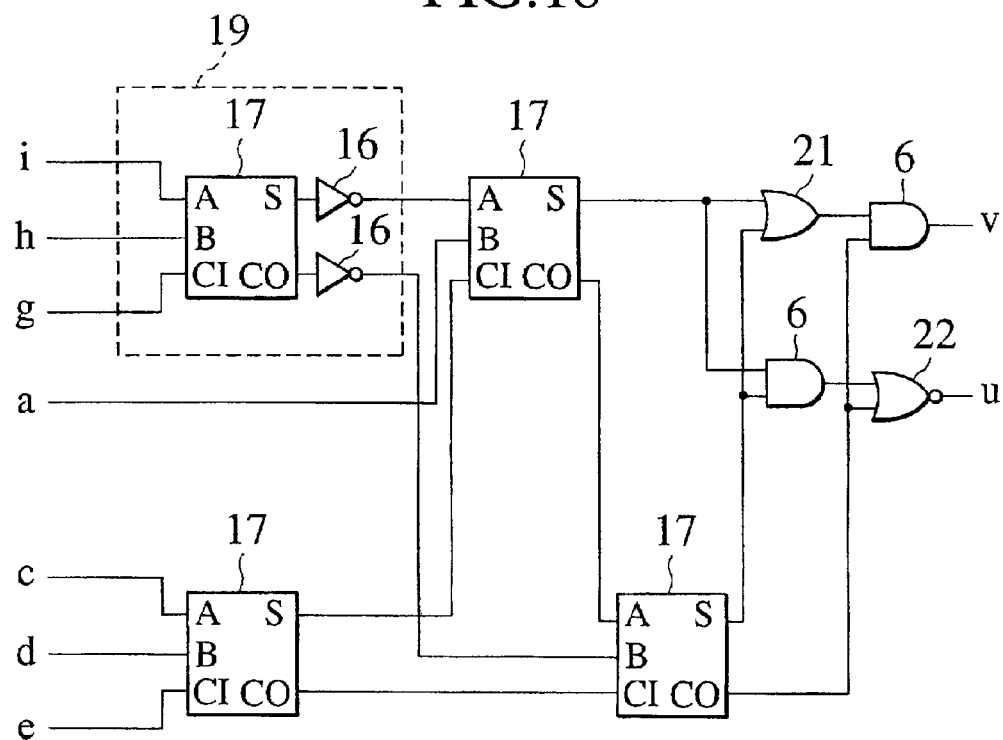
FIG. 18 is a circuit diagram showing a further exemplary configuration of the overflow detecting circuit in accordance with the present invention as described above.

FIG. 18 is a circuit diagram showing a further exemplary configuration of the overflow detecting circuit 11 in accordance with the first embodiment of the present invention as described above. In the figure, the reference numerals 6 designate AND gates; the reference numerals 16 designate inverters; the reference numerals 17 designate full adder circuits; the reference numeral 21 designates an OR gate; and the reference numeral 22 designates a NOR gate.

The overflow detecting circuit as illustrated in FIG. 18 is optimized exclusively for use in the one-order biquad circuit at the last stage. The overflow is detected by the use of the signal a, c, d, e, g, h and i without referring to other signals. Meanwhile, the circuitry 19 as illustrated within broken line in the figure is equivalent to and can be replaced by the circuitry 18 as illustrated in FIG. 5.

In accordance with the present embodiment, it is possible to completely prevent the digital filter from generating the overflow oscillation as illustrated in FIG. 3($a$) and FIG. 3($b$) by detecting positive and negative overflow propagating one or a plurality of bits by means of the overflow detecting circuit 11 and, when overflow is detected, to fix the output signal to the positive maximum value or the negative maximum value (having maximum absolute value in the negative direction).

Figure 19:
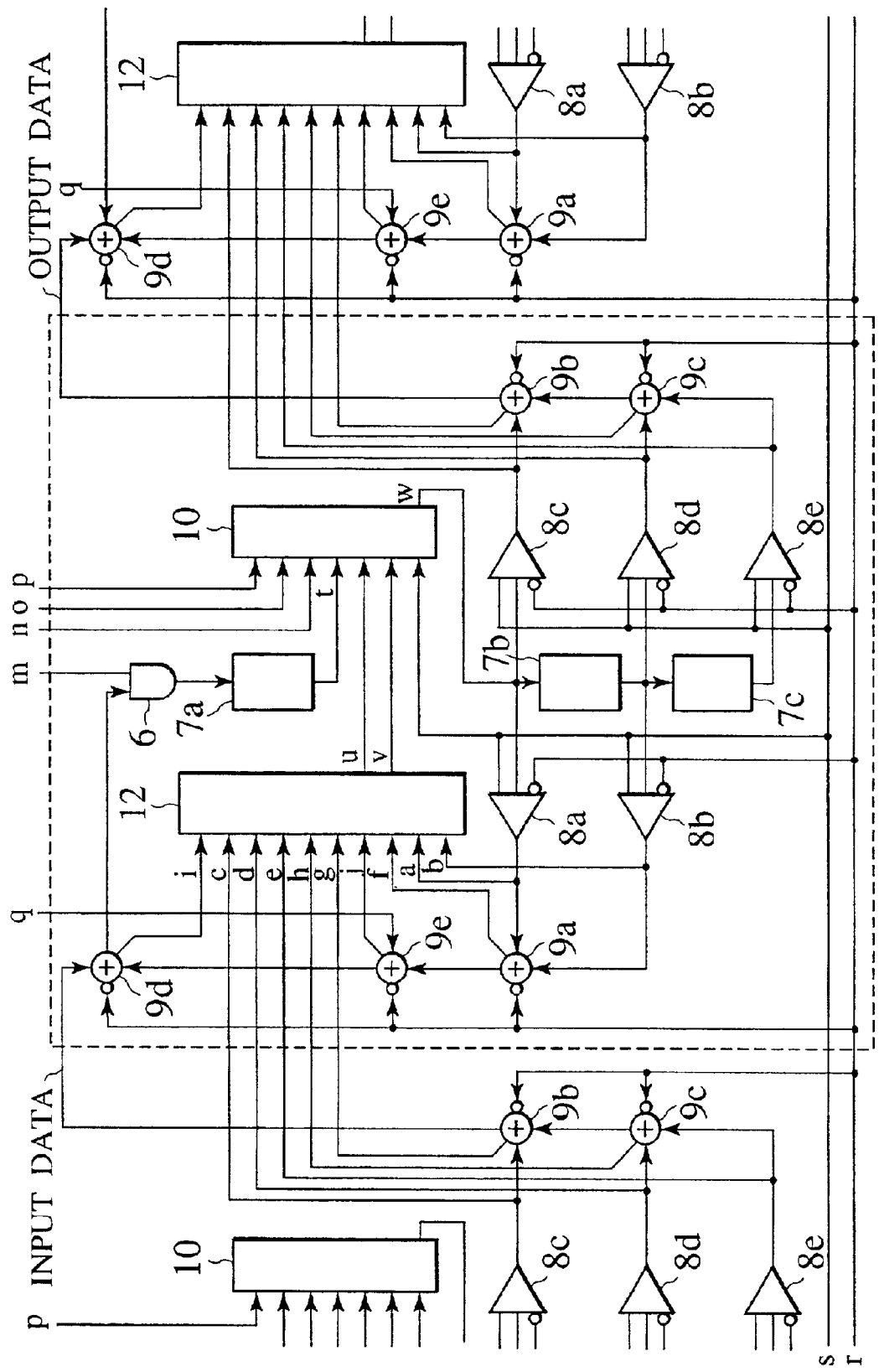
FIG. 19 is a block diagram showing the configuration of a digital filter in accordance with a second embodiment of the present invention.

FIG. 19 is a block diagram showing the configuration of a digital filter in accordance with a second embodiment of the present invention. In the figure, the digital biquad filter (inside of the broken line) is composed of an AND gate 6, shift registers 7a, 7b and 7c, coefficient multiplication circuits 8a, 8b, 8c, 8d and 8e, adder circuit 9a, 9b, 9c, 9d and 9e, a clipping circuit 10 and an overflow detecting circuit 12. Similar digital biquad filters are connected to the biquad filter in the previous and subsequent stages of the digital filter in cascade. The output signals of the coefficient multiplication circuits 8a and 8b are fed back to the adder circuit 9d and summed up again together with the input signal to this stage and therefore the coefficient multiplication circuits 8a and 8b can be called as backward coefficient multiplication circuits. Also, the output signals of the coefficient multiplication circuits 8c, 8d and 8e are summed up together and forwarded as the input signal to the adder circuit 9d at the next stage and therefore the coefficient multiplication circuits 8c, 8d and 8e can be called as forward coefficient multiplication circuits.

The clipping circuit used in the circuits can be constructed as illustrated in FIG. 30; the coefficient multiplication circuit used in the circuits can be constructed as illustrated in FIG. 31; and the adder circuit used in the circuits can be constructed as illustrated in FIG. 32. Also, the shift registers used in the circuits can be constructed as illustrated in FIG. 33.

In FIG. 19, the signals m, n, o, p, q, r and s are control signals which will be explained in the followings. Specific timing for the data input signal, the data output signal and the control signals depends upon the bit lengths of the respective data and the coefficient.

Figure 20:
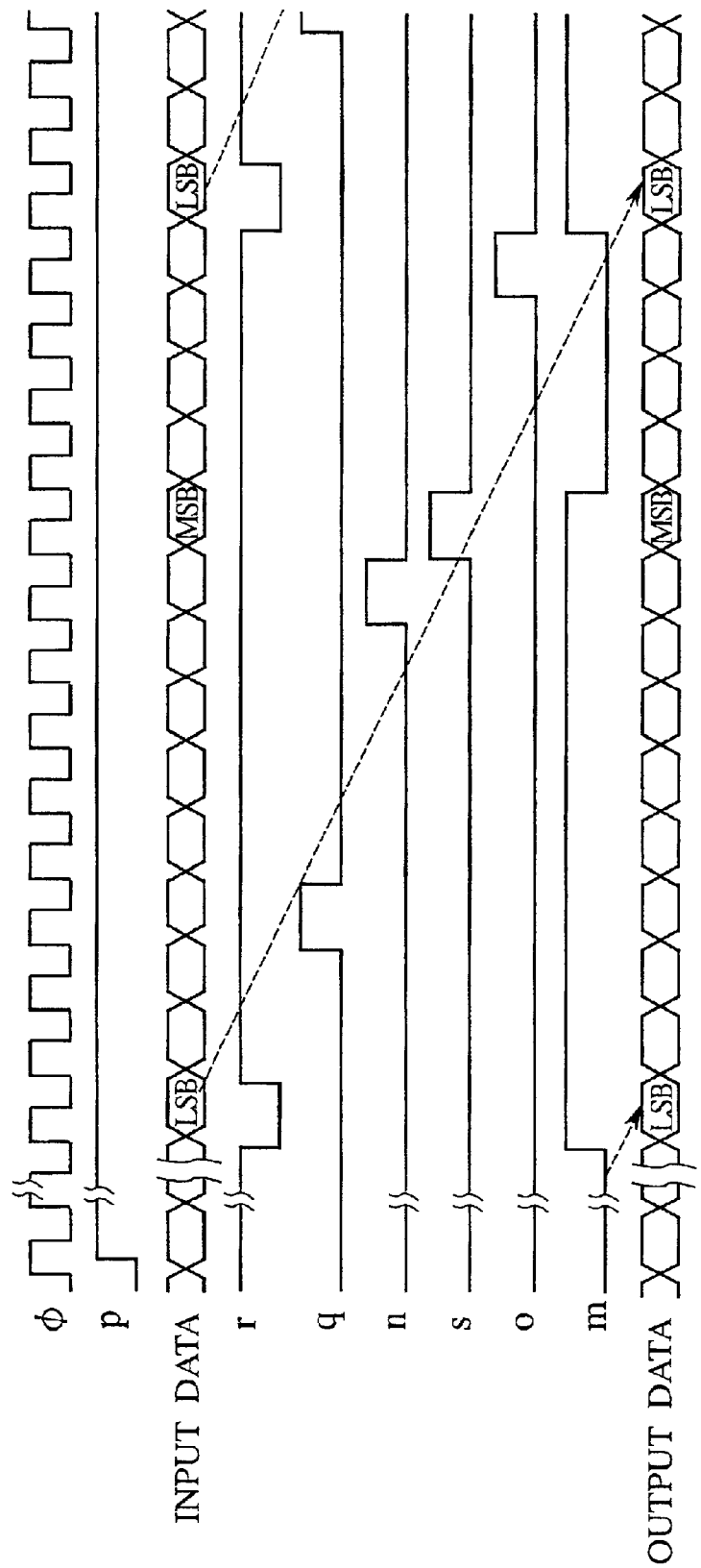
FIG. 20 is a timing chart showing the specific timing of the data input signal, the data output signal and the control signals for the second embodiment of the present invention.

FIG. 20 is a timing chart showing the specific timing of the data input signal, the data output signal and the control signals for the second embodiment of the present invention in the case where the bit length of data signals is 10 bits while the bit length of the coefficients is 6 bits. Moreover, in this case, the integer portion of the respective data signal is composed of 4 bits while the integer portion of the coefficient signals is composed of 2 bits. Both the data signals and the coefficient signals are given as fixed-point data signals with two's complement format.

Next, the operation of the digital biquad filter in accordance with the present embodiment will be explained. The circuitry as illustrated within the broken line of FIG. 19 is the digital biquad filter, also called as the biquad for short. Biquad circuits are connected in series in many cases so that some elements of a previous and a subsequent biquad circuit are illustrated in the figure.

In the biquad circuit, the output signal w of the clipping circuit 10 is multiplied by a predetermined coefficient by the coefficient multiplication circuit 8a while the output signal of the shift register 7b is multiplied by a predetermined coefficient by the coefficient multiplication circuit 8b. The output signals of the coefficient multiplication circuits 8a and 8b are added together by means of the adder circuit 9a. The output signal of the adder circuit 9a and the control signal q are added together by means of the adder circuit 9e. The control signal q is used to round off the output signal of the adder circuit 9d to the LSB. More specifically speaking, the control signal q of "1" is added to the bit position one bit lower than the LSB so that if the bit data in the bit position one bit lower than the LSB is "1", the LSB is incremented. This rounding operation can be done here or at other point in an adder tree including the adder circuit 9d. The output signal of the adder circuit 9e and the data input signal are added together by means of the adder circuit 9d. The output signal of the adder circuit 9d and the control signal m are logically multiplied and input to the shift register 7a. The control signal m is used to trim the output signal of the adder circuit 9d to obtain a bit sequence having the same bit length as the data. The output signal t of the shift register 7a is input to the clipping circuit 10.

The output signal w of the clipping circuit 10, the output signal of the shift register 7b and the output signal of the shift register 7c are multiplied by predetermined coefficients respectively by means of the coefficient multiplication circuit 8c, 8d and 8e. Also, the output signals of the coefficient multiplication circuits 8d and 8e are added to each other by means of the adder circuit 9c while the output signals of the coefficient multiplication circuit 8c and the adder circuit 9c are added to each other by means of the adder circuit 9b and transferred to the next stage as the data output signal.

The clipping circuit 10 as described above may be designed, for example, as illustrated in FIG. 30. The clipping circuit 10 serves to receive the input signal t, the positive and negative overflow detection signals u and v and the control signal n, o, p and s which are changed in accordance with the timing as illustrated in FIG. 20. By virtue of the operation of the clipping circuit 10, the signal w as output is forcibly clipped and fixed to the positive maximum value when positive overflow occurs and to the negative maximum value when negative overflow occurs.

The above described overflow detection signals u and v are generated by the overflow detecting circuit 12. The overflow detecting circuit 12 serves to receive, as input signals, the output signals a and b of the coefficient multiplication circuits 8a and 8b, the carry output signal f of the adder circuit 9a, the carry output signal i of the adder circuit 9d, the carry output signal j of the adder circuit 9e, the output signals c, d and e of the coefficient multiplication circuits 8c, 8d and 8e of the biquad circuit at the preceding stage, and the carry output signals g and h of the adder circuits 9b and 9c at the preceding stage. All these input signals are decoded to generate the positive and negative overflow detection signals u and v.

Figure 21:
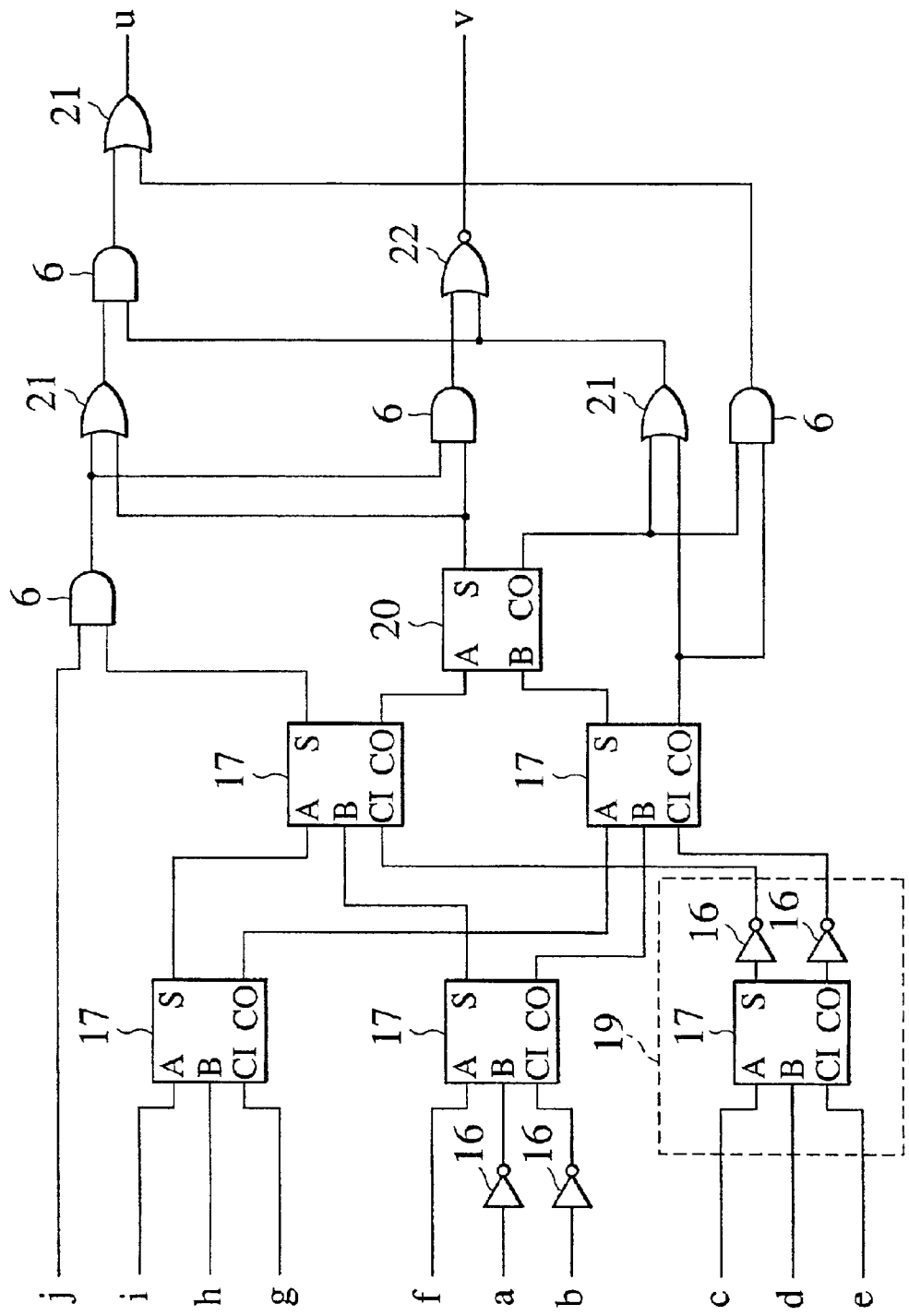
FIG. 21 is a circuit diagram showing a further exemplary configuration of the overflow detecting circuit in accordance with the present invention as described above.

FIG. 21 is a circuit diagram showing an exemplary configuration of the overflow detecting circuit 12 in accordance with the second embodiment of the present invention as described above. In the figure, the reference numerals 6 designate AND gates; the reference numerals 16 designate inverters; the reference numerals 17 designate full adder circuits; the reference numeral 20 designates a half adder circuit; the reference numerals 21 designate OR gates; and the reference numeral 22 designates a NOR gate.

The circuit as illustrated in FIG. 21 serves to calculate the positive and negative overflow detection signals u and v by the use of the sign bits as inverted by decoding the redundant binary signals in advance of calculating the intermediate sum. Meanwhile, the circuitry 19 as illustrated within broken line in the figure is equivalent to and can be replaced by the circuitry 18 as illustrated in FIG. 5. This circuit is used to evaluate the true sum Z to be calculated as follows.

$$Z=/a+/b+/c+/d+/e+f+g+h+i+j-5 \qquad [15]$$

With reference to Z, the overflow detection signals u and v are generated by the following equations.

(a) When Z>0, u=1 and v=0.
(b) When Z<(−1), u=0 and v=1.
(c) When neither (a) nor (b) is satisfied, u=v=0.

Figure 22:
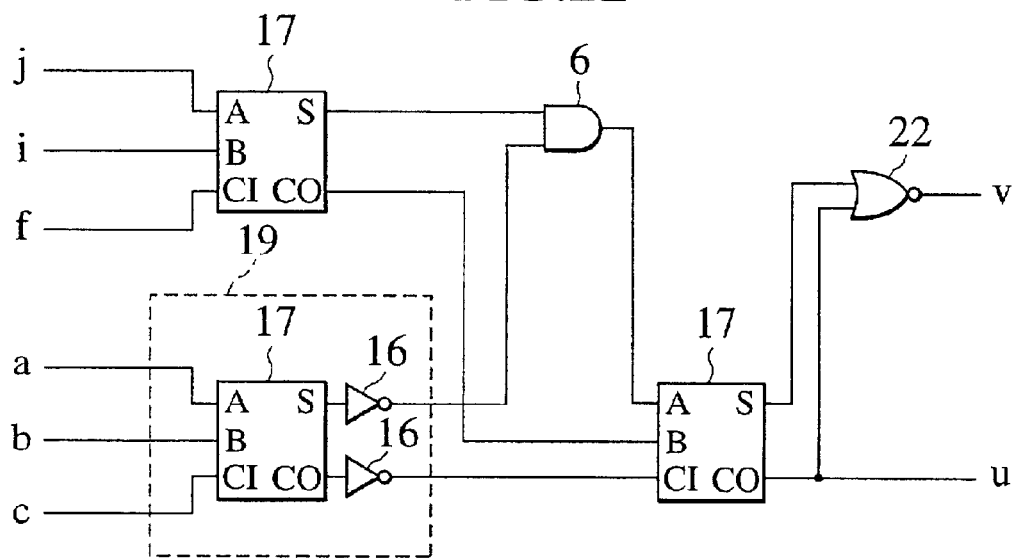
FIG. 22 is a circuit diagram showing a further exemplary configuration of the overflow detecting circuit in accordance with the present invention as described above.

FIG. 22 is a circuit diagram showing another exemplary configuration of the overflow detecting circuit 12 in accordance with the second embodiment of the present invention as described above. In the figure, the reference numeral 6 designates an AND gate; the reference numerals 16 designate inverters; the reference numerals 17 designate full adder circuits; and the reference numeral 22 designates a NOR gate.

The overflow detecting circuit as illustrated in FIG. 22 is optimized exclusively for use in the leading biquad circuit at the head of the cascade or a lone biquad circuit and applicable also for all pole filters. The overflow is detected by the use of the signal a, b, c, f, i and j without referring to other signals. Meanwhile, the circuitry 19 as illustrated within broken line in the figure is equivalent to and can be replaced by the circuitry 18 as illustrated in FIG. 5.

Figure 23:
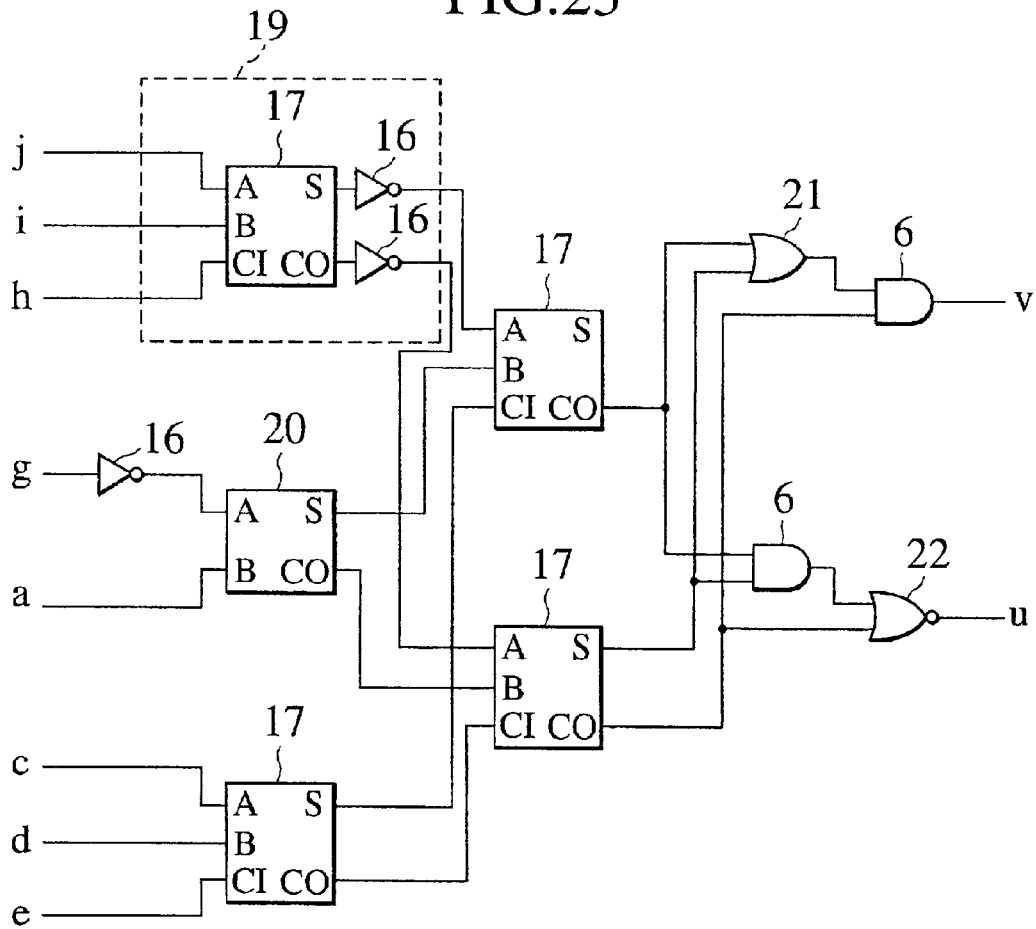
FIG. 23 is a circuit diagram showing a further exemplary configuration of the overflow detecting circuit in accordance with the present invention as described above.

FIG. 23 is a circuit diagram showing a further exemplary configuration of the overflow detecting circuit 12 in accordance with the second embodiment of the present invention as described above. In the figure, the reference numerals 6 designate AND gates; the reference numerals 16 designate inverters; the reference numerals 17 designate full adder circuits; the reference numeral 20 designates a half adder circuit; the reference numeral 21 designates an OR gate; and the reference numeral 22 designates a NOR gate.

The overflow detecting circuit as illustrated in FIG. 23 is optimized exclusively for use in the one-order biquad circuit at the last stage. The overflow is detected by the use of the signal a, c, d, e, g, h, i and j without referring to other signals. Meanwhile, the circuitry 19 as illustrated within broken line in the figure is equivalent to and can be replaced by the circuitry 18 as illustrated in FIG. 5.

In accordance with the present embodiment, it is possible to round off the result of the execution by inserting the adder circuit 9e as a round-off circuit and improve the accuracy of the filter function by the rounding off feature. The other constituent elements have the equivalent structures and functions of the counterparts of the previous embodiment as illustrated in FIG. 1 and are given the similar advantages.

In the case of the first and second embodiments of the present invention, it is assumed that no multiplication overflow occurs in a coefficient multiplication circuit. Overflow within a coefficient multiplication circuit can be avoided by limiting the absolute value of the coefficient to be smaller than 1 or by making use of a coefficient multiplication circuit which is particularly designed in order to handle an overflow. In what follows, description is given to some examples of digital filters which accept an absolute value of the coefficient no smaller than 1 and equipped with a coefficient multiplication circuit which is not particularly designed in order to handle overflow.

Figure 24:
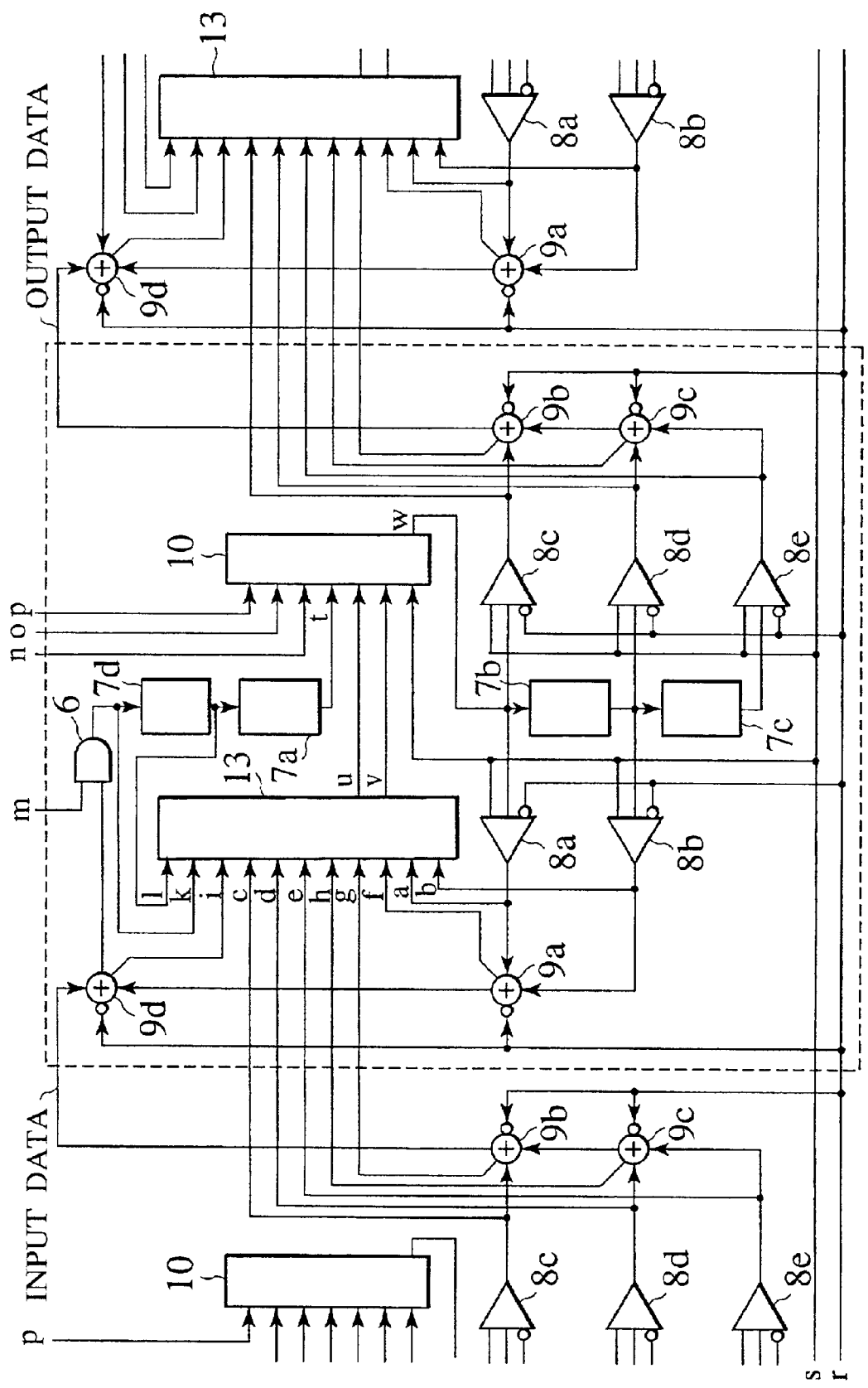
FIG. 24 is a block diagram showing the configuration of a digital filter in accordance with a third embodiment of the present invention.

FIG. 24 is a block diagram showing the configuration of a digital filter in accordance with a third embodiment of the present invention. In the figure, the digital biquad filter (inside of the broken line) is composed of an AND gate 6, shift registers 7a, 7b and 7c, 1-bit register 7d, coefficient multiplication circuits 8a, 8b, 8c, 8d and 8e, adder circuit 9a, 9b, 9c and 9d, a clipping circuit 10 and an overflow detecting circuit 13. The output signals of the coefficient multiplication circuits 8a and 8b are fed back to the adder circuit 9d and summed up again together with the input signal to this stage and therefore the coefficient multiplication circuits 8a and 8b can be called as backward coefficient multiplication circuits. Also, the output signals of the coefficient multiplication circuits 8c, 8d and 8e are summed up together and forwarded as the input signal to the adder circuit 9d at the next stage and therefore the coefficient multiplication circuits 8c, 8d and 8e can be called as forward coefficient multiplication circuits.

The clipping circuit used in the circuits can be constructed as illustrated in FIG. 30; the coefficient multiplication circuit used in the circuits can be constructed as illustrated in FIG. 31; and the adder circuit used in the circuits can be constructed as illustrated in FIG. 32. Also, the shift registers used in the circuits can be constructed as illustrated in FIG. 33.

In FIG. 24, the signals m, n, o, p, r and s are control signals which will be explained in the followings. Specific timing for the data input signal, the data output signal and the control signals depends upon the bit lengths of the respective data and the coefficient.

Figure 25:
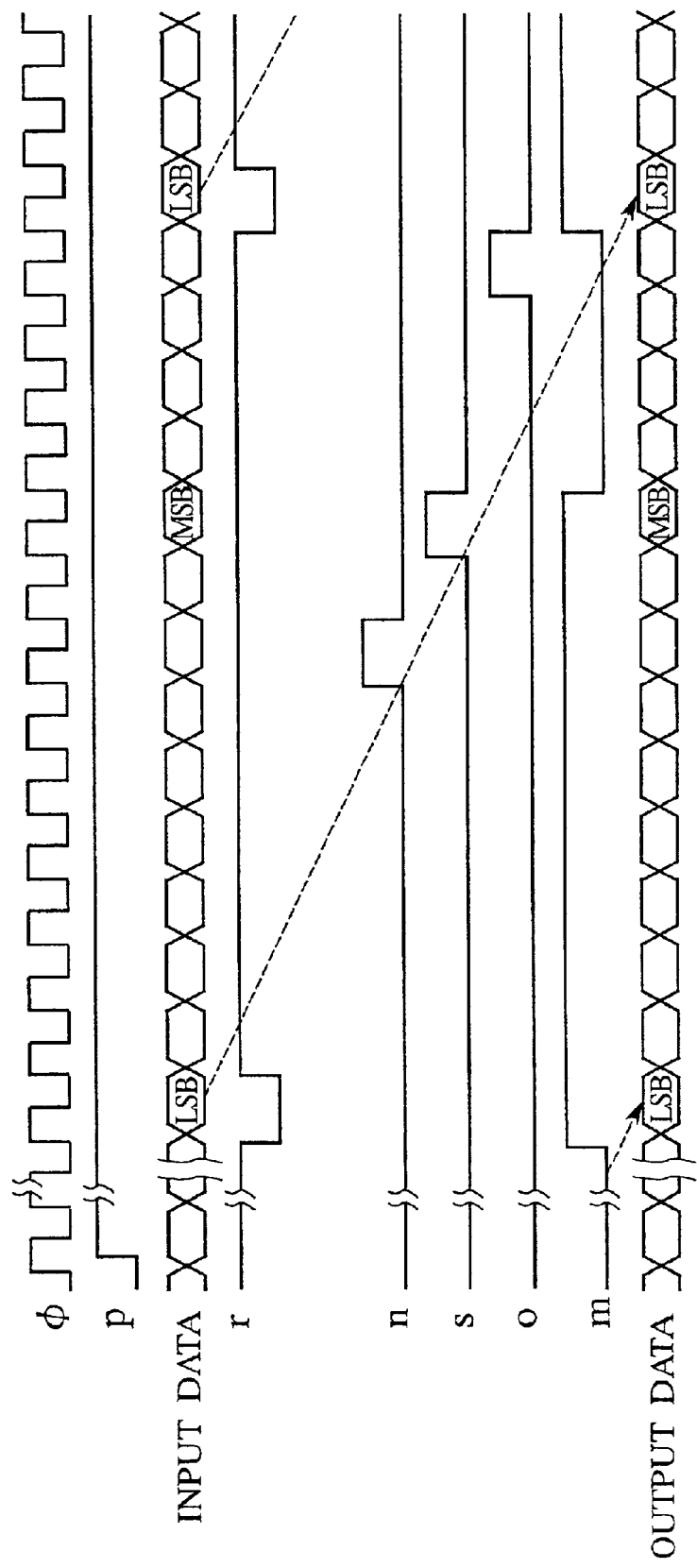
FIG. 25 is a timing chart showing the specific timing of the data input signal, the data output signal and the control signals for the third embodiment of the present invention.

FIG. 25 is a timing chart showing the specific timing of the data input signal, the data output signal and the control signals for the third embodiment of the present invention in the case where the bit length of data signals is 10 bits while the bit length of the coefficients is 6 bits. Moreover, in this case, the integer portion of the respective data signal is composed of 4 bits while the integer portion of the coefficient signals is composed of 2 bits. Both the data signals and the coefficient signals are given as fixed-point data signals with two's complement format.

Next, the operation of the third embodiment of the present invention will be explained. The circuitry as illustrated within the broken line of FIG. 24 is the digital biquad filter, also called as the biquad for short. Biquad circuits are connected in series in many cases so that some elements of a previous and a subsequent biquad circuit are illustrated in the figure.

In the biquad circuit, the output signal w of the clipping circuit 10 is multiplied by a predetermined coefficient by the coefficient multiplication circuit 8a while the output signal of the shift register 7b is multiplied by a predetermined coefficient by the coefficient multiplication circuit 8b. The output signals of the coefficient multiplication circuits 8a and 8b are added together by means of the adder circuit 9a. The output signal of the adder circuit 9a and the data input signal are added together by means of the adder circuit 9d. Furthermore, the output signal of the adder circuit 9d is logically multiplied with the control signal m by means of the AND gate 6 and input to the 1-bit register 7d. The control signal m is used to trim the output signal of the adder circuit 9d to obtain a bit sequence having the same bit length as the data. The output signal of the 1-bit register 7d is input to the shift register 7a. The output signal t of the shift register 7a is input to the clipping circuit 10. The output signal w of the clipping circuit 10, the output signal of the shift register 7b and the output signal of the shift register 7c are multiplied by predetermined coefficients respectively by means of the coefficient multiplication circuit 8c, 8d and 8e. Also, the output signals of the coefficient multiplication circuits 8d and 8e are added to each other by means of the adder circuit 9c while the output signals of the coefficient multiplication circuit 8c and the adder circuit 9c are added to each other by means of the adder circuit 9b and transferred to the next stage as the data output signal.

The clipping circuit 10 may be designed, for example, as illustrated in FIG. 30. The clipping circuit 10 serves to receive the input signal t, the positive and negative overflow detection signals u and v and the control signal n, o, p and s which are changed in accordance with the timing as illustrated in FIG. 25. By virtue of the operation of the clipping circuit 10, the signal w as output is forcibly clipped and fixed to ½ of the positive maximum value when the positive overflow is detected and to ½ of the negative maximum value when the negative overflow is detected.

The above described overflow detection signals u and v are generated by the overflow detecting circuit 13. The overflow detecting circuit 13 serves to receive, as input signals, the output signals a and b of the coefficient multiplication circuits 8a and 8b, the carry output signal f of the adder circuit 9a, the carry output signal i of the adder circuit 9d, the output signals c, d and e of the coefficient multiplication circuits 8c, 8d and 8e of the biquad circuit at the preceding stage, the carry output signals g and h of the adder circuits 9b and 9c at the preceding stage, the output signal k of the AND gate 6 and the output signal l of the 1-bit register 7d. All these input signals are decoded to generate the positive and negative overflow detection signals u and v.

Figure 26:
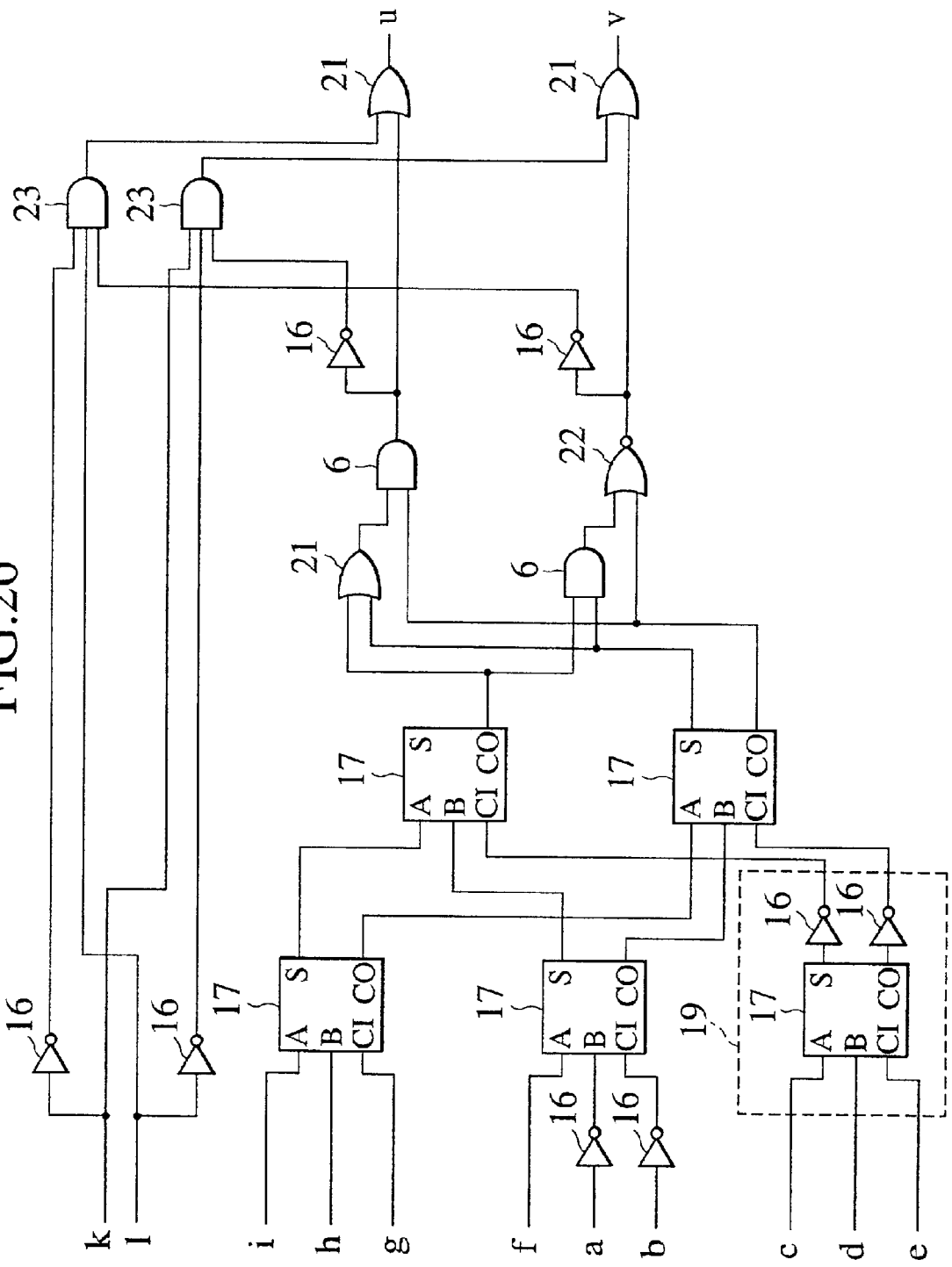
FIG. 26 is a circuit diagram showing a further exemplary configuration of the overflow detecting circuit in accordance with the present invention as described above.

FIG. 26 is a circuit diagram showing an exemplary configuration of the overflow detecting circuit 13 in accordance with the third embodiment of the present invention as described above. In the figure, the reference numerals 6 and 23 designate AND gates; the reference numerals 16 designate inverters; the reference numerals 17 designate full adder circuits; the reference numerals 21 designate OR gates; and the reference numeral 22 designates a NOR gate.

The circuit as illustrated in FIG. 26 includes the entirety of the circuit as illustrated in FIG. 12. Also, the circuit as illustrated in FIG. 26 serves to perform the calculation of the circuit as illustrated in FIG. 12 with modification in accordance with the signals k and l as follows.

(a) When Z>0 in accordance with FIG. 4, u=1 and v=0.
(b) When Z<(−1) in accordance with FIG. 4, u=0 and v=1.
(c) When the above (b) is not the case and when k=0 and l=1, u=1 and v=0.
(d) When the above (a) is not the case and when k=1 and l=0, u=0 and v=1.

(e) If any one of the above four cases is not the case, u=0 and v=0.

By virtue of the operation of the circuit as illustrated in FIG. 26, it is detected that the sum as output from the adder circuit 9d exceeds ½ of the positive or negative maximum value as predetermined by the data format. Meanwhile, the circuitry 19 as illustrated within broken line in the figure is equivalent to and can be replaced by the circuitry 18 as illustrated in FIG. 5.

In the case of the embodiment as illustrated in FIG. 24, the register 7d is inserted in series with the register 7a to input the input and output signals of the register 7d to the overflow detecting circuit 13 for detecting overflow so that every signal as input to any coefficient multiplication circuit is forcibly clipped and fixed to ½ of the positive and negative maximum value by the combination of the overflow detecting circuit 13 and the clipping circuit 10. Because of this, if the absolute value of a coefficient is smaller than 2, there occurs no overflow inside of the coefficient multiplication circuit so that it is possible to prevent the digital filter from generating the overflow oscillation. Since the serially connected circuits of 1-bit register 7d and the shift register 7a can be regarded as one shift register with an intermediate tap output terminal, this combination of 7d and 7a can be replaced by a shift register which has an intermediate tap output terminal.

Figure 27:
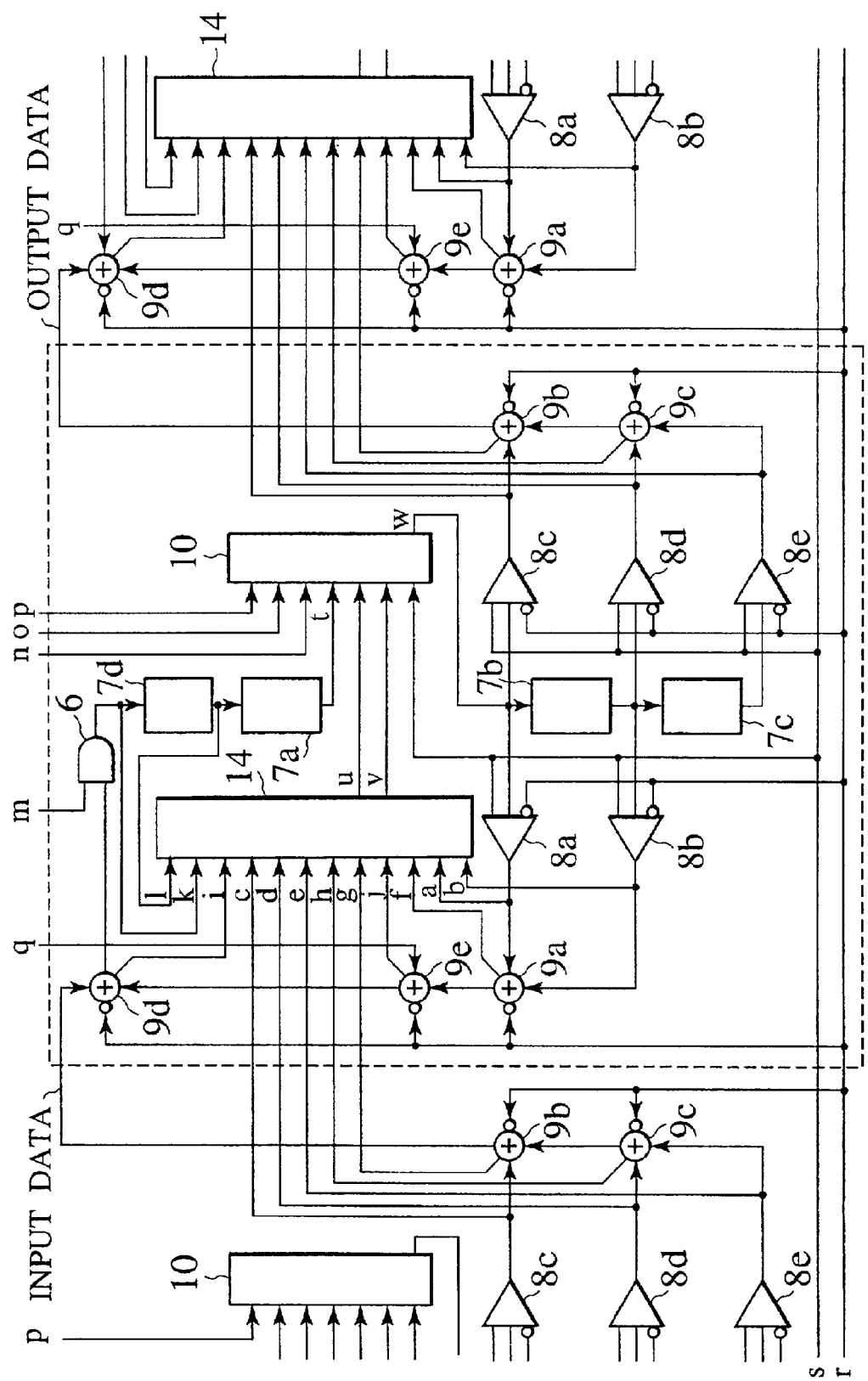
FIG. 27 is a block diagram showing the configuration of a digital filter in accordance with a fourth embodiment of the present invention.

FIG. 27 is a block diagram showing the configuration of a digital filter in accordance with a fourth embodiment of the present invention. In the figure, the digital biquad filter (inside of the broken line) is composed of an AND gate 6, shift registers 7a, 7b and 7c, 1-bit register 7d, coefficient multiplication circuits 8a, 8b, 8c, 8d and 8e, adder circuit 9a, 9b, 9c, 9d and 9e, a clipping circuit 10 and an overflow detecting circuit 14. The output signals of the coefficient multiplication circuits 8a and 8b are fed back to the adder circuit 9d and summed up again together with the input signal to this stage and therefore the coefficient multiplication circuits 8a and 8b can be called as backward coefficient multiplication circuits. Also, the output signals of the coefficient multiplication circuits 8c, 8d and 8e are summed up together and forwarded as the input signal to the adder circuit 9d at the next stage and therefore the coefficient multiplication circuits 8c, 8d and 8e can be called as forward coefficient multiplication circuits.

The clipping circuit used in the circuits can be constructed as illustrated in FIG. 30; the coefficient multiplication circuit used in the circuits can be constructed as illustrated in FIG. 31; and the adder circuit used in the circuits can be constructed as illustrated in FIG. 32. Also, the shift registers used in the circuits can be constructed as illustrated in FIG. 33.

In FIG. 27, the signals m, n, o, p, q, r and s are control signals which will be explained in the followings. Specific timing for the data input signal, the data output signal and the control signals depends upon the bit lengths of the respective data and the coefficient.

Figure 28:
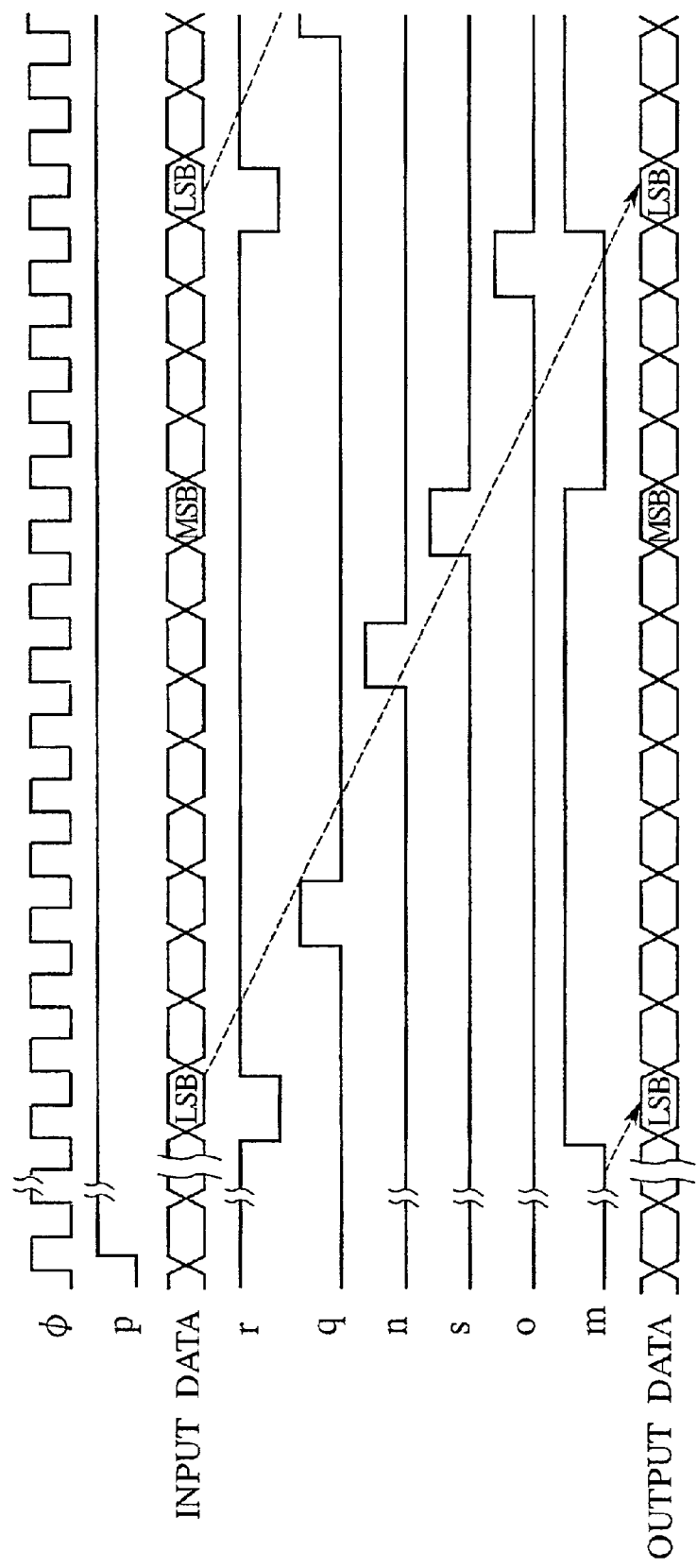
FIG. 28 is a timing chart showing the specific timing of the data input signal, the data output signal and the control signals for the fourth embodiment of the present invention.

FIG. 28 is a timing chart showing the specific timing of the data input signal, the data output signal and the control signals for the fourth embodiment of the present invention in the case where the bit length of data signals is 10 bits while the bit length of the coefficients is 6 bits. Moreover, in this case, the integer portion of the respective data signal is composed of 4 bits while the integer portion of the coefficient signals is composed of 2 bits. Both the data signals and the coefficient signals are given as fixed-point data signals with two's complement format.

Next, the operation of the digital biquad filter in accordance with the present embodiment will be explained. The circuitry as illustrated within the broken line of FIG. 27 is the digital biquad filter, also called as the biquad for short. Biquad circuits are connected in series in many cases so that some elements of a previous and a subsequent biquad circuit are illustrated in the figure.

In the biquad circuit, the output signal w of the clipping circuit 10 is multiplied by a predetermined coefficient by the coefficient multiplication circuit 8a while the output signal of the shift register 7b is multiplied by a predetermined coefficient by the coefficient multiplication circuit 8b. The output signals of the coefficient multiplication circuits 8a and 8b are added together by means of the adder circuit 9a. The output signal of the adder circuit 9a and the control signal q are added together by means of the adder circuit 9e. The control signal q is used to round off the output signal of the adder circuit 9d to the LSB. The output signal of the adder circuit 9e and the data input signal are added together by means of the adder circuit 9d. Furthermore, the output signal of the adder circuit 9d is logically multiplied with the control signal m by means of the AND gate 6 and input to the 1-bit register 7d. The control signal m is used to trim the output signal of the adder circuit 9d to obtain a bit sequence having the same bit length as the data. The output signal of the 1-bit register 7d is input to the shift register 7a. The output signal t of the shift register 7a is input to the clipping circuit 10. The output signal w of the clipping circuit 10, the output signal of the shift register 7b and the output signal of the shift register 7c are multiplied by predetermined coefficients respectively by means of the coefficient multiplication circuit 8c, 8d and 8e. Also, the output signals of the coefficient multiplication circuits 8d and 8e are added to each other by means of the adder circuit 9c while the output signals of the coefficient multiplication circuit 8c and the adder circuit 9c are added to each other by means of the adder circuit 9b and transferred to the next stage as the data output signal.

The clipping circuit 10 may be designed, for example, as illustrated in FIG. 30. The clipping circuit 10 serves to receive the input signal t, the positive and negative 11 overflow detection signals u and v and the control signal n, o, p and s which are changed in accordance with the timing as illustrated in FIG. 28. By virtue of the operation of the clipping circuit 10, the signal w as output is forcibly clipped and fixed to ½ of the positive maximum value when the positive overflow is detected and to ½ of the negative maximum value when the negative overflow is detected.

The above described overflow detection signals u and v are generated by the overflow detecting circuit 14. The overflow detecting circuit 14 serves to receive, as input signals, the output signals a and b of the coefficient multiplication circuits 8a and 8b, the carry output signal f of the adder circuit 9a, the carry output signal i of the adder circuit 9d, the carry output signal j of the adder circuit 9e, the output signals c, d and e of the coefficient multiplication circuits 8c, 8d and 8e of the biquad circuit at the preceding stage, the carry output signals g and h of the adder circuits 9b and 9c at the preceding stage, the output signal k of the AND gate 6 and the output signal l of the 1-bit register 7d. All these input signals are decoded to generate the positive and negative overflow detection signals u and v.

Figure 29:
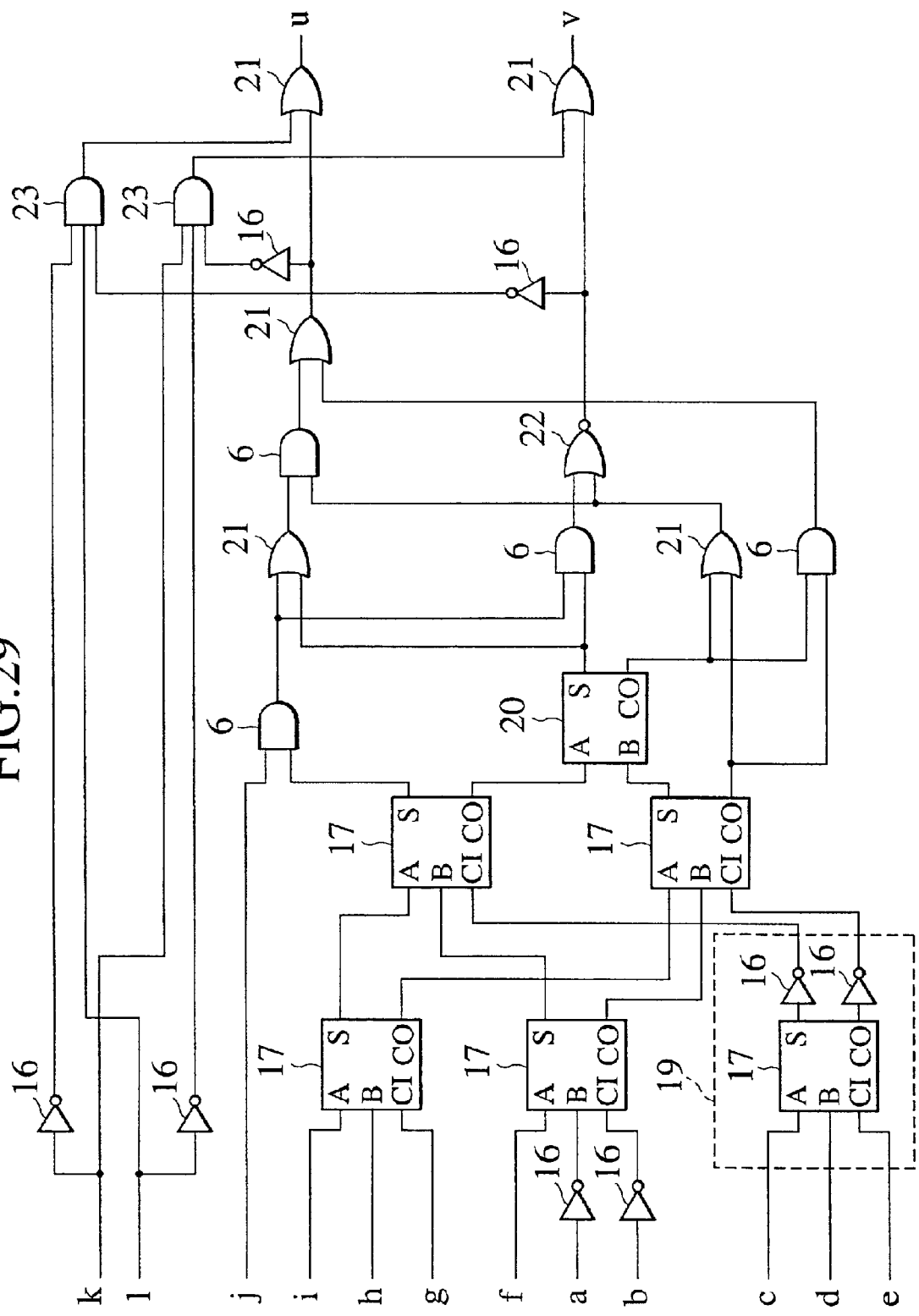
FIG. 29 is a circuit diagram showing a further exemplary configuration of the overflow detecting circuit in accordance with the present invention as described above.

FIG. 29 is a circuit diagram showing an exemplary configuration of the overflow detecting circuit 14 in accordance with the fourth embodiment of the present invention as described above. In the figure, the reference numerals 6 and 23 designate AND gates; the reference numerals 16 designate inverters; the reference numerals 17 designate full adder circuits; the reference numeral 20 designates a half adder circuit; the reference numerals 21 designate OR gates; and the reference numeral 22 designates a NOR gate.

The circuit as illustrated in FIG. 29 includes the entirety of the circuit as illustrated in FIG. 21. Also, the circuit as illustrated in FIG. 29 serves to perform the calculation of the circuit as illustrated in FIG. 21 by the use of Z corresponding to the equation [15] with modification in accordance with the signal k and l as follows.

(a) When Z>0 in accordance with equation [15], u=1 and v=0.

(b) When Z<(−1) in accordance with equation [15], u=0 and v=1.

(c) When the above (b) is not the case and when k=0 and l=1, u=1 and v=0.

(d) When the above (a) is not the case and when k=1 and l=0, u=0 and v=1.

(e) If any one of the above four cases is not the case, u=0 and v=0.

By virtue of the operation of the circuit as illustrated in FIG. 29, it is detected that the sum as output from the adder circuit 9d exceeds ½ of the positive or negative maximum value as predetermined by the data format. Meanwhile, the circuitry 19 as illustrated within broken line in the figure is equivalent to and can be replaced by the circuitry 18 as illustrated in FIG. 5.

In the case of the embodiment as illustrated in FIG. 27, the register 7d is inserted in series with the register 7a to input the input and output signals of the register 7d to the overflow detecting circuit 14 for detecting overflow so that every signal as input to any coefficient multiplication circuit is forcibly clipped and fixed to ½ of the positive and negative maximum value by the combination of the overflow detecting circuit 14 and the clipping circuit 10. Because of this, if the absolute value of a coefficient is smaller than 2, there occurs no overflow inside of the coefficient multiplication circuit so that it is possible to prevent the digital filter from generating the overflow oscillation. Also in accordance with the present embodiment, it is possible to round off the result of the execution by inserting the adder circuit 9e as a round-off circuit and improve the accuracy of the filter function by the rounding off feature Since the serially connected circuits of the 1-bit register 7d and the shift register 7a can be regarded as one shift register with a intermediate tap output terminal, this combination of 7d and 7a can be substituted by a shift register which has an intermediate tap output terminal.

As explained above in details, the digital filter in accordance with the present invention makes it possible to detect overflow extending beyond two or more bits and to completely prevent the digital filter from generating the overflow oscillation. For example, when the digital biquad filter in accordance with the present invention is applied to the audio processing circuit of a telephone system, it is possible to suppress the noise caused by overflow oscillations.

The embodiment was chosen in order to explain most clearly the principles of the invention and its practical application thereby to enable others in the art to utilize most effectively the invention in various embodiments and with various modifications as are suited to the particular use contemplated. For example, while the four embodiments as described above are implemented with biquad circuits capable of processing serial operations, it is possible to apply the present invention to circuits capable of parallel operations equipped with a clipping circuit designed in a parallel processing circuit capable of preventing the digital filter from generating the overflow oscillation. Also, while the clipping circuits serve to clip the bit length of the data to the positive or negative maximum value or a half thereof, it is possible to design a clipping circuit capable of clipping the bit length of the data to the positive or negative maximum value divided by 2 raised to the n-th power, i.e., ¼, ⅛ and so forth by adjusting the timing of the control signal n as illustrated in FIG. 2, FIG. 20, FIG. 25 and FIG. 28.

What is claimed is:

1. A digital filter having a plurality of digital filter elements which are connected to each other in series, each digital filter element comprising:

at least one forward coefficient multiplication circuit;

at least one backward coefficient multiplication circuit;

an adder logic circuit which performs an addition operation of an input signal and an output signal of said backward coefficient multiplication circuit;

a storage circuit which serves to store an output signal of said adder logic circuit;

an overflow detecting circuit which receives the output signal of said backward coefficient multiplication circuit, an output signal of the forward coefficient multiplication circuit in the preceding stage and all of the carry signals to the MSB(most significant bit)s from adjacent lower bits in summation of the output signals of said backward and forward coefficient multiplication circuits in the current and preceding stages respectively and which serves to detect an overflow occurring in the output signal of said adder logic circuit; and a clipping circuit connected to said storage circuit in order to clip an output signal of said storage circuit to either a positive or negative predetermined fixed value and output the clipped value in accordance with an output signal of said overflow detecting circuit.

2. The digital filter as claimed in claim 1 wherein said overflow detecting circuit comprises:

a logical inversion circuit which serves to perform logical inversion of said output signals of the backward and forward coefficient multiplication circuits;

an adder logic circuit which serves to sum up an output signal of said logical inversion circuit and said carry signals; and a decoding circuit which serves to decode an output signal of said adder logic circuit.

3. The digital filter as claimed in claim 1 wherein said overflow detecting circuit comprises:

a logical inversion circuit which serves to perform logical inversion of said carry signals;

an adder logic circuit which serves to sum up an output signal of said logical inversion circuit and said output signals of the backward and forward coefficient multiplication circuits; and a decoding circuit which serves to decode an output signal of said adder logic circuit.

4. The digital filter as claimed in claim 1 wherein said clipping circuit comprises:

a data input terminal;

a data output terminal;

first and second overflow detection signal input terminals through which are input the output signals of said overflow detecting circuit;

first and second control signal input terminals through which timing signals are input;

a first storage circuit which serves to store an output signal of said clipping circuit; and a second storage circuit which serves to store an internal signal of said clipping circuit, wherein, said clipping circuit serves to save an input signal given through said data input terminal in said first storage circuit when the overflow detection signals indicate no overflow while the timing signal input to said first control terminal is activated, to save 1 in said first storage circuit when the overflow detection signals indicate a positive overflow while the timing signal input to said first control terminal is activated, and to save 0 in said first storage circuit when the overflow detection signals indicate a negative overflow while the timing signal input to said first control terminal is activated, and wherein, said clipping circuit serves to save 0 in said second storage circuit when the overflow detection signals indicate no overflow while the timing signal input to said first control terminal is activated, to save 1 in said second storage circuit when the overflow detection signals indicate a positive or negative overflow while the timing signal input to said first control terminal is activated, and to perform logical inversion of the value as saved in said first storage circuit when 1 is stored in said second storage circuit while the timing signal input to said second control terminal is activated.

5. The digital filter as claimed in claim 1 wherein said overflow detecting circuit comprises:

first through fourth carry signal input terminals;

first through fifth sign input terminals;

first and second overflow detection signal output terminals;

first through fifth inverters having input terminals connected respectively to said first through fifth sign input terminals;

first through third full adder circuits having input terminals connected respectively to said first through fourth carry signal input terminals and to output terminals of said first through fifth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits;

a sixth full adder circuit which is connected to said fourth and fifth full adder circuits and receives output signals of said fourth full adder circuit and sum output signal of said fifth full adder circuit;

a seventh full adder circuit which is connected to said fifth and sixth full adder circuits and receives output signals of said sixth full adder circuit and carry output signal of said fifth full adder circuit; and a decoder which serves to generate overflow detection signals u and v by the use of the sum output signal (/Z0) of said fourth full adder circuit, the sum output signal (/Z1) of said sixth full adder circuit and the sum output signal (Z2) and the carry output signal (/Z3) of said seventh full adder circuit in accordance with the logic equation u=/Z3∧(Z2∨Z1∨Z0) and v=Z3∧(/Z2∨/Z1∨/Z0) and output the overflow detection signals u and v respectively through said first and second overflow detection signal output terminals.

6. The digital filter as claimed in claim 1 wherein said overflow detecting circuit comprises:

first through fourth carry signal input terminals;

first through fifth sign input terminals;

first and second overflow detection signal output terminals;

first and second inverters having input terminals connected respectively to said first and second sign input terminals;

first and second full adder circuits having input terminals connected respectively to said first through fourth carry signal input terminals and output terminals of said first and second inverters;

a third full adder circuit having input terminals connected respectively to said third through fifth sign input terminals;

a third inverter having an input terminal connected to said third full adder circuit and receives a sum output signal of said third full adder circuit;

a fourth inverter having an input terminal connected to said third full adder circuit and receives a carry output signal of said third full adder circuit;

a fourth full adder circuit which is connected to said first and second full adder circuits and said third inverter and receives sum output signals of said first and second full adder circuits and an output signal of said third inverter;

a fifth full adder circuit which is connected to said first and second full adder circuits and said fourth inverter and receives carry output signals of said first and second full adder circuits and an output signal of said fourth inverter;

a sixth full adder circuit which is connected to said fourth and fifth full adder circuits and receives output signals of said fourth full adder circuit and a sum output signal of said fifth full adder circuit;

a seventh full adder circuit which is connected to said fifth and sixth full adder circuits and receives a carry output signal of said fifth full adder circuit and output signals of said sixth full adder circuit; and a decoder which serves to generate overflow detection signals u and v by the use of the sum output signal (/Z0) of said fourth full adder circuit, the sum output signal (/Z1) of said sixth full adder circuit and the sum output signal (Z2) and the carry output signal (/Z3) of said seventh full adder circuit in accordance with the logic equation u=/Z3∧(Z2∨Z1∨Z0) and v=Z3∧(/Z2∨/Z1∨/Z0) and output the overflow detection signals u and v respectively through said first and second overflow detection signal output terminals.

7. The digital filter as claimed in claim 1 wherein said overflow detecting circuit comprises:

first through fourth carry signal input terminals;

first through fifth sign input terminals;

first and second overflow detection signal output terminals;

first through fourth inverters having input terminals connected respectively to said first through fourth carry signal input terminals;

first through third full adder circuits having input terminals connected respectively to said first through fifth sign input terminals and to output terminals of said first through fourth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits;

a first half adder circuit which is connected to said fourth and fifth full adder circuits and receives a carry output signal of said fourth full adder circuit and a sum output signal of said fifth full adder circuit;

a second half adder circuit which is connected to said first half adder circuit and said fifth full adder circuit and receives a carry output signal of said first half adder circuit and a carry output signal of said fifth full adder circuit;

a subtraction circuit which serves to subtract, from the numerical value 4 (binary expression: 0100), the numerical value represented by a binary number consisting of a sum output signal (S0') of said fourth full adder circuit as a 0th bit, a sum output signal (S1') of said first half adder circuit as a 1st bit, a sum output signal (S2') of said second half adder circuit as a 2nd bit and a carry output signal (S3') of said second half adder circuit as a 3rd bit to generate the subtraction result of 4 bits (Z3, Z2, Z1 and Z0); and a decoder which serves to generate overflow detection signals u and v by the use of the output signal of said subtraction circuit in accordance with the logic equation $u = /Z3 \land (Z2 \lor Z1 \lor Z0)$ and $v = Z3 \land (/Z2 \lor /Z1 \lor /Z0)$ and output the overflow detection signals u and v respectively through said first and second overflow detection signal output terminals.

8. The digital filter as claimed in claim 1 wherein said overflow detecting circuit comprises:

first through fourth carry signal input terminals;

first through fifth sign input terminals;

first and second overflow detection signal output terminals;

a first inverter having an input terminal connected to said fourth carry signal input terminal;

a first full adder circuit having input terminals connected respectively to said first through third carry signal input terminals;

second and third full adder circuits having input terminals connected respectively to said first through fifth sign input terminals and to an output terminal of said first inverter;

a second inverter having an input terminal connected to said first full adder, circuit and receives a sum output signal of said first full adder circuit;

a third inverter having an input terminal connected to said first full adder circuit and receives a carry output signal of said first full adder circuit;

a fourth full adder circuit which is connected to said second and third full adder circuits and said second inverter and receives a sum output signals of said second and third full adder circuits and an output signal of said second inverter;

a fifth full adder circuit which is connected to said second and third full adder circuits and said third inverter and receives a carry output signal of said second and third full adder circuits and an output signal of said third inverter;

a first half adder circuit which is connected to said fourth and fifth full adder circuits and receives a carry output signal of said fourth full adder circuit and a sum output signal of said fifth full adder circuit;

a second half adder circuit which is connected to said first half adder circuit and said fifth full adder circuit and receives a carry output signal of said first half adder circuit and a carry output signal of said fifth full adder circuit;

a subtraction circuit which serves to subtract, from the numerical value 4 (binary expression: 0100), the numerical value represented by a binary number consisting of a sum output signal (S0') of said fourth full adder circuit as a 0th bit, a sum output signal (S1') of said first half adder circuit as a 1st bit, a sum output signal (S2') of said second half adder circuit as a 2nd bit and a carry output signal (S3') of said second half adder circuit as a 3rd bit to generate the subtraction result of 4 bits (Z3, Z2, Z1 and Z0); and a decoder which serves to generate overflow detection signals u and v by the use of the output signal of said subtraction circuit in accordance with the logic equation $u = /Z3 \land (Z2 \lor Z1 \lor Z0)$ and $v = Z3 \land (/Z2 \lor /Z1 \lor /Z0)$ and output the overflow detection signals u and v respectively through said first and second overflow detection signal output terminals.

9. The digital filter as claimed in claim 1 wherein said overflow detecting circuit comprises:

first through fourth carry signal input terminals;

first through fifth sign input terminals;

first and second overflow detection signal output terminals;

first through fifth inverters having input terminals connected respectively to said first through fifth sign input terminals;

first through third full adder circuits having input terminals connected respectively to said first through fourth carry signal input terminals and an output terminals of said first through fifth inverters;

a fourth full adder circuit which is connected to said first through third full adder circuits and receives a sum output signals of said first through third full adder circuits;

a fifth full adder circuit which is connected to said first through third full adder circuits and receives a carry output signals of said first through third full adder circuits;

a first half adder circuit which is connected to said fourth and fifth full adder circuits and receives a carry output signal of said fourth full adder circuit and a sum output signal of said fifth full adder circuit;

a second half adder circuit which is connected to said first half adder circuit and said fifth full adder circuit and receives a carry output signal of said first half adder circuit and a carry output signal of said fifth full adder circuit; and a decoder which serves to generate overflow detection signals u and v by the use of a sum output signal (S1) of said first half adder circuit and a sum output signal (S2) and the carry output signal (S3) of said second half adder circuit in accordance with the logic equation $u = S3 \lor (S2 \land S1)$ and $v = /S3 \land /S2$ and output the overflow detection signals u and v respectively through said first and second overflow detection signal output terminals.

10. The digital filter as claimed in claim 1 wherein said overflow detecting circuit comprises:
- first through fourth carry signal input terminals;
- first through fifth sign input terminals;
- first and second overflow detection signal output terminals;
- first and second inverters having input terminals connected respectively to said first and second sign input terminals;
- first and second full adder circuits having input terminals connected respectively to said first through fourth carry signal input terminals and an output terminals of said first and second inverters;
- a third full adder circuit having input terminals connected respectively to said third through fifth sign input terminals;
- a third inverter having an input terminal connected to said third full adder circuit and receives a sum output signal of said third full adder circuit;
- a fourth inverter having an input terminal connected to said third full adder circuit and receives a carry output signal of said third full adder circuit;
- a fourth full adder circuit which is connected to said first and second full adder circuits and said third inverter and receives a sum output signals of said first and second full adder circuits and an output signal of said third inverter;
- a fifth full adder circuit which is connected to said first and second full adder circuits and said fourth inverter and receives a carry output signals of said first and second full adder circuits and an output signal of said fourth inverter;
- a first half adder circuit which is connected to said fourth and fifth full adder circuits and receives a carry output signal of said fourth full adder circuit and a sum output signal of said fifth full adder circuit;
- a second half adder circuit which is connected to said first half adder circuit and said fifth full adder circuit and receives a carry output signal of said first half adder circuit and a carry output signal of said fifth full adder circuit; and
- a decoder which serves to generate overflow detection signals u and v by the use of a sum output signal (S1) of said first half adder circuit and the sum output signal (S2) and a carry output signal (S3) of said second half adder circuit in accordance with the logic equation $u = S3 \lor (S2 \land S1)$ and $v = /S3 \land S2$ and output the overflow detection signals u and v respectively through said first and second overflow detection signal output terminals.

11. The digital filter as claimed in claim 1 wherein said overflow detecting circuit comprises:
- first through fourth carry signal input terminals;
- first through fifth sign input terminals;
- first and second overflow detection signal output terminals;
- first through fourth inverters having input terminals connected respectively to said first through fourth carry signal input terminals;
- first through third full adder circuits having input terminals connected respectively to said first through fifth sign input terminals and an output terminals of said first through fourth inverters;
- a fourth full adder circuit which is connected to said first through third full adder circuits and receives a sum output signals of said first through third full adder circuits;
- a fifth full adder circuit which is connected to said first through third full adder circuits and receives a carry output signals of said first through third full adder circuits;
- a first half adder circuit which is connected to said fourth and fifth full adder circuits and receives a carry output signal of said fourth full adder circuit and a sum output signal of said fifth full adder circuit;
- a second half adder circuit which is connected to said first half adder circuit and said fifth full adder circuit and receives a carry output signal of said first half adder circuit and a carry output signal of said fifth full adder circuit; and
- a decoder which serves to generate overflow detection signals u and v by the use of a sum output signal (S1') of said first half adder circuit and a sum output signal (S2') and a carry output signal (S3') of said second half adder circuit in accordance with the logic equation $u = /S3' \land /S2'$ and $v = S3' \lor (S2' \land S1')$ and output the overflow detection signals u and v respectively through said first and second overflow detection signal output terminals.

12. The digital filter as claimed in claim 1 wherein said overflow detecting circuit comprises:
- first through fourth carry signal input terminals;
- first through fifth sign input terminals;
- first and second overflow detection signal output terminals;
- a first inverter having an input terminal connected to said fourth carry signal input terminal;
- a first full adder circuit having input terminals connected respectively to said first through third carry signal input terminals;
- second and third full adder circuits having input terminals connected respectively to said first through fifth sign input terminals and to an output terminal of said first inverter;
- a second inverter having an input terminal connected to said first full adder circuit and receives a sum output signal of said first full adder circuit;
- a third inverter having an input terminal connected to said first full adder circuit and receives a carry output signal of said first full adder circuit;
- a fourth full adder circuit which is connected to said second and third full adder circuits and said second inverter and receives a sum output signals of said second and third full adder circuits and an output signal of said second inverter;
- a fifth full adder circuit which is connected to said second and third full adder circuits and said third inverter and receives a carry signals of said second and third full adder circuits and an output signal of said third inverter;
- a first half adder circuit which is connected to said fourth and fifth full adder circuits and receives a carry output signal of said fourth full adder circuit and a sum output signal of said fifth full adder circuit;
- a second half adder circuit which is connected to said first half adder circuit and said fifth full adder circuit and receives a carry output signal of said first half adder circuit and a carry output signal of said fifth full adder circuit; and
- a decoder which serves to generate overflow detection signals u and v by the use of a sum output signal (S1')

of said first half adder circuit and a sum output signal (S2') and a carry output signal (S3') of said second half adder circuit in accordance with the logic equation $u=/S3' \land /S2'$ and $v=S3' \land (S2' \land S1')$ and output the overflow detection signals u and v respectively through said first and second overflow detection signal output terminals.

13. The digital filter as claimed in claim 1 wherein said overflow detecting circuit comprises:

first through fourth carry signal input terminals;

first through fifth sign input terminals;

first and second overflow detection signal output terminals;

first through fifth inverters having input terminals connected respectively to said first through fifth sign input terminals;

first through third full adder circuits having input terminals connected respectively to said first through fourth carry signal input terminals and output terminals of said first through fifth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits; and a decoder which serves to generate overflow detection signals u and v by the use of a carry output signal (P1A) of said fourth full adder circuit and a sum output signal (P1B) and a carry output signal (P2) of said fifth full adder circuit in accordance with the logic equation $u=P2 \land (P1B \lor P1A)$ and $v=/P2 \land (/P1B \lor /P1A)$ and output the overflow detection signals u and v respectively through said first and second overflow detection signal output terminals.

14. The digital filter as claimed in claim 1 wherein said overflow detecting circuit comprises:

first through fourth carry signal input terminals;

first through fifth sign input terminals;

first and second overflow detection signal output terminals;

first and second inverters having input terminals connected respectively to said first and second sign input terminals;

first and second full adder circuits having input terminals connected respectively to said first through fourth carry signal input terminals and output terminals of said first and second inverters;

a third full adder circuit having input terminals connected respectively to said third through fifth sign input terminals;

a third inverter having an input terminal connected to said third full adder circuit and receives a sum output signal of said third full adder circuit;

a fourth inverter having an input terminal connected to said third full adder circuit and receives a carry output signal of said third full adder circuit;

a fourth full adder circuit which is connected to said first and second full adder circuits and said third inverter and receives a sum output signals of said first and second full adder circuits and an output signal of said third inverter;

a fifth full adder circuit which is connected to said first and second full adder circuits and said fourth inverter and receives carry output signals of said first and second full adder circuits and an output signal of said fourth inverter; and a decoder which serves to generate overflow detection signals u and v by the use of a carry output signal (P1A) of said fourth full adder circuit and a sum output signal (P1B) and a carry output signal (P2) of said fifth full adder circuit in accordance with the logic equation $u=P2 \land (P1B \lor P1A)$ and $v=/P2 \land (/P1B \lor /P1A)$ and output the overflow detection signals u and v respectively through said first and second overflow detection signal output terminals.

15. The digital filter as claimed in claim 1 wherein said overflow detecting circuit comprises:

first through fourth carry signal input terminals;

first through fifth sign input terminals;

first and second overflow detection signal output terminals;

first through fourth inverters having input terminals connected respectively to said first through fourth carry signal input terminals;

first through third full adder circuits having input terminals connected respectively to said first through fifth sign input terminals and output terminals of said first through fourth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits; and a decoder which serves to generate overflow detection signals u and v by the use of a carry output signal (P1A') of said fourth full adder circuit and a sum output signal (P1B') and a carry output signal (P2') of said fifth full adder circuit in accordance with the logic equation $u=/P2' \land (/P1B' \lor /P1A')$ and $v=P2' \land (P1B' \lor P1A')$ and output the overflow detection signals u and v respectively through said first and second overflow detection signal output terminals.

16. The digital filter as claimed in claim 1 wherein said overflow detecting circuit comprises:

first through fourth carry signal input terminals;

first through fifth sign input terminals;

first and second overflow detection signal output terminals;

a first inverter having an input terminal connected to said fourth carry input terminal;

a first full adder circuit having input terminals connected respectively to said first through third carry signal input terminals;

second and third full adder circuits having input terminals connected respectively to said first through fifth sign input terminals and to an output terminal of said first inverter;

a second inverter having an input terminal connected to a sum output terminal of said first full adder circuit;

a third inverter having an input terminal connected to a carry output terminal of said first full adder circuit;

a fourth full adder circuit which is connected to said second and third full adder circuits and said second inverter and receives sum output signals of said second and third full adder circuits and an output signal of said second inverter;

a fifth full adder circuit which is connected to said second and third full adder circuits and said third inverter and receives carry output signals of said second and third full adder circuits and an output signal of said third inverter; and a decoder which serves to generate overflow detection signals u and v by the use of a carry output signal (P1A') of said fourth full adder circuit and a sum output signal (P1B') and a carry output signal (P2') of said fifth full adder circuit in accordance with the logic equation u=/P2'∧(/P1B'∨/P1A') and v=P2'∧(P1B'∨P1A') and output the overflow detection signals u and v respectively through said first and second overflow detection signal output terminals.

17. The digital filter as claimed in claim 1 wherein said overflow detecting circuit comprises:

first and second carry signal input terminals;

first through third sign input terminals;

first and second overflow detection signal output terminals;

first through third inverters having input terminals connected respectively to said first through third sign input terminals;

a first full adder circuit;

a half adder circuit, and said half adder circuit and said first full adder circuit have input terminals connected respectively to said first and second carry signal input terminals and output terminals of said first through third inverters;

an AND gate which is connected to said half adder circuit and said first full adder circuit and receives a sum output signal of said half adder circuit and a sum output signal of said first full adder circuit;

a second full adder circuit which is connected to said AND gate, said half adder circuit and said first full adder circuit, receives an output signal of said AND gate a carry output signal of said half adder circuit and a carry output signal of said first full adder circuit and serves to output a carry output signal to said first overflow detection signal output terminal; and a NOR gate which is connected to said second full adder circuit, receives a sum output signal and the carry output signal of said second full adder circuit and serves to output a signal through said second overflow detection signal output terminal.

18. The digital filter as claimed in claim 1 wherein said overflow detecting circuit comprises:

first and second carry signal input terminals;

first through third sign input terminals;

first and second overflow detection signal output terminals;

a half adder circuit having input terminals connected respectively to said first and second carry signal input terminals;

a first full adder circuit having input terminals connected respectively to said first through third sign input terminals;

a first inverter having an input terminal connected to a sum output terminal of said first full adder circuit;

a second inverter having an input terminal connected to a carry output terminal of said first full adder circuit;

an AND gate having input terminals connected to a sum output signal of said half adder circuit and an output signal of said first inverter;

a second full adder circuit which is connected to said AND gate, said half adder circuit and said second inverter, receives an output signal of said AND gate, a carry output signal of said half adder circuit and an output signal of said second inverter and outputs a carry output signal to said first overflow detection signal output terminal; and a NOR gate which is connected to said second full adder circuit, receives a sum output signal and the carry output signal of said second full adder circuit and serves to output a signal through said second overflow detection signal output terminal.

19. The digital filter as claimed in claim 1 wherein said overflow detecting circuit comprises:

first and second carry signal input terminals;

first through third sign input terminals;

first and second overflow detection signal output terminals;

first and second inverters having input terminals connected respectively to said first and second carry signal input terminals;

a first full adder circuit;

a half adder circuit, and said half adder circuit and said first full adder circuit have input terminals connected respectively to said first and second inverters and said first through third sign input terminals and receives an output signal of said first and second inverters and sign input signals through said first through third sign input terminals;

an AND gate which is connected to said half adder circuit and said first full adder circuit and receives a sum output signal of said half adder circuit and a sum output signal of said first full adder circuit;

a second full adder circuit which is connected to said AND gate, said half adder circuit and said first full adder circuit, receives an output signal of said AND gate, a carry output signal of said half adder circuit and a carry output signal of said first full adder circuit and serves to output a carry output signal to said second overflow detection signal output terminal; and a NOR gate which is connected to said second full adder circuit, receives a sum output signal and a carry output signal of said second full adder circuit and serves to output a signal through said first overflow detection signal output terminal.

20. The digital filter as claimed in claim 1 wherein said overflow detecting circuit comprises:

first through third carry signal input terminals;

first through fourth sign input terminals;

first and second overflow detection signal output terminals;

first through fourth inverters having input terminals connected respectively to said first through fourth sign input terminals;

first and second full adder circuits having input terminals connected respectively to six terminals selected among from said first through third carry signal input terminals and output terminals of said first through fourth inverters;

a third full adder circuit having input terminals connected respectively to the sum output terminals of said first and second full adder circuits and an output terminal of said first through third carry signal input terminals and first through fourth inverters that is not connected to said first or second full adder circuits;

a fourth full adder circuit which is connected to said first through third full adder circuits and receives carry output signals of said first through third full adder circuits; and a decoder which serves to generate overflow detection signals u and v by the use of a sum output signal (S0) of said third full adder circuit and a sum output signal (S1) and a carry output signal (S2) of said fourth full adder circuit in accordance with the logic equation $u=S2 \land (S1 \lor S0)$ and $v=/S2 \land (/S1 \lor /S0)$ and output the overflow detection signals u and v respectively through said first and second overflow detection signal output terminals.

21. The digital filter as claimed in claim 1 wherein said overflow detecting circuit comprises:

first through third carry signal input terminals;

first through fourth sign input terminals;

first and second overflow detection signal output terminals;

a first inverter having an input terminal connected to said first sign input terminal;

a first full adder circuit having input terminals connected respectively to said first through third carry signal input terminals;

a second full adder circuit having input terminals connected respectively to said second through fourth sign input terminals;

a second inverter having an input terminal connected to a sum output terminal of said second full adder circuit;

a third inverter having an input terminal connected to a carry output terminal of said second full adder circuit;

a third full adder circuit which is connected to said first full adder circuit and said first and second inverters and receives a sum output signal of said first full adder circuit and output signals of said first and second inverters;

a fourth full adder circuit which is connected to said third inverter and said first and third full adder circuits and receives an output signal of said third inverter and the carry output signals of said first and third full adder circuits; and a decoder which serves to generate overflow detection signals u and v by the use of a sum output signal (S0) of said third full adder circuit and a sum output signal (S1) and a carry output signal (S2) of said fourth full adder circuit in accordance with the logic equation $u=S2 \land (S1 \lor S0)$ and $v=/S2 \land (/S1 \lor /S0)$ and output the overflow detection signals u and v respectively through said first and second overflow detection signal output terminals.

22. The digital filter as claimed in claim 1 wherein said overflow detecting circuit comprises:

first through third carry signal input terminals;

first through fourth sign input terminals;

first and second overflow detection signal output terminals;

first through third inverters having input terminals connected respectively to said first through third carry signal input terminals;

first and second full adder circuits having input terminals connected respectively to six terminals selected among from said first through fourth sign input terminals and output terminals of said first through third inverters;

a third full adder circuit having input terminals connected respectively to sum output terminals of said first and second full adder circuits and the terminal that is one of said first through fourth sign input terminals and output terminals of said first through third inverters and that is not connected to said first or second full adder circuits;

a fourth full adder circuit which is connected to said first through third full adder circuits and receives carry output signals of said first through third full adder circuits; and a decoder which serves to generate overflow detection signals u and v by the use of a sum output signal (S0') of said third full adder circuit and a sum output signal (S1') and a carry output signal (S2') of said fourth full adder circuit in accordance with the logic equation $u=/S2' \land (/S1' \lor /S0')$ and $v=S2' \land (S1' \lor S0')$ and output the overflow detection signals u and v respectively through said first and second overflow detection signal output terminals.

23. The digital filter as claimed in claim 1 wherein said overflow detecting circuit comprises:

first through third carry signal input terminals;

first through fourth sign input terminals;

first and second overflow detection signal output terminals;

a first full adder circuit having input terminals connected respectively to said first through third carry signal input terminals;

a second full adder circuit having input terminals connected respectively to said second through fourth sign input terminals;

a first inverter having an input terminal connected to a sum output terminal of said first full adder circuit;

a second inverter having an input terminal connected to a carry output terminal of said first full adder circuit;

a third full adder circuit which is connected respectively to said second full adder circuit, said first sign input terminal and said first inverter and receives a sum output signal of said second full adder circuit, a sign input signal through said first sign input terminal and a output signal of said first inverter;

a fourth full adder circuit which is connected to said second and third full adder circuits and said second inverter and receives carry output signals of said second and third full adder circuits and an output signal of said second inverter; and a decoder which serves to generate overflow detection signals u and v by the use of a sum output signal (S0') of said third full adder circuit and a sum output signal (S1') and a carry output signal (S2') of said fourth full adder circuit in accordance with the logic equation $u=/S2' \land (/S1' \lor /S0')$ and $v=S2' \land (S1' \lor S0')$ and output the overflow detection signals u and v respectively through said first and second overflow detection signal output terminals.

24. The digital filter as claimed in claim 1 wherein said overflow detecting circuit comprises:

first through fifth carry signal input terminals;

first through fifth sign input terminals;

first and second overflow detection signal output terminals;

first through fifth inverters having input terminals connected respectively to said first through fifth sign input terminals;

first through third full adder circuits having input terminals connected respectively to said second through fifth carry signal input terminals and output terminals of said first through fifth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits;

an AND gate having input terminals which are connected respectively to said first carry signal input terminal and said fourth full adder circuit and receives a carry input signal through said first carry signal input terminal and a sum output signal of said fourth full adder circuit;

a half adder circuit which is connected respectively to said fourth full adder circuit and said fifth full adder circuit and receives a carry output signal said fourth full adder circuit and a sum output signal of said fifth full adder circuit; and a decoder which serves to generate overflow detection signals u and v by the use of a output signal (P1A) of said AND gate, a sum output signal (P1B) and a carry output signal (P2A) of said half adder circuit and a carry output signal (P2B) of said fifth full adder circuit in accordance with the logic equation $u = (P2B \land P2A) \lor [(P2B \lor P2A) \land (P1B \lor P1A)]$ and $v = /P2B \land /P2A \land (/P1B \lor /P1A)$ and output the overflow detection signals u and v respectively through said first and second overflow detection signal output terminals.

25. The digital filter as claimed in claim 1 wherein said overflow detecting circuit comprises:

first through fifth carry signal input terminals;

first through fifth sign input terminals;

first and second overflow detection signal output terminals;

first and second inverters having input terminals connected respectively to said first and second sign input terminals;

first and second full adder circuits having input terminals connected respectively to said second through fifth carry signal input terminals and output terminals of said first and second inverters;

a third full adder circuit having input terminals connected respectively to said third through fifth sign input terminals;

a third inverter having an input terminal connected to a sum output terminal of said third full adder circuit;

a fourth inverter having an input terminal connected to a carry output terminal of said third full adder circuit;

a fourth full adder circuit which is connected to said first and second full adder circuits and said third inverter and receives sum output signals of said first and second full adder circuits and an output signal of said third inverter;

a fifth full adder circuit which is connected to said first and second full adder circuits and said fourth inverter and receives carry output signals of said first and second full adder circuits and an output signal of said fourth inverter;

an AND gate having input terminals which is connected respectively to said first carry signal input terminal and said fourth full adder circuit and receives a carry input signal through said first carry signal input terminal and a sum output signal of said fourth full adder circuit;

a half adder circuit which is connected respectively to said fourth full adder circuit and said fifth full adder circuit and receives a carry output signal of said fourth full adder circuit and a sum output signal of said fifth full adder circuit; and a decoder which serves to generate overflow detection signals u and v by the use of the output signal (P1A) of said AND gate, the sum output signal (P1B) and the carry output signal (P2A) of said half adder circuit and the carry output signal (P2B) of said fifth full adder circuit in accordance with the logic equation $u = (P2B \land P2A) \lor [(P2B \lor P2A) \land (P1B \lor P1A)]$ and $v = /P2B \land /P2A \land (/P1B \lor /P1A)$ and output the overflow detection signals u and v respectively through said first and second overflow detection signal output terminals.

26. The digital filter as claimed in claim 1 wherein said overflow detecting circuit comprises:

first through third carry signal input terminals;

first through third sign input terminals;

first and second overflow detection signal output terminals;

first through third inverters having input terminals connected respectively to said first through third sign input terminals;

first and second full adder circuits having input terminals connected respectively to said first through third carry signal input terminals and output terminals of said first through third inverters;

an AND gate which is connected to said first and second full adder circuits and receives sum output signals of said first and second full adder circuits;

a third full adder circuit which is connected to said AND gate and said first and second full adder circuits, receives an output signal of said AND gate and the carry output signals of said first and second full adder circuits and serves to output a carry output signal to said first overflow detection signal output terminal; and a NOR gate which is connected to said third full adder circuit, receives a sum output signal and a carry output signal of said third full adder circuit and serves to output a signal through said second overflow detection signal output terminal.

27. The digital filter as claimed in claim 1 wherein said overflow detecting circuit comprises:

first through third carry signal input terminals;

first through third sign input terminals;

first and second overflow detection signal output terminals;

a first full adder circuit having input terminals connected respectively to said first through third carry signal input terminals;

a second full adder circuit having input terminals connected respectively to said first through third sign input terminals;

a first inverter having an input terminal connected to a sum output terminal of said second full adder circuit;

a second inverter having an input terminal connected to a carry output terminal of said second full adder circuit;

an AND gate having input terminals connected to said first full adder circuit and said first inverter and receives a sum output signal of said first full adder circuit and an output signal of said first inverter;

a third full adder circuit which is connected to said AND gate, said first full adder circuit and said second inverter, receives an output signal of said AND gate, a carry output signal of said first full adder circuit and an output signal of said second inverter and outputs a carry output signal to said first overflow detection signal output terminal; and a NOR gate which is connected to said third full adder circuit, receives a sum output signal and a carry output signal of said third full adder circuit and serves to output a signal through said second overflow detection signal output terminal.

28. The digital filter as claimed in claim 1 wherein said overflow detecting circuit comprises:

first through fourth carry signal input terminals;

first through fourth sign input terminals;

first and second overflow detection signal output terminals;

first through fourth inverters having input terminals connected respectively to said first through fourth carry signal input terminals;

first and second full adder circuits;

a half adder circuit, and said half adder circuit and said first and second full adder circuits have input terminals connected respectively to said first through fourth sign input terminals and output terminals of said first through fourth inverters;

a third full adder circuit which is connected to said first and second full adder circuits and said half adder circuit and receives sum output signals of said first and second full adder circuits and a sum output signal of said half adder circuit;

a fourth full adder circuit which is connected to said first and second full adder circuits and said half adder circuit and receives carry output signals of said first and second full adder circuits and a carry output signal of said half adder circuit; and a decoder which serves to generate overflow detection signals u and v by the use of a carry output signal (P1A') of said third full adder circuit and a sum output signal (P1B') and a carry output signal (P2') of said fourth full adder circuit in accordance with the logic equation $u = /P2' \wedge (/P1B' \vee /P1A')$ and $v = P2' \wedge (P1B' \vee P1A')$ and output the overflow detection signals u and v respectively through said first and second overflow detection signal output terminals.

29. The digital filter as claimed in claim 1 wherein said overflow detecting circuit comprises:

first through fourth carry signal input terminals;

first through fourth sign input terminals;

first and second overflow detection signal output terminals;

a first inverter having an input terminal connected to said fourth carry signal input terminal;

a first full adder circuit having input terminals connected respectively to said first through third carry signal input terminals;

a second full adder circuit;

a half adder circuit, and said half adder circuit and said second full adder circuit have input terminals connected respectively to an output terminal of said first inverter and said first through fourth sign input terminals;

a second inverter having an input terminal connected to a sum output terminal of said first full adder circuit;

a third inverter having an input terminal connected to a carry output terminal of said first full adder circuit;

a third full adder circuit which is connected to said second inverter, said second full adder circuit and said half adder circuit and receives an output signal of said second inverter, a sum output signal of said second full adder circuit and a sum output signal of said half adder circuit;

a fourth full adder circuit which is connected to said half adder circuit, said second full adder circuit and said third inverter and receives a carry output signal of said half adder circuit, a carry output signal of said second full adder circuit and an output signal of said third inverter; and a decoder which serves to generate overflow detection signals u and v by the use of a carry output signal (P1A') of said third full adder circuit and a sum output signal (P1B') and an carry output signal (P2') of said fourth full adder circuit in accordance with the logic equation $u = /P2' \wedge (/P1B' \vee /P1A')$ and $v = P2' \wedge (P1B' \vee P1A')$ and output the overflow detection signals u and v respectively through said first and second overflow detection signal output terminals.

30. A digital filter having a plurality of digital filter elements which are connected to each other in series, each digital filter element comprising:

at least one forward coefficient multiplication circuit;

at least one backward coefficient multiplication circuit;

an adder logic circuit which performs an addition operation of an input signal and an output signal of said backward coefficient multiplication circuit;

a first storage circuit which serves to store the output signal of said adder logic circuit;

an overflow detecting circuit which receives the output signal of said backward coefficient multiplication circuit, an output signal of the forward coefficient multiplication circuit in the preceding stage, all of the carry signals to the MSB(most significant bit)s from adjacent lower bits in summation of the output signals of said backward and forward coefficient multiplication circuits in the current and preceding stages respectively and the input and output signals of said first storage circuit and which serves to detect an overflow occurring in the output signal of said adder logic circuit;

a second storage circuit which stores the output signal of said first storage circuit; and a clipping circuit connected to said second storage circuit in order to clip an output signal of said second storage circuit to either a positive or negative predetermined fixed value and output the clipped value in accordance with an output signal of said overflow detecting circuit.

31. The digital filter as claimed in claim 30 wherein said overflow detecting circuit comprises:

a logical inversion circuit which serves to perform logical inversion of said output signals of the backward and forward coefficient multiplication circuits;

an adder logic circuit which serves to sum up an output signal of said logical inversion circuit and said carry signals; and a decoding circuit which serves to decode an output signal of said adder logic circuit and said input and output signals of the first storage circuit.

32. The digital filter as claimed in claim 30 wherein said overflow detecting circuit comprises:
- a logical inversion circuit which serves to perform logical inversion of said carry signals;
- an adder logic circuit which serves to sum up an output signal of said logical inversion circuit and said output signals of the backward and forward coefficient multiplication circuits; and
- a decoding circuit which serves to decode an output signal of said adder logic circuit and said input and output signals of the first storage circuit.

33. The digital filter as claimed in claim 30 wherein said overflow detecting circuit comprises:
- a plurality of carry signal input terminals;
- a plurality of sign input terminals;
- first and second data bit input terminals through which first and second data bits (k,l) are received; and
- first and second overflow detection signal output terminals,
- wherein said overflow detecting circuit serves to generate internal overflow detection signals with reference to said plurality of carry signal input terminals and said plurality of sign input terminals and when overflow is detected, to output said internal overflow detection signals, and when overflow is not detected, to output, as overflow detection signals, signals indicative of a positive overflow in the case where said first data bit (k) is 0 and said second data bit (l) is 1 and signals indicative of a negative overflow in the case where said first data bit (k) is 1 and said second data bit (l) is 0.

34. The digital filter as claimed in claim 30 wherein said overflow detecting circuit comprises:
- first and second data bit input terminals through which first and second data bits are received;
- first through fourth carry signal input terminals;
- first through fifth sign input terminals;
- first through fifth inverters having input terminals connected respectively to said first through fifth sign input terminals;
- first through third full adder circuits having input terminals connected respectively to said first through fourth carry signal input terminals and output terminals of said first through fifth inverters;
- a fourth full adder circuit which is connected to said first through third full adder circuits and receives sum output signals of said first through third full adder circuits;
- a fifth full adder circuit which is connected to said first through third full adder circuits and receives carry output signals of said first through third full adder circuits;
- a decoder which serves to generate first and second output signals u and v by the use of a carry output signal (P1A) of said fourth full adder circuit and a sum output signal (P1B) and a carry output signal (P2) of said fifth full adder circuit in accordance with the logic equation $u=P2 \wedge (P1B \vee P1A)$ and $v=/P2 \wedge (/P1B \vee /P1A)$;
- a sixth inverter having an input terminal connected to said first data bit input terminal;
- a seventh inverter having an input terminal connected to said second data bit input terminal;
- an eighth inverter which is connected to said decoder and receives a first output signal of said decoder;
- a ninth inverter which is connected to said decoder and receives a second output signal of said decoder;
- a first AND gate which is connected to said sixth inverter, said second data bit input terminal and said ninth inverter and receives an output signal of said sixth inverter, an input signal through said second data bit input terminal and the output signal of said ninth inverter;
- a second AND gate which is connected to said seventh inverter, said first data bit input terminal and said eighth inverter and receives an output signal of said seventh inverter, an input signal through said first data bit input terminal and an output signal of said eighth inverter;
- a first OR gate which is connected to said first AND gate and said decoder, receives an output signal of said first AND gate and a first output signal of said decoder and outputs a positive overflow detection signal; and
- a second OR gate which is connected to said second AND gate and said decoder, receives an output signal of said second AND gate and a second output signal of said decoder and outputs a negative overflow detection signal.

35. The digital filter as claimed in claim 30 wherein said overflow detecting circuit comprises:
- first and second data bit input terminals through which first and second data bits are received;
- first through fourth carry signal input terminals;
- first through fifth sign input terminals;
- first and second inverters having input terminals connected respectively to said first and second sign input terminals;
- first and second full adder circuits having input terminals connected respectively to said first through fourth carry signal input terminals and output terminals of said first and second inverters;
- a third full adder circuit having input terminals connected respectively to said third through fifth sign input terminals;
- a third inverter having an input terminal connected to a sum output terminal of said third full adder circuit;
- a fourth inverter having an input terminal connected to a carry output terminal of said third full adder circuit;
- a fourth full adder circuit which is connected to said first and second full adder circuits and said third inverter and receives the sum output signals of said first and second full adder circuits and an output signal of said third inverter;
- a fifth full adder circuit which is connected to said first and second full adder circuits and said fourth inverter and receives carry output signals of said first and second full adder circuits and an output signal of said fourth inverter;
- a decoder which serves to generate first and second output signals u and v by the use of a carry output signal (P1A) of said fourth full adder circuit and a sum output signal (P1B) and a carry output signal (P2) of said fifth full adder circuit in accordance with the logic equation $u=P2 \wedge (P1B \vee P1A)$ and $v=/P2 \wedge (/P1B \vee /P1A)$;
- a fifth inverter having an input terminal connected to said first data bit input terminal;
- a sixth inverter having an input terminal connected to said second data bit input terminal;
- a seventh inverter which is connected to said decoder and receives a first output signal of said decoder;

an eighth inverter which is connected to said decoder and receives a second output signal of said decoder;

a first AND gate which is connected to said fifth inverter, said second data bit input terminal and said eighth inverter and receives an output signal of said fifth inverter, an input signal through said second data bit input terminal and an output signal of said eighth inverter;

a second AND gate which is connected to said sixth inverter, said first data bit input terminal and said seventh inverter and receives an output signal of said sixth inverter, an input signal through said first data bit input terminal and an output signal of said seventh inverter;

a first OR gate which is connected to said first AND gate and said decoder, receives an output signal of said first AND gate and a first output signal of said decoder and output a positive overflow detection signal; and a second OR gate which is connected to said second AND gate and said decoder, receives an output signal of said second AND gate and a second output signal of said decoder and output a negative overflow detection signal.

36. The digital filter as claimed in claim 30 wherein said overflow detecting circuit comprises:

first and second data bit input terminals through which first and second data bits are received;

first through fifth carry signal input terminals;

first through fifth sign input terminals;

first through fifth inverters having input terminals connected respectively to said first through fifth sign input terminals;

first through third full adder circuits having input terminals connected respectively to said second through fifth carry signal input terminals and output terminals of said first through fifth inverters;

a fourth full adder circuit which is connected to said first through third full adder circuits and receives sum output signals of said first through third full adder circuits;

a fifth full adder circuit which is connected to said first through third full adder circuits and receives carry output signals of said first through third full adder circuits;

a first AND gate having input terminals which is connected respectively to said first carry signal input terminal and said fourth full adder circuit and receives a carry input signal through said first carry signal input terminal and a sum output signal of said fourth full adder circuit;

a half adder circuit which is connected respectively to said fourth full adder circuit and said fifth full adder circuit and receives a carry output signal said fourth full adder circuit and a sum output signal of said fifth full adder circuit;

a decoder which serves to generate first and second output signals u and v by the use of an output signal (P1A) of said first AND gate, a sum output signal (P1B) and a carry output signal (P2A) of said half adder circuit and a carry output signal (P2B) of said fifth full adder circuit in accordance with the logic equation u=(P2B∧P2A)∨[(P2B∨P2A)∧(P1B∨P1A)] and v=/P2B∧/P2A∧(/P1B∨/P1A);

a sixth inverter having an input terminal connected to said first data bit input terminal;

a seventh inverter having an input terminal connected to said second data bit input terminal;

an eighth inverter which is connected to said decoder and receives a first output signal of said decoder;

a ninth inverter which is connected to said decoder and receives a second output signal of said decoder;

a second AND gate which is connected to said sixth inverter, said second data bit input terminal and said ninth inverter and receives an output signal of said sixth inverter, the input signal through said second data bit input terminal and an output signal of said ninth inverter;

a third AND gate which is connected to said seventh inverter, said first data bit input terminal and said eighth inverter and receives an output signal of said seventh inverter, the input signal through said first data bit input terminal and an output signal of said eighth inverter;

a first OR gate which is connected to said second AND gate and said decoder, receives an output signal of said second AND gate and a first output signal of said decoder and outputs a positive overflow detection signal; and a second OR gate which is connected to said third AND gate and said decoder, receives an output signal of said third AND gate and a second output signal of said decoder and outputs a negative overflow detection signal.

37. The digital filter as claimed in claim 30 wherein said overflow detecting circuit comprises:

first and second data bit input terminals through which first and second data bits are received;

first through fifth carry signal input terminals;

first through fifth sign input terminals;

first and second inverters having input terminals connected respectively to said first and second sign input terminals;

first and second full adder circuits having input terminals connected respectively to said second through fifth carry signal input terminals and output terminals of said first and second inverters;

a third full adder circuit having input terminals connected respectively to said third through fifth sign input terminals;

a third inverter having an input terminal connected to a sum output terminal of said third full adder circuit;

a fourth inverter having an input terminal connected to a carry output terminal of said third full adder circuit;

a fourth full adder circuit which is connected to said first and second full adder circuits and said third inverter and receives a sum output signals of said first and second full adder circuits and an output signal of said third inverter;

a fifth full adder circuit which is connected to said first and second full adder circuits and said fourth inverter and receives a carry output signals of said first and second full adder circuits and an output signal of said fourth inverter;

a first AND gate having input terminals which is connected respectively to said first carry signal input terminal and said fourth full adder circuit and receives a carry input signal through said first carry signal input terminal and a sum output signal of said fourth full adder circuit;

a half adder circuit which is connected respectively to said fourth full adder circuit and said fifth full adder circuit and receives a carry output signal of said fourth full adder circuit and a sum output signal of said fifth full adder circuit;

a decoder which serves to generate first and second output signals u and v by the use of an output signal (P1A) of said first AND gate, a sum output signal (P1B) and a carry output signal (P2A) of said half adder circuit and a carry output signal (P2B) of said fifth full adder circuit in accordance with the logic equation $u=(P2B \land P2A) \lor [(P2B \lor P2A) \land (P1B \lor P1A)]$ and $v=/P2B \land /P2A \land (/P1B \lor /P1A)$;

a fifth inverter having an input terminal connected to said first data bit input terminal;

a sixth inverter having an input terminal connected to said second data bit input terminal;

an seventh inverter which is connected to said decoder and receives a first output signal of said decoder;

a eighth inverter which is connected to said decoder and receives a second output signal of said decoder;

a second AND gate which is connected to said fifth inverter, said second data bit input terminal and said eighth inverter and receives an output signal of said fifth inverter, the input signal through said second data bit input terminal and an output signal of said eighth inverter;

a third AND gate which is connected to said sixth inverter, said first data bit input terminal and said seventh inverter and receives an output signal of said sixth inverter, the input signal through said first data bit input terminal and an output signal of said seventh inverter;

a first OR gate which is connected to said second AND gate and said decoder, receives an output signal of said second AND gate and a first output signal of said decoder and outputs a positive overflow detection signal; and a second OR gate which is connected to said third AND gate and said decoder, receives an output signal of said third AND gate and a second output signal of said decoder and outputs a negative overflow detection signal.

38. The digital filter as claimed in claim 30 wherein said clipping circuit comprises:

a data input terminal;

a data output terminal;

first and second overflow detection signal input terminals through which are input the output signals of said overflow detecting circuit;

first and second control signal input terminals through which timing signals are input;

a first storage circuit which serves to store an output signal of said clipping circuit; and a second storage circuit which serves to store an internal signal of said clipping circuit, wherein, said clipping circuit serves to save an input signal given through said data input terminal in said first storage circuit when the overflow detection signals indicate no overflow while the timing signal input to said first control terminal is activated, to save 1 in said first storage circuit when the overflow detection signals indicate a positive overflow while the timing signal input to said first control terminal is activated, and to save 0 in said first storage circuit when the overflow detection signals indicate a negative overflow while the timing signal input to said first control terminal is activated, and wherein, said clipping circuit serves to save 0 in said second storage circuit when the overflow detection signals indicate no overflow while the timing signal input to said first control terminal is activated, to save 1 in said second storage circuit when the overflow detection signals indicate a positive or negative overflow while the timing signal input to said first control terminal is activated, and to perform logical inversion of the value as saved in said first storage circuit when 1 is stored in said second storage circuit while the timing signal input to said second control terminal is activated.

39. A digital filter having a plurality of digital filter elements which are connected to each other in series, each digital filter element comprising:

a first adder logic circuit which receives a data input signal through a first input terminal;

a first shift register which is connected to said first adder logic circuit and receives an output signal of said first adder logic circuit;

a clipping circuit which is connected to said first shift register and receives an output signal of said first shift register;

a second shift register which is connected to said clipping circuit and receives an output signal of said clipping circuit;

a third shift register which is connected to said second shift register and receives an output signal of said second shift register;

a first coefficient multiplication circuit which is connected to said clipping circuit and receives an output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives an output signal of said third shift register;

a second adder logic circuit which is connected to said first coefficient multiplication circuit, said second coefficient multiplication circuit and said first adder logic circuit, and receives output signals of said first coefficient multiplication circuit and said second coefficient multiplication circuit and outputs the sum thereof to a second input terminal of said first adder logic circuit;

a third adder logic circuit which is connected to said fourth coefficient multiplication circuit and said fifth coefficient multiplication circuit, and receives output signals of said fourth and fifth coefficient multiplication circuits;

a fourth adder logic circuit which is connected to said third coefficient multiplication circuit and said third adder logic circuit, and receives output signals of said third coefficient multiplication circuit and said third adder logic circuit and outputs the sum thereof as an output signal through an output terminal of said fourth adder logic circuit; and an overflow detecting circuit which is connected to said first and second coefficient multiplication circuits, said first and second adder logic circuits at the current stage and connected to said third, fourth and fifth coefficient multiplication circuits and said third and fourth adder logic circuits at the preceding stage, receives output signals of said first and second coefficient multiplication circuits, carry output signals of said first and second adder logic circuits at the current stage and receives output signals of said third, fourth and fifth coefficient multiplication circuits and carry output signals of said third and fourth adder logic circuits at the preceding stage;

wherein said clipping circuit clips the output signal of said first shift register to either a positive or negative predetermined fixed value and outputs the clipped value in accordance with the output signal of said overflow detecting circuit.

40. A digital filter having a plurality of digital filter elements which are connected to each other in series, each digital filter element comprising:

a first adder logic circuit which receives a data input signal through a first input terminal;

a first shift register which is connected to said first adder logic circuit and receives an output signal of said first adder logic circuit;

a clipping circuit which is connected to said first shift register and receives an output signal of said first shift register;

a second shift register which is connected to said clipping circuit and receives an output signal of said clipping circuit;

a third shift register which is connected to said second shift register and receives an output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives an output signal of said third shift register;

a second adder logic circuit which is connected to said first coefficient multiplication circuit and said second coefficient multiplication circuit, and receives output signals of said first coefficient multiplication circuit and said second coefficient multiplication circuit;

a third adder logic circuit which is connected to said fourth coefficient multiplication circuit and said fifth coefficient multiplication circuit, and receives output signals of said fourth and fifth coefficient multiplication circuits;

a fourth adder logic circuit which is connected to said third coefficient multiplication circuit and said third adder logic circuit, and receives output signals of said third coefficient multiplication circuit and said third adder logic circuit and outputs a sum thereof as an output signal through an output terminal of said fourth adder logic circuit;

a fifth adder logic circuit which is connected to said first and second adder logic circuits, receives an output signal of said second adder logic circuit and a control signal for rounding off and output the sum thereof to a second input terminal of said first adder logic circuit; and an overflow detecting circuit which is connected to said first and second coefficient multiplication circuits, said first, second and fifth adder logic circuits at the current stage and connected to said third, fourth and fifth coefficient multiplication circuits and said third and fourth adder logic circuits at the preceding stage, receives the output signals of said first and second coefficient multiplication circuits, carry output signals of said first, second and fifth adder logic circuits at the current stage and receives the output signals of said third, fourth and fifth coefficient multiplication circuits and the carry output signals of said third and fourth adder logic circuits at the preceding stage;

wherein said clipping circuit clips an output signal of said first shift register to either a positive or negative predetermined fixed value and outputs the clipped value in accordance with the output signal of said overflow detecting circuit.

41. A digital filter having a plurality of digital filter elements which are connected to each other in series, each digital filter element comprising:

a first adder logic circuit which receives a data input signal through a first input terminal;

a first shift register which is connected to said first adder logic circuit and receives an output signal of said first adder logic circuit;

a clipping circuit which is connected to said first shift register and receives an output signal of said first shift register;

a second shift register which is connected to said clipping circuit and receives an output signal of said clipping circuit;

a third shift register which is connected to said second shift register and receives an output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives an output signal of said third shift register;

a second adder logic circuit which is connected to said first coefficient multiplication circuit, said second coefficient multiplication circuit and said first adder logic circuit, and receives output signals of said first coefficient multiplication circuit and said second coefficient multiplication circuit and outputs a sum thereof to a second input terminal of said first adder logic circuit;

a third adder logic circuit which is connected to said fourth coefficient multiplication circuit and said fifth coefficient multiplication circuit, and receives an output signal of said fourth and fifth coefficient multiplication circuits;

a fourth adder logic circuit which is connected to said third coefficient multiplication circuit and said third adder logic circuit, and receives the output signals of said third coefficient multiplication circuit and said third adder logic circuit and outputs a sum thereof as an output signal through an output terminal of said fourth adder logic circuit; and an overflow detecting circuit which is connected to said first and second coefficient multiplication circuits, said first and second adder logic circuits and said first shift register at the current stage and connected to said third, fourth and fifth coefficient multiplication circuits and said third and fourth adder logic circuits at the preceding stage, receives the output signals of said first and second coefficient multiplication circuits, carry output signals of said first and second adder logic circuits and input and intermediate tap output signals of said first shift register at the current stage and receives the output signals of said third, fourth and fifth coefficient multiplication circuits, the carry output signals of said third and fourth adder logic circuits at the preceding stage;

wherein said clipping circuit clips an output signal of said first shift register to either a positive or negative predetermined fixed value and outputs a clipped value in accordance with the output signal of said overflow detecting circuit.

42. A digital filter having a plurality of digital filter elements which are connected to each other in series, each digital filter element comprising:

a first adder logic circuit which receives a data input signal through a first input terminal;

a first shift register which is connected to said first adder logic circuit and receives an output signal of said first adder logic circuit;

a clipping circuit which is connected to said first shift register and receives an output signal of said first shift register;

a second shift register which is connected to said clipping circuit and receives the output signal of said clipping circuit;

a third shift register which is connected to said second shift register and receives an output signal of said second shift register;

a first coefficient multiplication circuit which is connected to said clipping circuit and receives the output signal of said clipping circuit;

a second coefficient multiplication circuit which is connected to said second shift register and receives the output signal of said second shift register;

a third coefficient multiplication circuit which is connected to said clipping circuit and receives the output signal of said clipping circuit;

a fourth coefficient multiplication circuit which is connected to said second shift register and receives the output signal of said second shift register;

a fifth coefficient multiplication circuit which is connected to said third shift register and receives an output signal of said third shift register;

a second adder logic circuit which is connected to said first coefficient multiplication circuit and said second coefficient multiplication circuit, and receives output signals of said first coefficient multiplication circuit and said second coefficient multiplication circuit;

a third adder logic circuit which is connected to said fourth coefficient multiplication circuit and said fifth coefficient multiplication circuit;

a fourth adder logic circuit which is connected to said third coefficient multiplication circuit and said third adder logic circuit, and receives output signals of said third coefficient multiplication circuit and said third adder logic circuit and outputs a sum thereof as an output signal through an output terminal of said fourth adder logic circuit;

a fifth adder logic circuit which is connected to said first and second adder logic circuits, receives an output signals of said second adder logic circuit and a control signal for rounding off and output a sum thereof to a second input terminal of said first adder logic circuit; and an overflow detecting circuit which is connected to said first and second coefficient multiplication circuits, said first, second and fifth adder logic circuits and said first shift register at the current stage and connected to said third, fourth and fifth coefficient multiplication circuits and said third and fourth adder logic circuits at the preceding stage, receives the output signals of said first and second coefficient multiplication circuits, carry output signals of said first, second and fifth adder logic circuits and input and intermediate tap output signals of said first shift register at the current stage and receives output signals of said third, fourth and fifth coefficient multiplication circuits, carry output signals of said third and fourth adder logic circuits at the preceding stage;

wherein said clipping circuit clips the output signal of said first shift register to either a positive or negative predetermined fixed value and outputs a clipped value in accordance with the output signal of said overflow detecting circuit.

* * * * *